United States Patent
Cho et al.

(10) Patent No.: US 8,103,208 B2
(45) Date of Patent: Jan. 24, 2012

(54) BROADCAST RECEIVING SYSTEM AND METHOD FOR PROCESSING BROADCAST SIGNALS

(75) Inventors: Il Soo Cho, Gyeonggi-do (KR); Hyeon Cheol Cho, Gyeonggi-do (KR); Jong Sun Park, Seoul (KR); In Hwan Choi, Gyeonggi-do (KR); Hyoung Gon Lee, Seoul (KR); Won Gyu Song, Seoul (KR); Seung Man Kim, Gyeonggi-do (KR); Jong Moon Kim, Gyeonggi-do (KR); Jin Woo Kim, Seoul (KR); Kook Yeon Kwak, Gyeonggi-do (KR); Byoung Gill Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 818 days.

(21) Appl. No.: 12/165,558

(22) Filed: Jun. 30, 2008

(65) Prior Publication Data

US 2009/0036090 A1 Feb. 5, 2009

Related U.S. Application Data

(60) Provisional application No. 60/957,714, filed on Aug. 24, 2007, provisional application No. 60/974,084, filed on Sep. 21, 2007.

(30) Foreign Application Priority Data

Jun. 29, 2007 (KR) .................... 10-2007-0065766

(51) Int. Cl.
*H04H 60/09* (2008.01)
*H04H 40/00* (2008.01)
*H04B 7/00* (2006.01)

(52) U.S. Cl. .............. 455/3.01; 455/3.06; 455/3.04; 455/66.1

(58) Field of Classification Search ........... 455/3.01, 455/3.06, 344, 66.1
See application file for complete search history.

(56) References Cited

U.S. PATENT DOCUMENTS

| 6,012,028 | A * | 1/2000 | Kubota et al. ........ 704/260 |
| 6,061,003 | A * | 5/2000 | Harada ........ 340/995.15 |
| 6,115,667 | A * | 9/2000 | Nakamura ........ 701/200 |
| 6,429,811 | B1  | 8/2002 | Zhao et al. |
| 6,535,815 | B2  | 3/2003 | Bloebaum |
| 6,553,538 | B2 * | 4/2003 | Zehavi ........ 714/784 |
| 6,697,631 | B1 * | 2/2004 | Okamoto ........ 455/457 |
| 6,819,268 | B2 * | 11/2004 | Wakamatsu et al. ........ 340/988 |
| 7,319,931 | B2 * | 1/2008 | Uyeki et al. ........ 701/209 |
| 7,672,280 | B2 * | 3/2010 | Shim et al. ........ 370/338 |
| 7,672,774 | B2 * | 3/2010 | Glaza et al. ........ 701/117 |
| 7,990,283 | B2 * | 8/2011 | Breed ........ 340/903 |
| 8,014,792 | B2 * | 9/2011 | Sato et al. ........ 455/456.3 |

* cited by examiner

*Primary Examiner* — Tilahun B Gesesse
(74) *Attorney, Agent, or Firm* — Lee, Hong, Degerman, Kang & Waimey

(57) ABSTRACT

A broadcast receiving system capable of receiving mobile broadcast data and a method for processing broadcast signals are disclosed. The broadcast receiving system includes a receiving unit, a RS frame decoder, and a memory. The receiving unit receives a broadcast signal including mobile broadcast service data and main broadcast service data. The RS frame decoder performs CRC-decoding and RS-decoding on the RS frame, thereby correcting errors occurred in the corresponding mobile broadcast service data. The memory stores at least one of a traffic information, a POI (point of interesting), and a map information included in the error-corrected mobile broadcast service data.

2 Claims, 47 Drawing Sheets

FIG. 10D

Search destination

Search

End

Name

Area

Class

FIG. 31
(a) 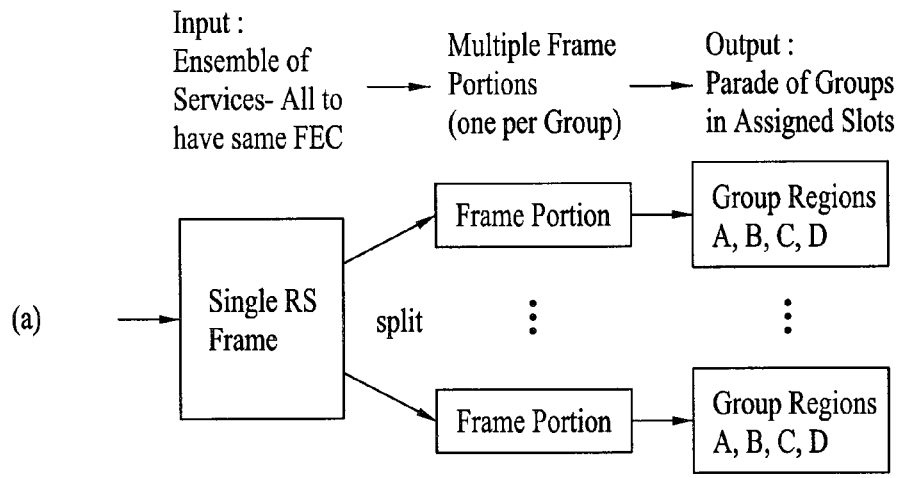
(b) 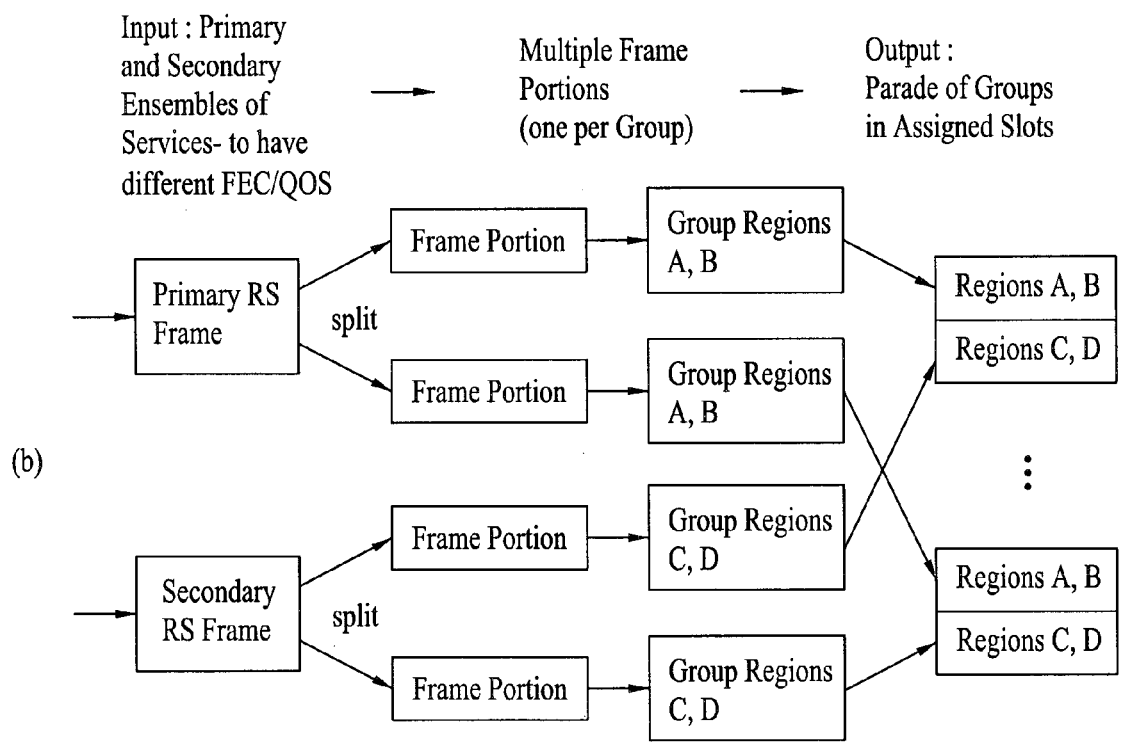

FIG. 38

| i | 0 | 1 | 2 | 3 | 4 | 5 | 6 | 7 | 8 | 9 | 10 | 11 | 12 | 13 | 14 | 15 | ... | 2110 | 2111 |
|---|---|---|---|---|---|---|---|---|---|---|---|---|---|---|---|---|---|---|---|
| P'(i) | 0 | 89 | 267 | 534 | 890 | 1335 | 1869 | 2492 | 3204 | 4005 | 799 | 1778 | 2846 | 4003 | 1153 | 2488 | ... | 2809 | 2272 |
| P(i) | 0 | 89 | 267 | 534 | 890 | 1335 | 1869 | 799 | 1778 | 1153 | 1329 | 526 | 79 | 2037 | 253 | 874 | ... | 444 | 2048 |

FIG. 43

| Syntax | No. of bits | Format |
|---|---|---|
| TPC_data { | | |
|   Sub-Frame_number | 3 | uimsbf |
|   Slot_number | 4 | uimsbf |
|   Parade_id | 7 | uimsbf |
|   starting_Group_number | 4 | uimsbf |
|   number_of_Groups | 3 | uimsbf |
|   Parade_repetition_cycle | 3 | uimsbf |
|   RS_Frame_mode | 2 | bslbf |
|   RS_code_mode_primary | 2 | bslbf |
|   RS_code_mode_secondary | 2 | bslbf |
|   SCCC_Block_mode | 2 | bslbf |
|   SCCC_outer_code_mode_A | 2 | bslbf |
|   SCCC_outer_code_mode_B | 2 | bslbf |
|   SCCC_outer_code_mode_C | 2 | bslbf |
|   SCCC_outer_code_mode_D | 2 | bslbf |
|   FIC_version | 5 | uimsbf |
|   Parade_continuity_counter | 4 | uimsbf |
|   TNoG | 5 | uimsbf |
|   reserved | 26 | bslbf |
| } | | |

BROADCAST RECEIVING SYSTEM AND METHOD FOR PROCESSING BROADCAST SIGNALS

This application claims the benefit of the Korean Patent Application No. 10-2007-0065766, filed on Jun. 29, 2007, which is hereby incorporated by reference as if fully set forth herein. Also, this application claims the benefit of U.S. Provisional Application No. 60/957,714, filed on Aug. 24, 2007, which is hereby incorporated by reference. This application also claims the benefit of U.S. Provisional Application No. 60/974,084, filed on Sep. 21, 2007, which is hereby incorporated by reference.

BACKGROUND OF THE INVENTION

1. Field of the Invention

The present invention relates to a broadcast receiving system, and more particularly, to a telematics terminal capable of receiving broadcast data and a method for processing broadcast signals.

2. Discussion of the Related Art

Telematics is a compound word that stems from the terms "telecommunication" and "informatics". Herein, telematics consists of a blending of diverse technologies including wireless telecommunication, computers, internet, and other multimedia industries. A telematics terminal may use a position measuring system and a wireless telecommunications network, so as to provide traffic information, guidance instructions in case of emergency situations, remote vehicle diagnosis, and internet services to drivers and passengers of a vehicle.

SUMMARY OF THE INVENTION

Accordingly, the present invention is directed to a telematics terminal capable of receiving broadcast data and a method for processing broadcast signals that substantially obviate one or more problems due to limitations and disadvantages of the related art.

An object of the present invention is to provide a telematics terminal and a method for processing broadcast signals, wherein the telematics terminal is capable of receiving mobile broadcast services.

Another object of the present invention is to provide a telematics terminal and a method for processing broadcast signals, wherein the telematics terminal is capable of receiving at least one of map information and traffic information through mobile broadcast services, thereby storing and processing the received information.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a broadcast receiving system includes a receiving unit, a RS frame decoder, and a memory. The receiving unit receives a broadcast signal including mobile broadcast service data and main broadcast service data. The mobile broadcast service data configures a RS frame. The RS frame includes at least one data packet corresponding to the mobile broadcast service data, an RS parity generated based upon the at least one data packet, and a CRC checksum generated based upon the at least one data packet and the RS parity. The RS frame decoder performs CRC-decoding and RS-decoding on the RS frame, thereby correcting errors occurred in the corresponding mobile broadcast service data. The memory stores at least one of a traffic information, a POI (point of interesting), and a map information included in the error-corrected mobile broadcast service data.

The broadcast receiving system further includes a position information module, and a navigation unit. The position information module generates a current position information of the broadcast receiving system. The navigation unit performs at least one of travel route search, map matching, and travel route guidance by using the generated current position information and a map information.

The broadcast receiving system further includes a display unit displays a manual mode selection button and an automatic mode selection button. The manual mode selection button controls to be down-loaded manually at least one of the traffic information, the POI, and the map information. The automatic mode selection button controls to be down-loaded automatically at least one of the traffic information, the POI, and the map information.

The broadcast receiving system further includes a display unit displays download progress rate of at least one among the traffic information, the POI, and the map information.

The broadcast receiving system further includes a known sequence detector, and a channel equalizer. The known sequence detector detects known data linearly inserted within at least one data group, which configures the RS frame. The channel equalizer channel-equalizes the mobile broadcast service data using the detected known data.

The broadcast receiving system further includes a transmission parameter detector, and a power controller. The transmission parameter detector detects transmission parameters inserted in a predetermined positions within at least one data group, which configures the RS frame. The power controller controlling power based upon the detected transmission parameters, thereby receiving a data group including requested mobile broadcast service data.

The broadcast receiving system further includes a transmission parameter detector, and a block decoder. The transmission parameter detector detects transmission parameters inserted in a predetermined positions within at least one data group, which configures the RS frame. The block decoder symbol-decodes the mobile broadcast service data in block units, based upon the detected transmission parameters.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 10A to FIG. 10D illustrate exemplary screen displays when mobile broadcast service data are outputted to the display unit according to the present invention;

FIG. 31($a$) and FIG. 31($b$) illustrate a process of one or two RS frame being divided into several portions, based upon an RS frame mode value, and a process of each portion being assigned to a corresponding region within the respective data group;

FIG. 38 illustrates a symbol interleaver of the block processor of FIG. 36;

FIG. 43 illustrates an example of a syntax structure of TPC data according to the present invention;

DETAILED DESCRIPTION OF THE INVENTION

Figure 1:
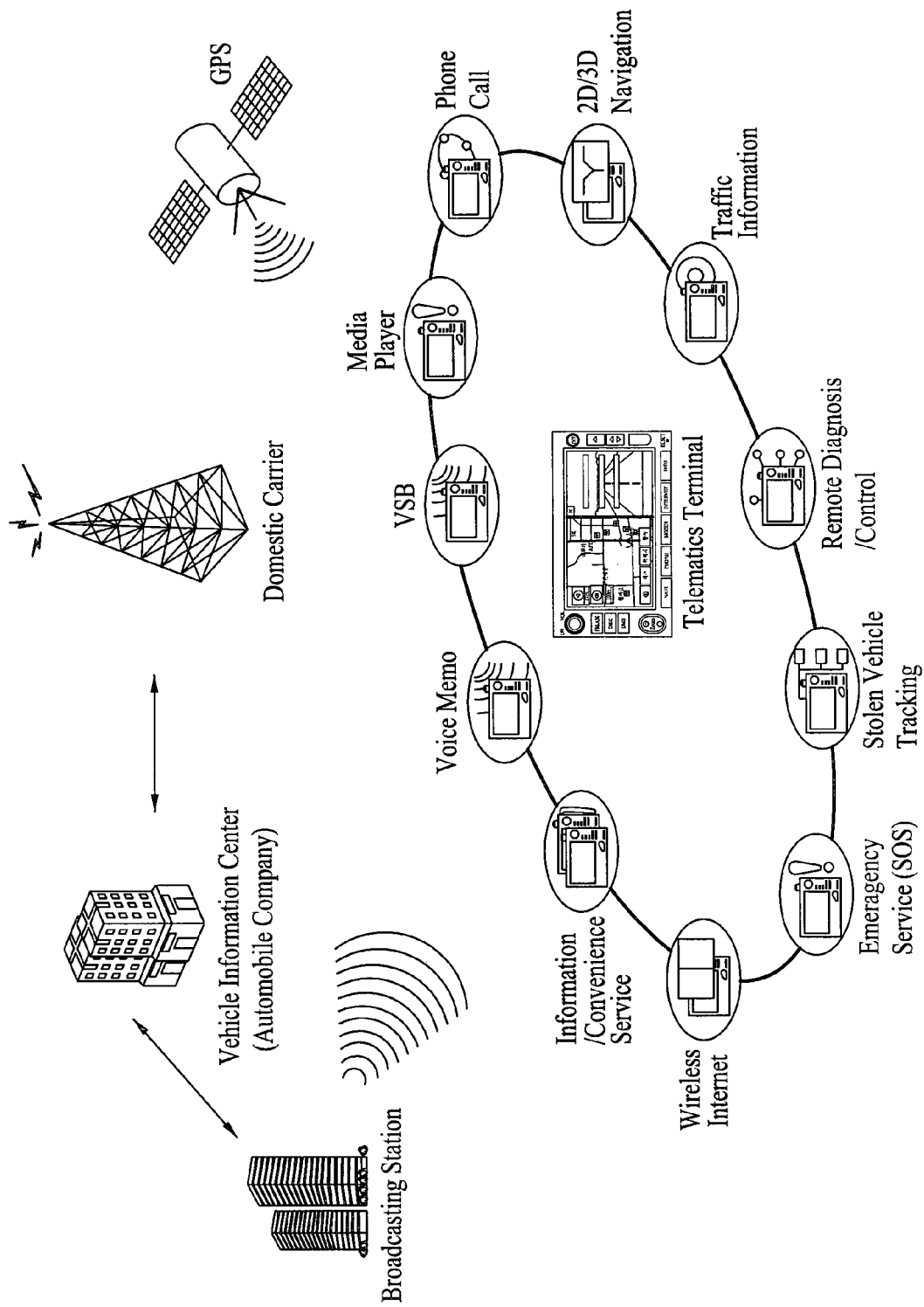
FIG. 1 illustrates a block view showing a conceptual view of a telematics system according to an embodiment of the present invention.

Reference will now be made in detail to the preferred embodiments of the present invention, examples of which are illustrated in the accompanying drawings. Wherever possible, the same reference numbers will be used throughout the drawings to refer to the same or like parts. In addition, although the terms used in the present invention are selected from generally known and used terms, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meaning of each term lying within.

Among the terms used in the present invention, mobile broadcast service data correspond to data being transmitted through a broadcasting network. Herein, the mobile broadcast service data may include at least one of mobile broadcast service data, pedestrian broadcast service data, and handheld broadcast service data, and are collectively referred to as mobile broadcast service data for simplicity. Herein, the mobile broadcast service data not only correspond to mobile/pedestrian/handheld broadcast service data (M/P/H broadcast service data) but may also include any type of broadcast service data with mobile or portable characteristics. Therefore, the mobile broadcast service data according to the present invention are not limited only to the M/P/H broadcast service data.

The above-described mobile broadcast service data may correspond to data having information, such as program execution files, stock information, weather forecast information, traffic information, and so on, and may also correspond to A/V data, such as TV series or movies. Finally, the mobile broadcast service data may also correspond to audio-specific data, such as music programs. Also, the mobile broadcast service data may include weather forecast services, traffic information services, stock information services, viewer participation quiz programs, real-time polls and surveys, interactive education broadcast programs, gaming services, services providing information on synopsis, character, background music, and filming sites of soap operas or series, services providing information on past match scores and player profiles and achievements, and services providing information on product information and programs classified by service, medium, time, and theme enabling purchase orders to be processed. Herein, the present invention is not limited only to the services mentioned above.

Among the terms used in the description of the present invention, main broadcast service data correspond to data that can be received by a fixed receiving system and may include audio/video (A/V) data. More specifically, the main broadcast service data may include A/V data of high definition (HD) or standard definition (SD) levels and may also include diverse data types required for data broadcasting. Also, the known data correspond to data pre-known in accordance with a pre-arranged agreement between the receiving system and the transmitting system.

The present invention relates to enabling a telematics terminal to receive and process mobile broadcast services. Most particularly, the present invention relates to enabling a telematics terminal to receive and process vestigial side band (VSB) mode mobile broadcast service data.

Also, the present invention receives mobile broadcast service data including map information and/or traffic information. And, the present invention provides a telematics terminal extracting and storing the map information and/or traffic information. Therefore, the map information and/or traffic information of the telematics terminal may be stored or upgraded by being read from a server via an internet network or an external memory device, such as a universal serial bus (USB) memory. Most particularly, the present invention relates to a telematics terminal capable of receiving and processing VSB mode mobile broadcast service data. In the description of the present invention, "map information or traffic information" signifies at least one of map information and traffic information.

The telematics terminals are largely provided for before-market usage and for after-market usage. The before-market telematics terminals are provided in manufactured vehicles as an optional feature. Users may also purchase after-market telematics terminals and personally equipped their vehicles with the purchased terminal. More specifically, after-market telematics terminals may largely include fixed-type telematics terminals and mobile-type telematics terminals. Fixed-type terminals are permanently fixed once equipped inside a vehicle and cannot be removed. On the other hand, mobile-type telematics terminals may be detachably fixed inside a vehicle. The telematics terminal according to the present invention may be applied to both the before-market and after-market telematics terminals. Also, in the description of the present invention, a driver or passenger using the telematics services within a vehicle will be referred to as a "user" for simplicity.

Telematics System

FIG. 1 illustrates a block view showing a conceptual view of a telematics system according to an embodiment of the present invention. Referring to FIG. 1, the telematics system broadly includes a broadcasting station, a domestic carrier, a vehicle information center, a global positioning system (GPS), and a telematics terminal. More specifically, the broadcasting station transmits mobile broadcast service data via a broadcasting network. The domestic carrier transmits and receives information to and from the telematics terminal via a wireless telecommunication network. The vehicle information center collects and provides traffic (or vehicle) information to the broadcasting station and/or the domestic carrier. The GPS provides position information of specific vehicles. And, the telematics terminal provides safety/security services, telecommunication services, broadcast services, navigation services, and so on. For example, the vehicle information center collects diverse traffic information via a variety of paths (e.g., input from operator (or manager), other servers passing through the network, or probe cars) and, then, provides the collected information to the broadcasting station and/or the domestic carrier.

More specifically, referring to FIG. 1, the telematics terminal may provide diverse types of services including traffic information services, emergency rescue services, remote diagnosis/control services, stolen vehicle tracking services, wireless internet services (e.g., finance update, news update, e-mail, messenger, VoD services), 2-dimensional/3-dimensional (2D/3D) navigation services, personal information/convenience services, phone call services, and so on, to the user using technologies based on position measurement system, wireless telecommunication network, and voice recognition. Also, the telematics terminal may read (or play-back or reproduce) or write (or record) audio signals and video signals stored in various write/read (or record/reproduce) media, such as a cassette tape, CD, DVD, MP3, and so on, through a write/read media driver.

Furthermore, the telematics terminal may receive and output mobile broadcast service data being transmitted via the broadcasting network. Particularly, the telematics terminal may simultaneously receive diverse types of mobile broadcast service data being transmitted in a VSB mode, which are then demodulated and decoded, thereby simultaneously outputted. The plurality of mobile broadcast services being outputted to the output device may be sent to the user in the form of at least one of text, voice, graphic, still image, and moving image. For example, when it assumed that the plurality of mobile broadcast services selected by the user corresponds to TV series and traffic information, the telematics terminal simultaneously receives the TV series information and traffic information, which are then demodulated and decoded. Thereafter, the telematics terminal may display the selected TV series on one portion of a screen and display the traffic information on another portion of the screen. In another example, the telematics terminal may display the TV series on the screen and provide the traffic information in the form of subtitles or audio data.

When the broadcasting station transmits the mobile broadcast service data in VSB mode, additional encoding may be performed on the mobile broadcast service data. Subsequently, the additionally encoded mobile broadcast service data may be multiplexed with the main broadcast service data in a parade structure and, then, transmitted. The additional encoding process may include at least one of block encoding at a coding rate of 1/H, error correction encoding, error detection encoding, row permutation processes. Thus, the mobile broadcast service data may be provided with more robustness (or strength), thereby being capable of responding more effectively to noise and channel environment that undergoes frequent changes.

More specifically, each parade is repeated per parade identifier (e.g., parade_id) to transmit the ame mobile broadcast service. At this time, this transmission path will be referred to as a parade in the present invention. In other words, one or more parades are temporally multiplexed in one physical channel determined by frequency.

For example, mobile broadcast service 1 and mobile broadcast service 2 can be transmitted from parade alpha, mobile broadcast service 3 and mobile broadcast service 4 can be transmitted from parade beta, and mobile broadcast service 5 can be transmitted from parade gamma.

At this time, one parade may transmit either one RS frame or two RS frames, i.e., a primary RS frame and a secondary RS frame.

At this point, when data included in one RS frame assign into a plurality of data groups and the data groups are transmitted to the receiving system. Herein, one data group may consist of a plurality of mobile broadcast service data packets, wherein one mobile broadcast service data packet includes a plurality of mobile broadcast service data bytes. Furthermore, the data group may be divided into a plurality of regions based upon a degree of interference from the main broadcast service data. At this point, a long known data sequence may be periodically inserted in a region that has no interference from the main broadcast service data.

Also, according to an embodiment of the present invention, each parade may transmit different types of mobile broadcast service data. For example, a parade alpha may transmit TV series, and a parade beta may transmit traffic information.

Therefore, when a plurality of mobile broadcast services selected by the user are transmitted through a plurality of parades via a single channel, the telematics terminal according to the present invention demodulates and decodes the mobile broadcast service data of the corresponding parade, thereby simultaneously providing the plurality of mobile broadcast services to the user.

Furthermore, according to the embodiment of the present invention, a plurality of data groups may co-exist with main broadcast service data packet in the parade section, and only main broadcast service data may exist in section between parade and parade. At this point, when the telematics terminal receives only mobile broadcast service data including traffic information, the telematics terminal may turn the power on only during a slot to which the data group of the parade, which transmits the mobile broadcast service data, is assigned, and the telematics terminal may turn the power off during the remaining slots, thereby reducing power consumption of the telematics terminal.

According to the present invention, the telematics terminal may receive map information or traffic information included in the mobile broadcast service data, thereby being received or upgraded. At this point, the map information or traffic information according to the present invention may be multiplexed with the broadcast service data, thereby being received via the same channel. Alternatively, the map information or traffic information may be separately received via another channel.

Meanwhile, in order to receive and decode the mobile broadcast service data, the telematics terminal requires system information. Such system information may also be referred to as service information. The system information may include channel information, event information, and so on.

The telematics terminal according to the present invention may receive system information, which provides detailed information on the mobile broadcast service information including the map information or traffic information. For example, the telematics terminal may receive system information associated with the channel transmitting map information or traffic information, or system information associated with the time during which map information or traffic information is transmitted.

In the embodiment of the present invention, the PSI/PSIP tables are applied as the system information. However, the present invention is not limited to the example set forth herein. More specifically, regardless of the name, any protocol transmitting system information in a table format may be applied in the present invention.

The PSI table is an MPEG-2 system standard defined for identifying the channels and the programs. The PSIP table is an advanced television systems committee (ATSC) standard that can identify the channels and the programs. The PSI table may include a program association table (PAT), a conditional access table (CAT), a program map table (PMT), and a network information table (NIT). Herein, the PAT corresponds to special information that is transmitted by a data packet having a PID of '0'. The PAT transmits PID information of the PMT and PID information of the NIT corresponding to each program. The CAT transmits information on a paid broadcasting system used by the transmitting system. The PMT transmits PID information of a transport stream (TS) packet, in which program identification numbers and individual bit sequences of video and audio data configuring the corresponding program are transmitted, and the PID information, in which PCR is transmitted. The NIT transmits information of the actual transmission network.

The PSIP table may include a virtual channel table (VCT), a system time table (STT), a rating region table (RRT), an extended text table (ETT), a direct channel change table (DCCT), an event information table (EIT), and a master guide table (MGT). The VCT transmits information on virtual channels, such as channel information for selecting channels and information such as packet identification (PID) numbers for receiving the audio and/or video data. More specifically, when the VCT is parsed, the PID of the audio/video data of the broadcast program may be known. Herein, the corresponding audio/video data are transmitted within the channel along with the channel name and channel number. The STT transmits information on the current data and timing information. The RRT transmits information on region and consultation organs for program ratings. The ETT transmits additional description of a specific channel and broadcast program. The EIT transmits information on virtual channel events (e.g., program title, program start time, etc.). The DCCT/DCCSCT transmits information associated with automatic (or direct) channel change. And, the MGT transmits the versions and PID information of the above-mentioned tables included in the PSIP.

Also, the basic unit of each table within the PSI/PSIP consists of a section unit. Herein, at least one section is combined to form a table. For example, the VCT may be divided into 256 sections. In this example, one section may hold a plurality of virtual channel information. However, each information on one virtual channel cannot be divided into 2 or more sections. Furthermore, a TS packet holding the mobile broadcast service data may correspond to either a packetized elementary stream (PES) type or a section type. More specifically, PES type mobile broadcast service data are configured of TS packets, or section type mobile broadcast service data are configured of TS packets. The broadcasting station according to an embodiment of the present invention transmits mobile broadcast service data in the forms of text, graphic, and still image as the section type mobile broadcast service data. Alternatively, the broadcasting station transmits mobile broadcast service data in the forms of audio or moving picture as the PES type mobile broadcast service data.

In the present invention, the section type mobile broadcast service data are included in a digital storage media-command and control (DSM-CC) section. Herein, according to the embodiment of the present invention, the DSM-CC section is configured of 188-byte unit TS packets. Furthermore, the packet identification (or identifier) of the TS packet configuring the DSM-CC section is included in a data service table (DST). When transmitting the DST, '0x95' is assigned as the value of a stream_type field included in the service location descriptor of the PMT or the VCT. More specifically, when the PMT or VCT stream_type field value is '0x95', the telematics system may acknowledge that mobile broadcast service data are being received. At this point, the mobile broadcast service data may be transmitted by a data carousel method. The data carousel method corresponds to repeatedly transmitting identical data on a regular basis.

The telematics terminal may only use the tables included in the PSI, or only use the tables included in the PSIP, or use a combination of the table included in the PSI and PSIP, so as to parse and decode the mobile broadcast service data that are being transmitted. In order to parse and decode the mobile broadcast service data, in case of the PSI, at least the PAT and PMT are required, and in case of the PSIP, the VCT is required. For example, the PAT may include system information transmitting the mobile broadcast service data and a PID of the PMT corresponding to the mobile broadcast service data (or program number). Also, the PMT may include a PID of a TS packet transmitting the mobile broadcast service data. Furthermore, the VCT may include information on the virtual channel transmitting the mobile broadcast service data and a PID of the TS packet transmitting the mobile broadcast service data.

Telematics Terminal

Figure 2:
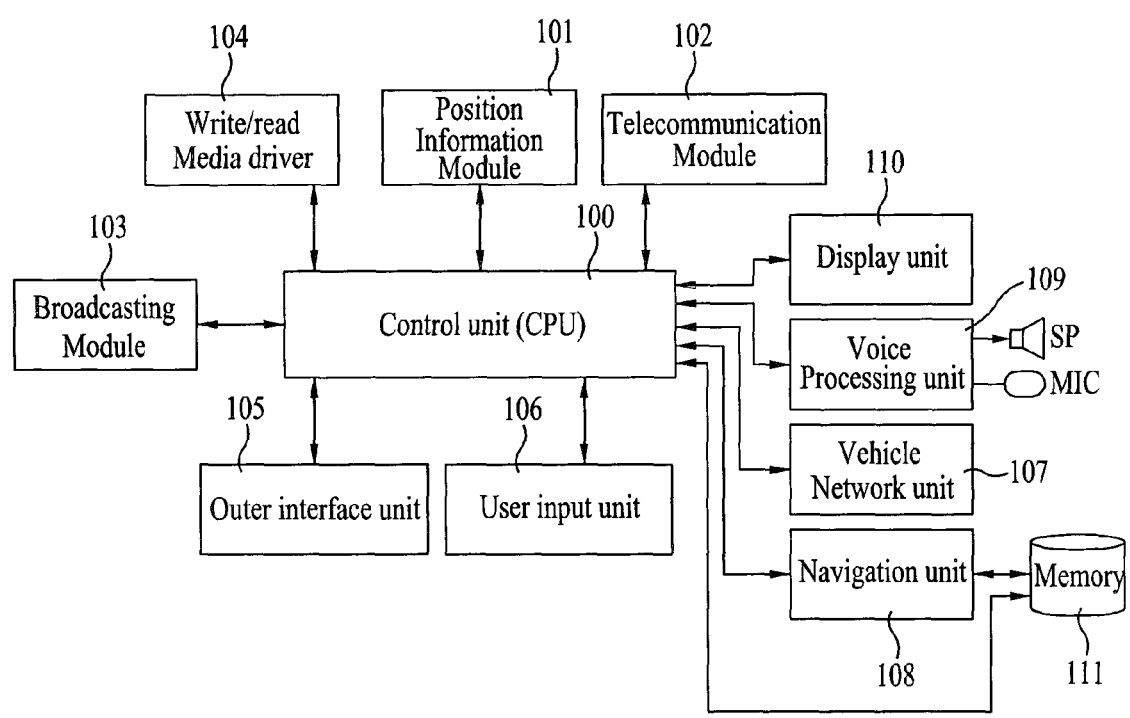
FIG. 2 illustrates a block view showing a structure of a telematics terminal provided with a broadcasting module that can receive VSB mode mobile broadcast services according to the present invention.

FIG. 2 illustrates a block view showing a structure of a telematics terminal according to an embodiment of the present invention, wherein the telematics terminal is provided with a broadcasting module that is capable of receiving VSB mode mobile broadcast service data. Referring to FIG. 2, the telematics terminal includes a control unit (or central process unit (CPU)) 100. Herein, the telematics terminal also includes a position information module 101, a telecommunication module 102, a broadcasting module 103, a write/read media driver 104, an outer interface unit 105, a user input unit 106, a vehicle network unit 107, a navigation unit 108, a voice processing unit 109, and a display unit 110, which are all connected to the control unit 100. The control unit 100 controls the overall operation of the telematics terminal and may also include a memory (e.g., RAM, ROM, etc.) for storing diverse information required for the basic control of the telematics terminal.

The position information module 101 may include at least one of or both a GPS receiver (not shown) and a bearing sensor (not shown). Herein, the GPS receiver receives a current position information from a satellite GPS at a predetermined cycle period (e.g., a cycle period of 0.5 second). The bearing sensor receives position information provided from the vehicle. For example, the position information module 101 mainly receives the position information from the GPS receiver. However, in situations where the GPS receiver does not operate, the position information module 101 may also use the bearing sensor. The bearing sensor receives signals from at least any one of an angle sensor, a terrestrial magnetic field sensor, and a vehicle speed sensor, thereby calculating a position of the vehicle based upon the received signals.

Hereinafter, in the description of the present invention, the position information module 101 will include the GPS receiver and the bearing sensor for simplicity. According to the embodiment of the present invention, the position information module 101 corresponds to a hybrid-type position information module, which extracts GPS information and compensation data for compensating the position of a moving vehicle using a variety of sensors equipped in the vehicle. Then, the position information module 101 uses the extracted compensation data so as to compensate the position of the moving vehicle, thereby locating the current position of the corresponding vehicle. As described above, the position information module 101 may use both types of information. Yet, in some cases, the position information module 101 may only use the GPS information in order to acquire (or obtain) the desired position information. The current position information of the corresponding vehicle generated from the position information module 101 is then provided to the control unit 100.

In searching for a path depending upon a user input, the telecommunication module 102 may receive traffic information for setting up the shortest distance from the current position to the final destination. Alternatively, the telecommunication module 102 may also receive information either via communication among vehicles or via transmitters of a separate information center and/or roadside transmitters. The telecommunication module 102 may communicate with a digital interface that includes, for example, at least one of wireless application protocol (WAP), code division multiple access (CDMA) evolution-data only (1xEV-DO), wireless local area network (LAN), dedicated short range communication (DSRC), 802.16, mobile internet, wireless broadband internet (WiBro), world interoperability for microwave access (WiMAX), high speed downlink packet access (HSDPA), and so on. However, whenever required, the telecommunication module 102 may not be provided with a telematics terminal.

Also, depending upon a user request (e.g., vehicle theft report), the domestic carrier may request the current position of the stolen vehicle via a wireless telecommunication network to the telecommunication module 102. In this case, the telecommunication module 102 receives the current position information of the corresponding vehicle, which is generated from the position information module 101, through the control unit 100. Thereafter, the telecommunication module 102 transmits the received position information to the domestic carrier. Alternatively, the telematics terminal may detect the vehicle theft incident, thereby automatically sending the current position information of the stolen vehicle to the domestic carrier via the telecommunication module 102. In this case, the domestic carrier may transmit the received position information of the stolen vehicle to the user or to government offices, such as a police office (or station).

The broadcasting module 103 receives mobile broadcast service data transmitted in VSB mode via. Herein, the mobile broadcast service data include the map information or traffic information. Then, the broadcasting module 103 demodulates and decodes the received mobile broadcast service data, thereby outputting the processed data to an output device.

The output device includes a display unit 110, a speaker, and so on.

According to the embodiment of the present invention, the map information or traffic information received by and extracted from the broadcasting module 103 may either be outputted to the navigation unit 108 or be outputted to and stored in the storage unit (or memory) 111. The process of the broadcasting module 103 receiving at least one mobile broadcast service transmitting in VSB mode, which is then demodulated and decoded, will be described in detail in a later process.

Additionally, the broadcasting module 103 may receive digital multimedia broadcasting (DMB) mode and digital video broadcasting-handheld (DVB-H) mode broadcast service data, and the broadcasting module 103 may also receive FM or AM radio broadcast programs. For example, the broadcasting module 103 responds to a radio-on signal of a specific channel provided from the user input unit 106, so as to receive and process the radio signal of the corresponding channel. Subsequently, the processed radio signal passes through the control unit 100 and is outputted through the speaker.

According to an embodiment of the present invention, the broadcasting module 103 receives and processes VSB mode mobile broadcast services. If the mobile broadcast service data received, demodulated, and decoded from the broadcasting module 103 correspond to A/V data, the corresponding mobile broadcast service data pass through the control unit 100 and are outputted to the display unit 110 and the speaker. If the mobile broadcast service data correspond to audio-specific data, then the corresponding mobile broadcast service data may be outputted only to the speaker. However, if the mobile broadcast service data correspond to text or graphic data, then the corresponding mobile broadcast service data may be outputted only to the display unit.

Figure 3:
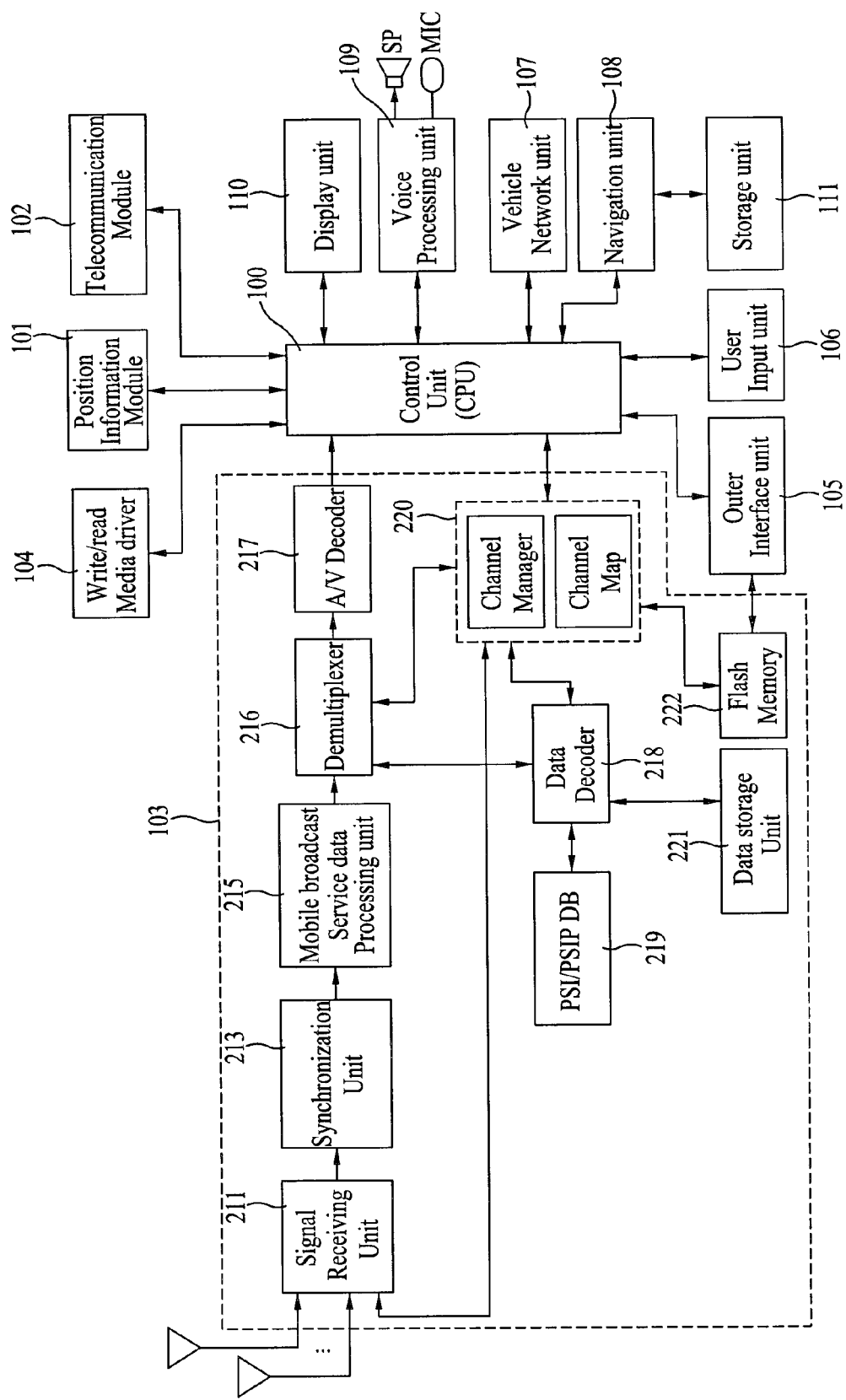
FIG. 3 illustrates a block view showing a structure of a telematics terminal provided with a broadcasting module according to a first embodiment of the present invention, wherein the broadcasting module can receive map information or traffic information through VSB mode mobile broadcast services, thereby storing and using the received information.

Referring to FIG. 3, the broadcasting module will now be described in detail. The position information module 101, the telecommunication 102, and the broadcasting module 103 either respectively receive or transmit the corresponding information through an antenna (not shown). At this point, the telematics terminal may be provided with an antenna for each of the position information module 101, the telecommunication 102, and the broadcasting module 103. Alternatively, the telematics terminal may also be provided with multiple antennas supporting a plurality of frequency bands.

The write/read media driver 104 may read (or play-back or reproduce) audio signals and video signals stored in various write/read (or record/reproduce) media, such as a cassette tape, CD, DVD, MP3, and so on. Alternatively, if a medium inserted in the write/read media driver 104 corresponds to a writable (or recordable) medium, such as CD-RW, the write/read media driver 104 may also record the mobile broadcast service data being received through the broadcasting module 103. In this case, also, if the data played-back by the write/read media driver 104 correspond to A/V data, the corresponding data pass through the control unit 100 and are outputted to the display unit 110 and the speaker. If the played-back data correspond to audio-specific data, then the corresponding data may be outputted only to the speaker. However, if the played-back data correspond to text or image data, then the corresponding data may be outputted only to the display unit.

The outer interface unit 105 is used to interface an external device with the control unit 100. Herein, the external device may include a mobile storage device, iPOD, Bluetooth. The mobile storage device may include a flash memory, a USB memory, a hard disk drive (HDD). For example, when using the bluetooth technology, a system including a wireless device control and terminal equipped within a vehicle may be remotely controlled. The user input unit 106 is an input device for transmitting a user command to the control unit 100. For example, the user input unit 106 corresponds to a button or key equipped on the telematics terminal or a remote controller. Also, a microphone, which is connected to the voice processing unit 109, and the display unit 110 are also included in the user input unit 106. At this point, the display unit 110 may be interfaced with the user in the form of a touch screen.

More specifically, when operating the device, the user may use at least one of the methods for generating a control signal, such as the touch screen, the button (or key), the remote controller, and the microphone. Also, since the environment of the vehicle is prone to dangerous circumstances, a method enabling the user to avoid operating the device while driving the vehicle may be proposed. In order to do so, the device may be operated by voice control, and, accordingly, the user may be provided with services via audio (or voice) messages. Thus, a safer environment while driving may be provided. For example, when an e-mail service is requested, it would be extremely convenient to be able to provide information on the contents of an e-mail or information on the sender. Also, the voice controlled device may ensure safer than when operating the device by hand.

The display unit 110 may display a main screen so as to enable the user to select the operation of the device or a specific function based upon the control of the control unit 100. The user may select a specific element of the menu screen by using a button (or key) on the telematics terminal or a remote controller. The user may also make a selection by touching the corresponding element from the touch screen. More specifically, the user may select a wanted (or requested) mobile broadcast service via the touch screen. Also, by touching the touch screen, the user may enable the audio or video file, which is pre-stored in the write/read media driver, to be played-back. By touching the touch screen, the user may also view the wanted (or requested) mobile broadcast service. Furthermore, the user may also use a navigation device, such as a global positioning system (GPS), so as to select any one of a route guidance system, which provides road (or travel route) guidance to the user from a current position to the wanted destination.

The voice processing unit 109 processes voice guidance data respective of the route search processed by the navigation unit 108 and outputs the processed data to the speaker. Alternatively, the voice processing unit 109 processes a voice (or audio) signal inputted through the telecommunication module 102 and outputs the processed signal to the speaker. Also, the voice processing unit 109 analyzes the voice of the user, which is inputted through the microphone, and provides the analyzed result to the control unit 100. For example, if the inputted voice signal corresponds to a device operation command, the control unit 100 operates the corresponding device. And, if the inputted voice signal corresponds to the data that are to be transmitted to a remote site through a wireless telecommunication network, the voice signal is outputted to the telecommunication module 102. At this point, since the voice signal can be transmitted and received in two ways (or bi-directionally) through the wireless telecommunication network, a handsfree function can be embodied by using the speaker and microphone, which are already provided herein, without having to equip a separate handsfree kit.

The display unit 110 corresponds to a screen for displaying images and may consist of a liquid crystal display (LCD) device, a plasma display device, an organic EL display device, and so on. A head-up display (HUD) technology, which displays holographic images onto the windshield placed in front of the driver, may be applied to the display unit 110. The vehicle network unit 107 performs data and control communication between the telematics terminal and other devices equipped in the vehicle. And, depending upon the usage, a serial data bus, such as a controller area network (CAN), a media oriented systems transport (MOST), and an IDB-1394, is used in the vehicle network unit 107. More specifically, a network technology for vehicles may broadly include a network technology for multimedia and a network technology for electronic devices. Herein, the network technology for multimedia controls multimedia devices, such as audio devices, video devices, navigation devices, and gaming devices. And, the network technology for electronic devices controls essential vehicle body parts, such as the engine and handbrake. For example, the CAN may be used in the network technology for electronic devices, and the MOST and the IDB-1394 may be used in the network technology for multimedia.

Figure 7:
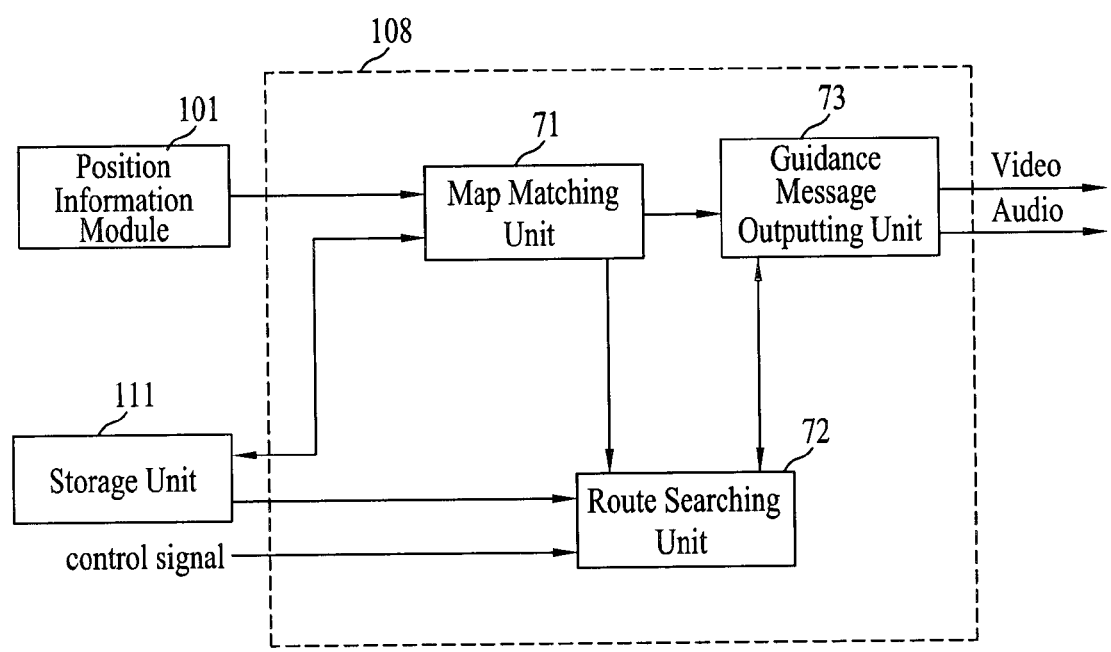
FIG. 7 illustrates a block view showing a structure of the navigation unit according to the present invention.

The navigation unit 108 controls the storage unit 111, which stores travel route search, map matching, travel route guidance, and map information. The navigation unit 108 receives map information via the telecommunication module 102 or the broadcasting module 103, thereby newly storing the received map information to the storage unit 111 or upgrading (or updating) the pre-stored map information. FIG. 7 illustrates a block view showing a structure of the navigation unit according to an embodiment of the present invention. The navigation unit will now be described in detail with reference to FIG. 7. Herein, according to the embodiment of the present invention, the stored map information or traffic information is received and stored by the broadcasting module 103.

The navigation unit 108 includes a map matching unit 71, a route searching unit 72, and a guidance message outputting unit 73. The map matching unit 71 matches the current position of the vehicle, which is transmitted from the position information module 101, with a map pre-stored in the storage unit 111. Then, the map matching unit 71 may output the matched result of the current vehicle position and the pre-stored map to the route searching unit 72 and the guidance message outputting unit 73. The route searching unit 72 may use a destination point and the current vehicle position in order to search for the requested travel route. Then, the route searching unit 72 may output the searched result to the guidance outputting unit 73. The guidance message outputting unit 73 uses the route search result transmitted from the route searching unit 72 and the map match result transmitted from the map matching unit 71, so as to output a travel route guidance message starting from the current position to the requested destination. At this point, the guidance message may be outputted in the form of a screen (i.e., video data) or a voice message (i.e., audio data).

Herein, the stored map information may be used to match and display the current position of the telematics terminal or to provide a travel route from the current position to an inputted (or requested) destination when the user inputs information for a travel route search. For example, when the user selects a travel route search function, the current position information of the corresponding vehicle, which is generated from the position information module 101, passes through the control unit 100 so as to be transmitted to the navigation unit 108.

Accordingly, the navigation unit 108 extracts map information, which is to be matched with the position information received from the position information module 101, and GIS information from the storage unit 111. Then, the navigation unit 108 matches the extracted information with the received position information, thereby indicating the current position within the map displayed on the display unit 110. Additionally, the navigation unit 108 may also output a route guidance broadcast (or message) or a warning broadcast (or message) in the form of a voice message through the speaker. Herein, the route guidance message corresponds to a response to a movement direction of the vehicle. Also, the navigation unit 108 may announce the warning message in order to notify or warn the driver that the vehicle is nearing an intersection (or crossroad) or a bottleneck section.

When the position information module 101 receives a user input information (e.g., a request for a route search of a specific destination or point of interest (POI)) through the user input unit 106, the position information module 101 receives the position information of the specific destination or point of interest based upon the current position information. Thereafter, the position information module 101 may send the received information to the navigation unit 108. The navigation unit 108 then receives the position information of the current telematics terminal and the route information from the current position to the requested destination from the position information module 101. Subsequently, the navigation unit 108 extracts map information stored in the storage unit 111, thereby matching the received position information with the extracted map information.

When the user inputs information on the requested destination, the navigation unit 108 searches for a travel route from its current position to the requested destination using the position information module 101. Then, the navigation unit 108 displays the searched travel route or an optimum route on the display unit 110. More specifically, the telematics terminal searches for all possible travel routes from the current position to the requested destination, thereby providing guidance information to the user of the route having the shortest travel time. However, in some cases, the navigation unit 108 may also provide the user with the optimum travel route or a travel route also indicating toll roads (or expressways). Herein, the travel route may be searched directly by the telematics terminal itself.

Alternatively, the optimum travel routes or detour travel routes reflecting road congestion information may be provided by receiving traffic information from an external source using the telecommunication module 102 or the broadcasting module 103. Additionally, by reflecting the real-time traffic information, the navigation unit 108 may also automatically search for another travel route with better road conditions and provide the newly searched travel route to the user, even while the previous travel guidance information is being provided to the user. In addition to the route guidance information, the navigation unit 108 may also provide the user with information on traffic conditions, accidents, emergency conditions or disasters.

Herein, traffic (or road) condition information may be constantly changed (or updated) due to accidents or construction. Therefore, such map information or traffic information is required to be updated in real-time. When using the related art method of downloading traffic (or road) condition information from an external storage device, real-time traffic (or road) condition information cannot be applied to the telematics device. Therefore, the telematics terminal according to the present invention receives real-time map information or traffic information from the broadcasting module, which are then outputted to the navigation unit 108. Subsequently, the telematics terminal uses the real-time map information or traffic information so as to search for the requested travel route.

FIG. 3 illustrates a block view showing a structure of a telematics terminal provided with a broadcasting module according to a first embodiment of the present invention, wherein the broadcasting module can receive map information or traffic information through VSB mode mobile broadcast services, thereby storing and using the received information. More specifically, referring to FIG. 3, the broadcasting module 103 includes a signal receiving unit 211, a synchronization unit 213, a mobile broadcast service data processing unit 215, a demultiplexer 216, an audio/video (A/V) decoder 217, a data decoder 218, a program specific information/program and system information protocol (PSI/PSIP) information storage unit 219, an application controller 220, a data storage unit 221, and a flash memory 222.

Based upon the control of the application controller 220 or the outer interface unit 105, the flash memory 222 either stores or reads the data stored therein. Herein, the flash memory 222 may correspond to a non-volatile memory. According to the present invention, other types of non-volatile memory may be used instead of the flash memory 222. Apart from the broadcasting module 103, the elements and operation of the telematics terminal shown in FIG. 3 are identical to those of the telematics terminal shown in FIG. 2. Therefore, detailed description of the same will be omitted for simplicity.

The signal receiving unit 211 receives the mobile broadcast service data including the map information or traffic information. The signal receiving unit 211 may also receive service information, such as PSI/PSIP information, which includes information on the mobile broadcast service data including the map information or traffic information. The signal receiving unit 211 includes a tuner. Herein, the tuner tunes a frequency of a particular channel and down-converts the tuned frequency to an intermediate frequency (IF) signal. Then, the IF signal of the tuner is outputted to the synchronization unit 213. At this point, the map information or traffic information according to the present invention may be multiplexed with the broadcast service data, thereby being received via the same channel. Alternatively, the map information or traffic information may be separately received via another channel.

The signal receiving unit 211 is controlled by the channel manager included in the application controller 220. Also, the result and strength of the broadcast signals corresponding to each tuned channel are reported to the channel manager. Herein, the data received by the frequency of the specific channel may include mobile broadcast service data, main broadcast service data, and table data for decoding the mobile broadcast service data and the main broadcast service data. The mobile broadcast service data include the map information or traffic information.

At this point, the traffic information includes all information on the traffic conditions (or road conditions) including traffic condition updates (or information), which is constantly updated and changed in real-time. Examples of the traffic information include congestion and travel time information (CTT), point of interest (POI), safety driving information (SDI), road event information (REI), news information (NWS), traffic status image information (TSI), and so on. For example, when the telematics terminal receives information that traffic congestion in a particular area is becoming heavier, the navigation unit 108 may perform a new travel route search excluding the corresponding area with heavy traffic. Also, when the telematics terminal receives information that road conditions in a particular area is becoming hazardous due to a construction process, the navigation unit 108 may perform a new travel route search excluding the area under construction.

In other words, the telematics terminal may receive information on traffic conditions, which are then used for travel route search or outputted along with the route guidance information of the navigation unit, so that the user can be informed and aware of such updated information. Furthermore, examples of map information include map information notifying the opening of new roads or expressways, map information indicating change in hazardous areas, and so on.

As described above, when already-existing map information or traffic information is changed (or updated), or when new map information or traffic information is generated, such map information or traffic information are received through the signal receiving unit 211 of the broadcasting module 103, which is then outputted to the navigation unit 108 or the storage unit 111. As mentioned above, the mobile broadcast service data according to the present invention includes map information or traffic information. Therefore, the method of processing the mobile broadcast service data according to the present invention may be applied to the method of processing the map information or traffic information.

The synchronization unit 213 receives the IF signal outputted from the signal receiving unit 211, so as to perform carrier wave recovery and timing recovery, thereby being changed (or converted) to a baseband signal. Thus, channel equalization is performed. The output of the synchronization unit 213 is inputted to the mobile broadcast data processing unit 215. The mobile broadcast service data processing unit 215 performs error correction decoding on the mobile broadcast service data among the output data of the synchronization unit 213. Thereafter, the mobile broadcast service data (mobile broadcast service data 1 and mobile broadcast service data 2), which are error correction decoded by the mobile broadcast service data processing unit 215, are inputted to the demultiplexer 216.

The synchronization unit 213 and the mobile broadcast service data processing unit 215 will be described in more detail with reference to FIG. 4. Based upon the control of the data decoder 218, if the mobile broadcast service data packet, which is outputted from the data derandomizer 534 of the mobile broadcast service data processing unit 215, corresponds to a PES type mobile broadcast service data packet, the demultiplexer 216 outputs the mobile broadcast service data packet to the A/V decoder 217. Alternatively, if the mobile broadcast service data packet corresponds to a section-type mobile broadcast service data packet, the demultiplexer 216 outputs the corresponding mobile broadcast service data packet to the data decoder 218. Herein, the section-type mobile broadcast service data packet outputted to the data decoder 218 may correspond either to mobile broadcast service data or a PSI/PSIP table.

According to the embodiment of the present invention, the mobile broadcast service data carried by the payload within the section-type mobile broadcast service data packet corresponds to a DSM-CC section. At this point, based upon the control of the data decoder 218, the demultiplexer 216 performs section filtering, thereby discarding duplicate sections and outputting only the non-duplicate sections to the data decoder 218. Also, by performing section filtering, the demultiplexer 216 may output only a wanted (or desired) section (e.g., a section configuring a VCT) to the data decoder 218. The VCT includes information indicating the type of the mobile broadcast service data that are being received. The section filtering method may include a method of verifying the PID of a table defined by the MGT, such as the VCT, prior to performing the section filtering process. Alternatively, the section filtering method may also include a method of directly performing the section filtering process without verifying the MGT, when the VCT includes a fixed PID (i.e., a base PID). At this point, the demultiplexer 216 performs the section filtering process by referring to a table_id field, a version_number field, a section_number field, etc.

The data decoder 218 parses sections of the demultiplexed PSI/PSIP tables. Then, the data decoder 218 stores the parsed result in the PSI/PSIP information storage unit 219 as database. For example, the data decoder 218 groups sections having the same table identifier (table_id) so as to form a table. Then, the data decoder 218 parses the table and the parsed result in the PSI/PSIP information storage unit 219 as database. In performing the parsing process, the data decoder 218 reads all remaining section data, which have not been processed with section filtering, and actual section data. Thereafter, the data decoder 218 stores the read data to the PSI/PSIP information storage unit 219. Herein, the table_id field, the section_number field, and the last_section_number field included in the table may be used to indicate whether the corresponding table is configured of a single section or a plurality of sections. For example, TS packets having the PID of the VCT are grouped to form a section, and sections having table identifiers allocated to the VCT are grouped to form the VCT.

Additionally, the data decoder 218 either stores the demultiplexed mobile broadcast service data to the data storage unit 221 as database, or outputs the demultiplexed mobile broadcast service data to the display unit 110 and/or speaker through the application controller 220 and control unit 100. By parsing system information tables, such as PMT and VCT, information on the virtual channel through which the mobile broadcast service data are transmitted may be obtained. Also, information as to whether PES-type mobile broadcast service data are being transmitted through the corresponding virtual channel or information as to whether section-type mobile broadcast service data are being transmitted through the corresponding virtual channel may also be obtained. By parsing the system information tables, the type of the mobile broadcast service data being transmitted may also be known. More specifically, the data decoder 218 may extract information on virtual channels by referring to element stream types (ES types) within system information tables (i.e., VCT and/or PAT/PMT) and PIDs. Also, when the extracted channel information indicate that PES-type mobile broadcast service data exist in a virtual channel, A/V PID of the corresponding virtual channel (VCH) within a channel map is set up, thereby controlling an A/V demultiplexing process of the demultiplexer 216.

Meanwhile, when the extracted channel information indicate that section-type mobile broadcast service data exist in a virtual channel, the demultiplexer 216 demultiplexes the mobile broadcast service data transmitted through the virtual channel, thereby either storing the demultiplexed data in the data storage unit 221 or outputting the demultiplexed data to an output device, such as the display unit 110 and the speaker. For example, when it is assumed that the mobile broadcast service data are transmitted in DSM-CC sections, the presence (or existence) of the mobile broadcast service data may be known by parsing a stream_type field value within the PMT or the stream_type field value of the service location descriptor included in the VCT. More specifically, when the stream_type field value is equal to '0x95', this indicates that the mobile broadcast service data are transmitted to the corresponding virtual channel.

By performing section filtering, the demultiplexer 216 may output only an application information table (AIT) to the data decoder 218. The AIT includes information of an application that is operated in the telematics terminal for the data service. The AIT may include application information, such as application name, application version, application priority, application ID, application status (i.e., auto-start, user-specific settings, kill, etc.), application type (i.e., Java or HTML), position (or location) of stream including application class and data files, application platform directory, and location of application icon. Therefore, by using such information, the application may store information required for its operation in the flash memory 222.

The application that is operated by the application controller 220 may be received along with the broadcast data and, then, updated. A data broadcasting application manager, which is executed by the application controller 220 in order to operate the corresponding application, may be provided with a platform, which can execute an application program. Herein, for example, the platform may correspond to a Java virtual machine for executing a Java program.

Furthermore, the data decoder 218 controls the demultiplexing of the system information table, which corresponds to the information table associated with the channel and events. Thereafter, an A/V PID list may be transmitted to the channel manager.

The information table associated with the channel and events extracted from the data decoder 218 may indicate information on the channel including the map information or traffic information. Therefore, the present invention may embodied so that, when the telematics terminal is informed by the system information that the map information or traffic information is received, the telematics terminal can automatically store the received map information or traffic information, thereby upgrading (or updating) the already-existing map information or traffic information.

Also, the present invention may embodied so that, when the telematics terminals is informed of the reception of the map information or traffic information, the telematics terminal can output such information, thereby enabling the user to selected whether or not to upgrade the already-existing map information or traffic information. For this, the data decoder can output a down-load notice message of map or traffic information to the display unit.

The channel manager may refer to the channel map in order to transmit a request for receiving system-related information data to the data decoder 218, thereby receiving the corresponding result. In addition, the channel manager may also control the channel tuning of the tuner corresponding to the signal receiving unit 211.

The channel manager controls the signal receiving unit 211 and the data decoder 218, so as to manage the channel map so that it can respond to the channel request made by the user.

More specifically, channel manager sends a request to the data decoder 218 so that the tables are parsed. Herein, the tables are associated with the channels that are to be tuned. The results of the parsed tables are reported to the channel manager by the data decoder 218. Thereafter, based on the parsed results, the channel manager updates the channel map and sets up a PID in the demultiplexer 216 for demultiplexing the tables associated with the mobile broadcast service data from the mobile broadcast service data packet.

Furthermore, the channel manager may directly control the demultiplexer 216, so as to directly set up the A/V PID, thereby controlling the A/V decoder 217.

The A/V decoder 217 may decode each of the audio data and the video data from the demultiplexed mobile broadcast service data and, then, output the decoded data.

Figure 4:
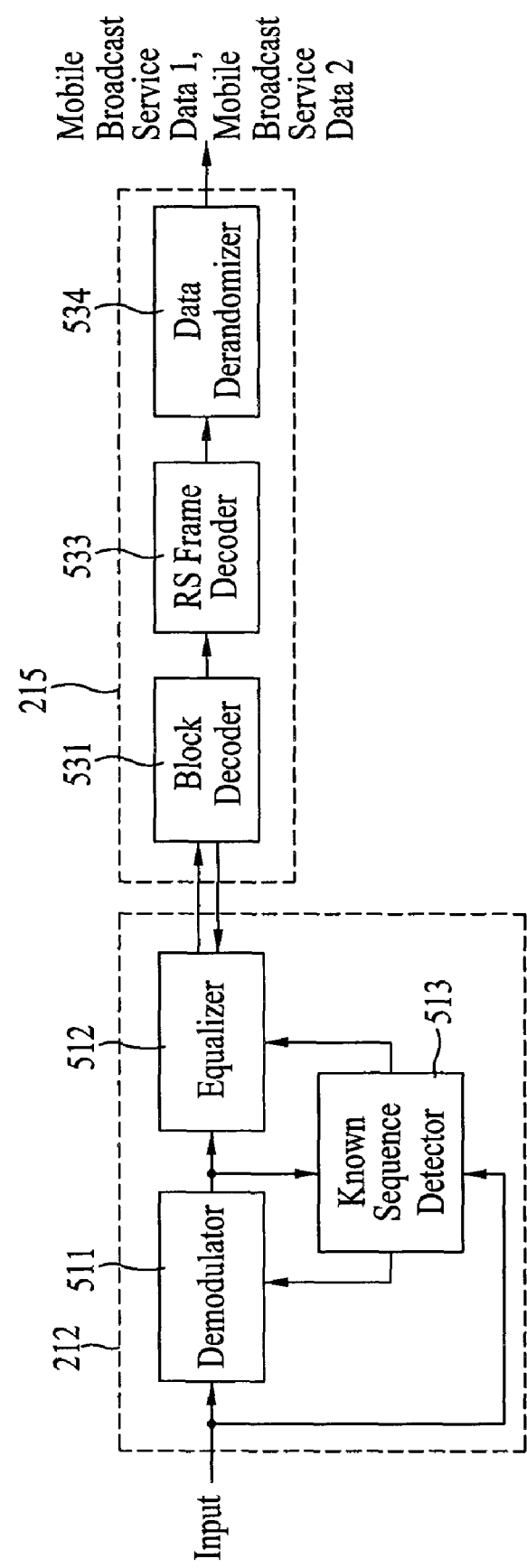
FIG. 4 illustrates a detailed block view of a synchronization unit and a mobile broadcast service data processor according to an embodiment of the present invention.

FIG. 4 illustrates a detailed block view of the synchronization unit 213 and the mobile broadcast service data processing unit 215. Referring to FIG. 4, the synchronization unit 213 includes a modulator 511, a channel equalizer 512, and a known sequence detector 513. And, the mobile broadcast service data processing unit 215 includes a block decoder 531, a RS frame decoder 533, and a data derandomizer 534. More specifically, the demodulator 511 of the synchronization unit 213 performs self-gain control, carrier wave recovery, and timing recovery processes on the inputted IF signal, thereby modifying the IF signal to a baseband signal. Then, the demodulator 511 outputs the modified IF signal to the channel equalizer 512 and the known sequence detector 513. The channel equalizer 512 compensates the distortion of the channel included in the demodulated signal and then outputs the error-compensated signal to the block decoder 531 of the mobile broadcast service data processing unit 215.

At this point, the known sequence detector 513 detects the known sequence place inserted by the transmitting end from the input/output data of the demodulator 511 (i.e., the data prior to the demodulation process or the data after the demodulation process). Thereafter, the place information (or position indicator) along with the symbol sequence of the known data, which are generated from the detected place, is outputted to the demodulator 511 and the channel equalizer 512. Also, the known sequence detector 513 outputs a set of information to the block decoder 531. This set of information is used to allow the block decoder 531 of the receiving system to identify the mobile broadcast service data that are processed with additional encoding from the transmitting system and the main broadcast service data that are not processed with additional encoding.

The demodulator 511 uses the known data (or sequence) position indicator and the known data symbol sequence during the timing and/or carrier wave recovery, thereby enhancing the demodulating performance. Similarly, the channel equalizer 512 uses the known sequence position indicator and the known data symbol sequence so as to enhance the equalizing performance. Moreover, the decoding result of the block decoder 531 may be fed-back to the channel equalizer 512, thereby enhancing the equalizing performance.

The channel equalizer 512 may perform channel equalization by using a plurality of methods. An example of estimating a channel impulse response (CIR), so as to perform channel equalization, will be given in the description of the present invention.

Most particularly, an example of estimating the CIR in accordance with each region within the data group, which is hierarchically divided and transmitted from the transmitting system, and applying each CIR differently will also be described herein. Furthermore, by using the known data, the place and contents of which is known in accordance with an agreement between the transmitting system and the receiving system, and the field synchronization data, so as to estimate the CIR, the present invention may be able to perform channel equalization with more stability.

Figure 5:
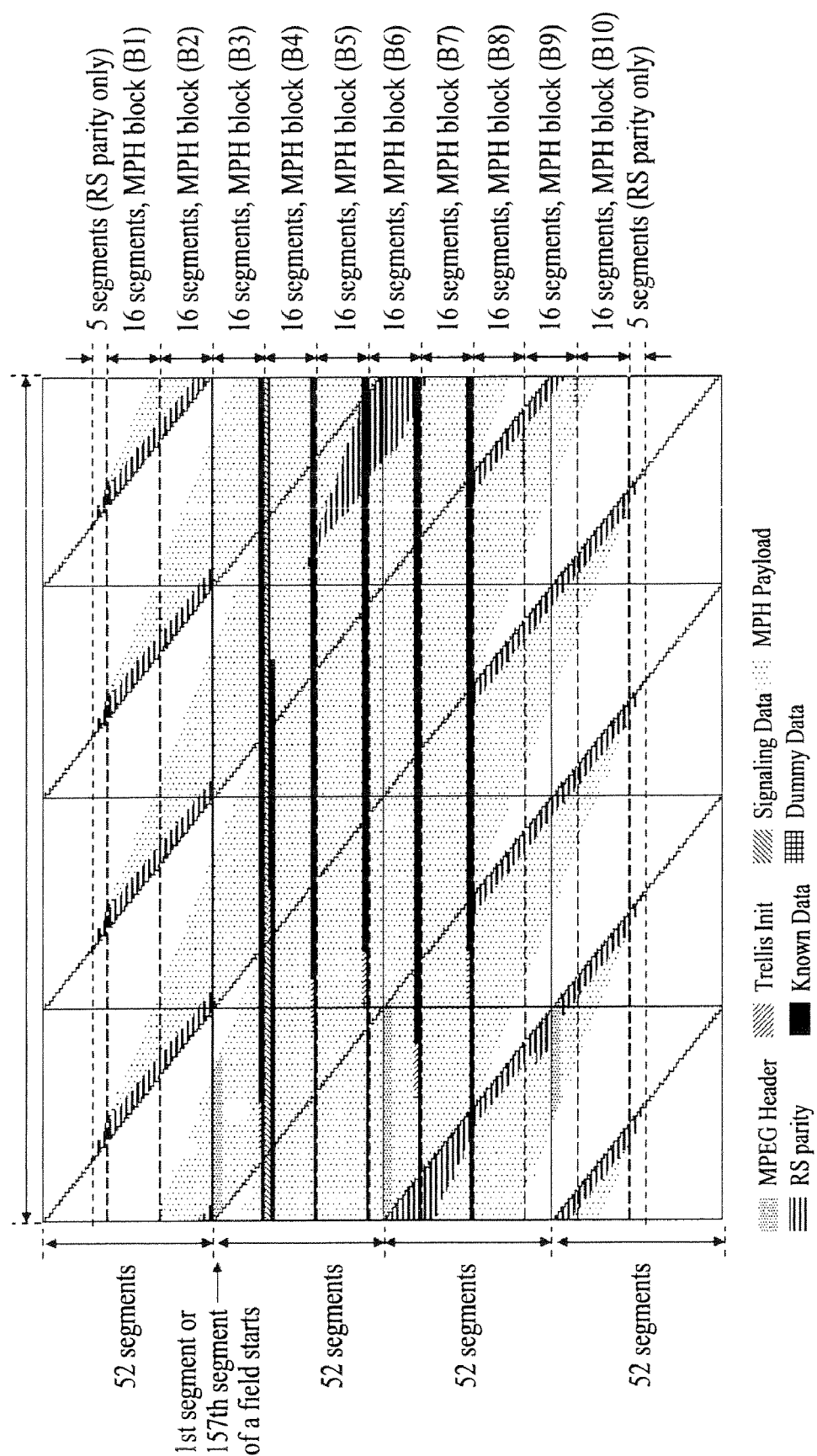
FIG. 5 and FIG. 6 respectively illustrate a data group structure and data configuration prior to and after data deinterleaving according to an embodiment of the present invention.
Figure 6:
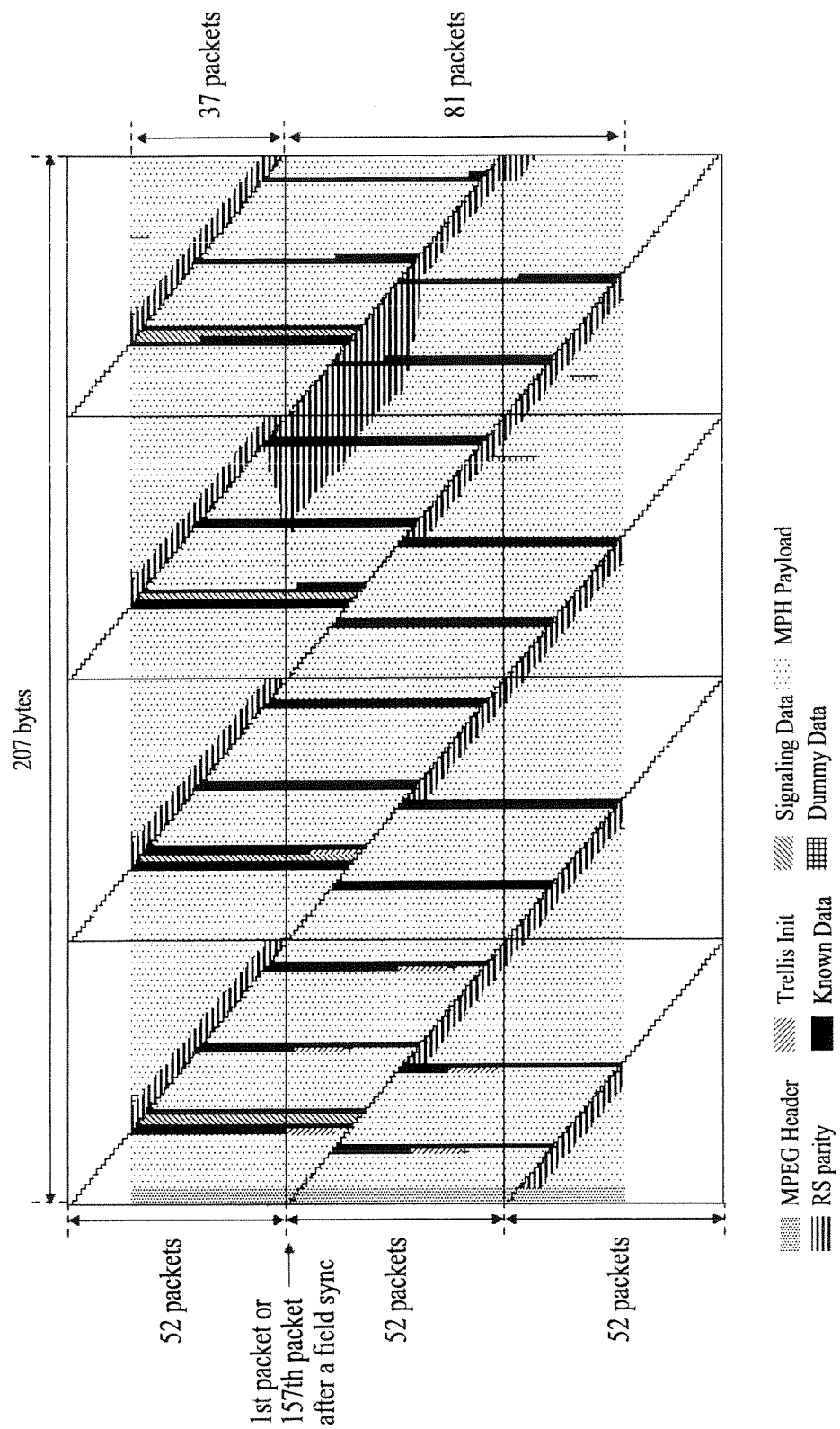

Herein, the data group that is inputted for the equalization process is divided into regions A to D, as shown in FIG. 5. More specifically, in the example of the present invention, each region A, B, C, and D are further divided into MPH blocks B4 to B7, MPH blocks B3 and B8, MPH blocks B2 and B9, MPH blocks B1 and B10, respectively.

More specifically, a data group can be assigned and transmitted a maximum the number of 4 in a VSB frame in the transmitting system. In this case, all data group do not include field synchronization data. In the present invention, the data group including the field synchronization data performs channel-equalization using the field synchronization data and known data. And the data group not including the field synchronization data performs channel-equalization using the known data. For example, the data of the MPH block B3 including the field synchronization data performs channel-equalization using the CIR calculated from the field synchronization data area and the CIR calculated from the first known data area. Also, the data of the MPH blocks B1 and B2 performs channel-equalization using the CIR calculated from the field synchronization data area and the CIR calculated from the first known data area. Meanwhile, the data of the MPH blocks B4 to B6 not including the field synchronization data performs channel-equalization using CIRS calculated from the first known data area and the third known data area.

As described above, the present invention uses the CIR estimated from the field synchronization data and the known data sequences in order to perform channel equalization on data within the data group. At this point, each of the estimated CIRs may be directly used in accordance with the characteristics of each region within the data group. Alternatively, a plurality of the estimated CIRs may also be either interpolated or extrapolated so as to create a new CIR, which is then used for the channel equalization process.

Herein, when a value F(Q) of a function F(x) at a particular point Q and a value F(S) of the function F(x) at another particular point S are known, interpolation refers to estimating a function value of a point within the section between points Q and S. Linear interpolation corresponds to the simplest form among a wide range of interpolation operations. The linear interpolation described herein is merely exemplary among a wide range of possible interpolation methods. And, therefore, the present invention is not limited only to the examples set forth herein.

Alternatively, when a value F(Q) of a function F(x) at a particular point Q and a value F(S) of the function F(x) at another particular point S are known, extrapolation refers to estimating a function value of a point outside of the section between points Q and S. Linear extrapolation is the simplest form among a wide range of extrapolation operations. Similarly, the linear extrapolation described herein is merely exemplary among a wide range of possible extrapolation methods. And, therefore, the present invention is not limited only to the examples set forth herein.

Meanwhile, if the data being inputted to the block decoder 531, after being channel-equalized by the equalizer 512, correspond to the data having both block encoding and trellis encoding performed thereon (i.e., the data within the RS frame, the signaling information data, etc.) by the transmitting system, trellis decoding and block decoding processes are performed on the inputted data as inverse processes of the transmitting system. Alternatively, if the data being inputted to the block decoder 531 correspond to the data having only trellis encoding performed thereon (i.e., the main broadcast service data), and not the block encoding, only the trellis decoding process is performed on the inputted data as the inverse process of the transmitting system.

At this point, the data group decoded by the block decoder 531 is inputted to the RS frame decoder 533, whereas the main broadcast service data are not outputted to the RS frame decoder 533. If a main broadcast service data processing unit for processing the main broadcast service data is provided, then, instead of being discarded, the main broadcast service data may be sent to the main broadcast service data processing unit. In this case, the main broadcast service data processing unit may include a data deinterleaver, a RS decoder, and a derandomizer. However, the main broadcast service data processing unit may not be required in a system structure that only receives the mobile broadcast service data and may, therefore, be omitted.

The trellis decoded and block decoded data by the block decoder 531 are then outputted to the RS frame decoder 533. More specifically, the block decoder 531 removes the known data, data used for trellis initialization, and signaling information data, MPEG header, which have been inserted in the data group, and the RS parity data, which have been added by the RS encoder/non-systematic RS encoder or non-systematic RS encoder of the transmitting system. Then, the block decoder 531 outputs the processed data to the RS frame decoder 533. Herein, the removal of the data may be performed before the block decoding process, or may be performed during or after the block decoding process.

If the inputted data correspond to the data having only trellis encoding performed thereon and not block encoding, the block decoder 531 performs Viterbi (or trellis) decoding on the inputted data so as to output a hard decision value or to perform a hard-decision on a soft decision value, thereby outputting the result.

Meanwhile, if the inputted data correspond to the data having both block encoding process and trellis encoding process performed thereon, the block decoder 531 outputs a soft decision value with respect to the inputted data.

In other words, if the inputted data correspond to data being processed with block encoding by the block processor and being processed with trellis encoding by the trellis encoding module, in the transmitting system, the block decoder 531 performs a decoding process and a trellis decoding process on the inputted data as inverse processes of the transmitting system. At this point, the RS frame encoder of the pre-processor included in the transmitting system may be viewed as an outer (or external) encoder. And, the trellis encoder may be viewed as an inner (or internal) encoder. When decoding such concatenated codes, in order to allow the block decoder 531 to maximize its performance of decoding externally encoded data, the decoder of the internal code should output a soft decision value.

Meanwhile, the RS frame decoder 533 receives only the error correction encoded mobile broadcast service data (i.e., the RS-encoded and CRC-encoded mobile broadcast service data) that are transmitted from the block decoder 531.

The RS frame decoder 533 performs an inverse process of the RS frame encoder included in the transmitting system so as to correct the errors within the RS frame. Then, the RS frame decoder 533 adds the 1-byte MPEG synchronization data, which had been removed during the RS frame encoding process, to the error-corrected mobile broadcast service data packet. Thereafter, the processed data packet is outputted to the data derandomizer 534. The data derandomizer 534 performs a derandomizing process, which corresponds to the inverse process of the randomizer included in the transmitting system, on the received mobile broadcast service data. Thereafter, the derandomized data are outputted, thereby obtaining the mobile broadcast service data transmitted from the transmitting system.

Figure 8:
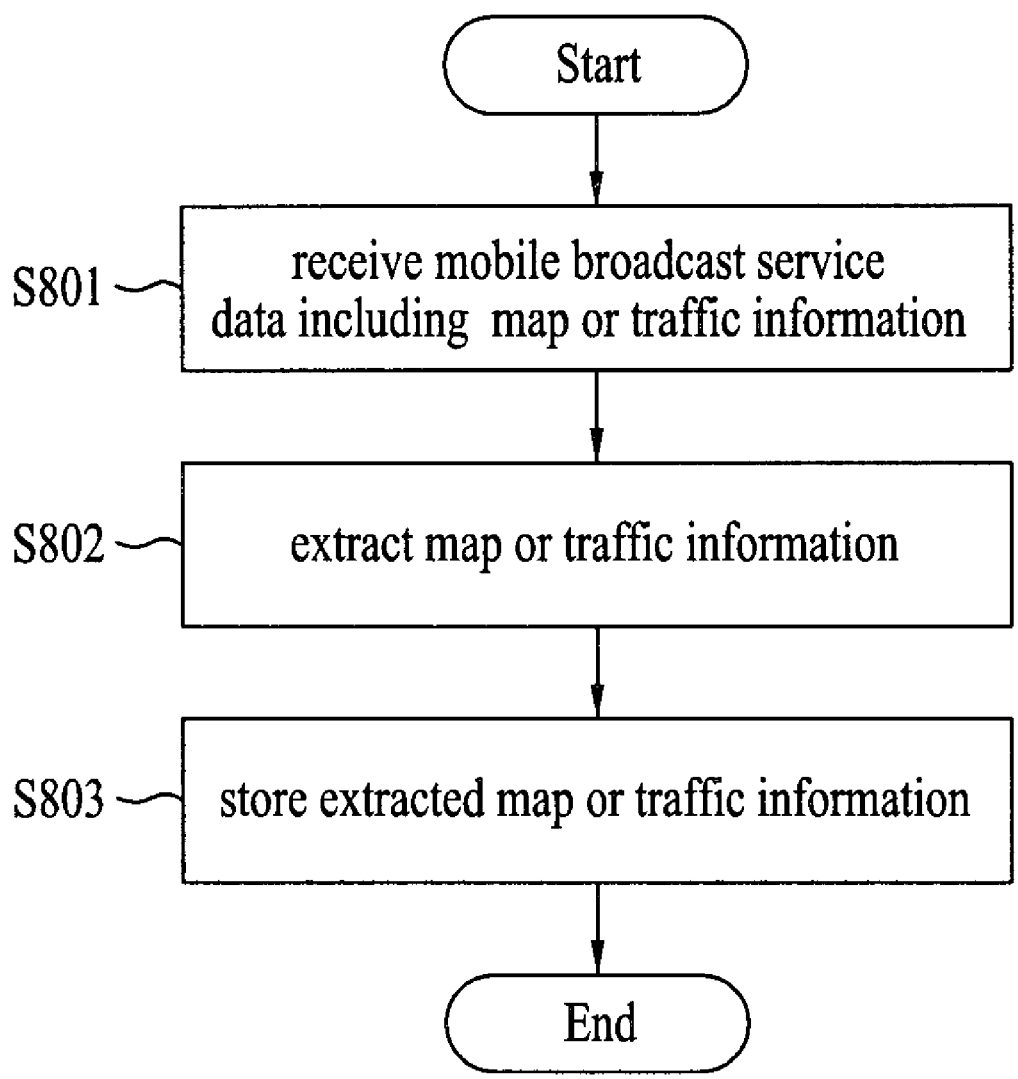
FIG. 8 illustrates a flow chart showing process steps of a method for processing broadcast signals according to the present invention.

FIG. 8 illustrates a method of processing broadcast signals according to a first embodiment of the present invention. Referring to FIG. 8, the method of processing broadcast signals includes the steps of receiving mobile broadcast service data including map information or traffic information (S801), extracting the map information or traffic information from the mobile broadcast service data (S802), and storing the extracted map information or traffic information (S803).

In the step of receiving mobile broadcast service data including map information or traffic information (S801), the present invention may receive system information on the mobile broadcast service data including map information or traffic information. More specifically, information on the channel receiving the map information or traffic information may be received as the system information. Alternatively, the present invention may also receive event information on the time during which the map information or traffic information is received.

Therefore, the present invention may use the received system information so as to output a schedule table for downloading the map information or traffic information. For example, when receiving the mobile broadcast service data, an event information (including information on the receiving channel and transmission time) indicating the transmission of the map information or traffic information is outputted on a program guide information. Accordingly, when the user wishes to process downloading, the user may select a receiving channel of the corresponding transmission time, thereby processing the download. Also, when the event information is received, the receiving channel may be automatically tuned at the corresponding transmission time, thereby downloading the map information or traffic information.

The step of extracting the map information or traffic information from the mobile broadcast service data (S802) will be described in detail with reference to the synchronization unit 213, the mobile broadcast service data processing unit 215, and the A/V decoder 217 of FIG. 3. Herein, the operations of the elements shown in FIG. 3 will be described. In the step of storing the extracted map information or traffic information (S803), the extracted map information or traffic information may all be stored. Alternatively, in step 803, version information of the pre-stored map information or traffic information and version information of the newly downloaded map information or traffic information may be compared, thereby storing the newly downloaded map information or traffic information, if the downloaded map information or traffic information is determined to correspond to the latest version.

The process of storing the map information or traffic information is not the same as simply receiving and outputting traffic broadcast services. More specifically, the map information or traffic information may be stored so as to be used in another module within the telematics terminal. For example, the map information or traffic information may be used in the navigation unit 108 for the route search function. At this point, the storage unit 111 may divide a memory region that is currently being used into a data region and a download region, thereby managing the divided regions accordingly. More specifically, the memory region may be physically or logically divided into a data region and a download region, thereby storing the received map information in the download region.

In this case, the data may be safely managed based upon the on/off mode of the vehicle power (i.e., on/off mode of the engine). For example, when the engine of the vehicle is turned off while downloading a requested map, the currently stored map information and the map information that is being downloaded may all be lost (or corrupted). Therefore, when downloading the map information, the information should first be stored in the download region and, then, transferred to the data region once the download process is completed, or when the user wishes to continue the usage of the corresponding map information.

Figure 9:
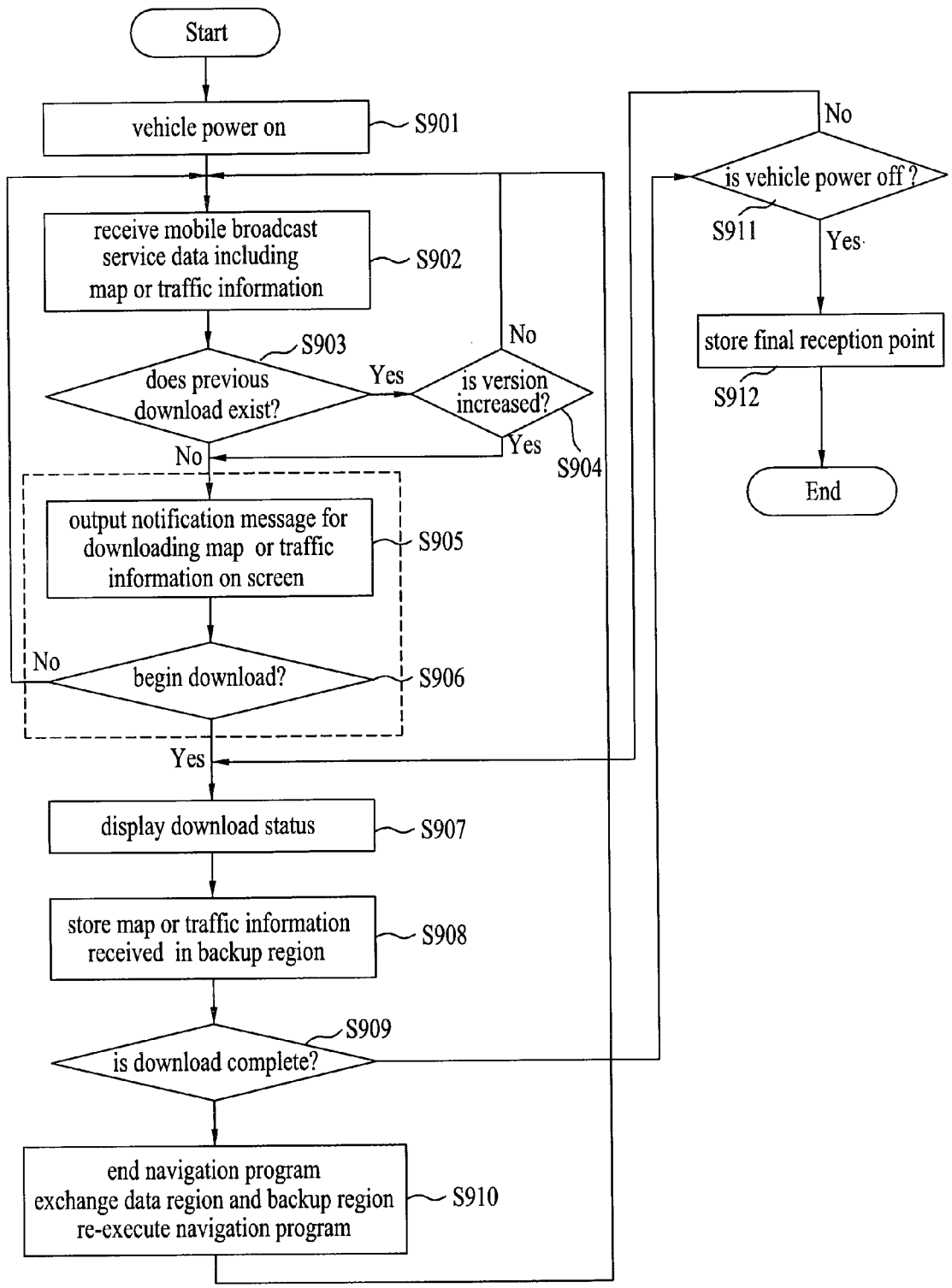
FIG. 9 illustrates a flow chart showing the process steps of a method for processing broadcast signals according to an embodiment of the present invention.

FIG. 9 illustrates a method of processing broadcast signals according to a second embodiment of the present invention. Each process step shown in FIG. 9 is merely exemplary and may, therefore, be selectively (or optionally) applied in the present invention. FIG. 10A to FIG. 10D illustrate exemplary screen displays when the map information and/or traffic information are outputted to the display unit according to the present invention. When the vehicle power is turned on (S901), mobile broadcast service data including map information or traffic information are received (S902). At this point, the user may select and tune the channel through which the mobile broadcast service data are being received. Alternatively, the system may automatically select and tune the channel including the map information or traffic information.

Figure 10A:
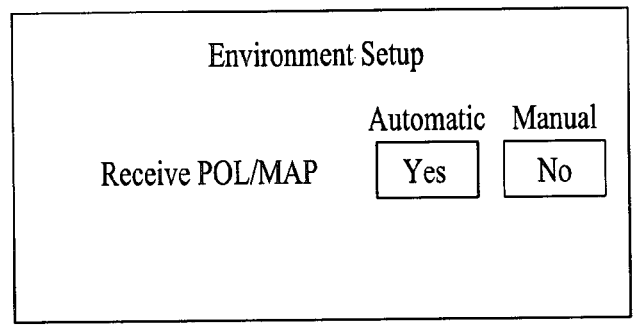

More specifically, FIG. 10A illustrates an example of an on-screen display for selecting an automatic download mode or a manual download mode. By using the on-screen display (OSD) shown in FIG. 10A, the user may select the download mode. If the broadcasting module 103 includes a plurality of broadcast (signal) receiving units, and when requested broadcast data are being received by one of the broadcast receiving units, another broadcast (signal) receiving unit may be used to receive the map information or traffic information. Thereafter, the system determines whether a previous map information or traffic information already exists (S903). Then, when it is determined that a previous map information or traffic information already exists, the system determines whether a version level has been increased (S904). If the version level has not been increased, the newly received map information or traffic information is determined to be of the same version as the previously stored (or previous) map information or traffic information. Therefore, the corresponding information is not downloaded.

If it is determined that a previous map information or traffic information does not exist, in step 903, or its it is determined that the version level has increased, in step 904, a notification message for downloading the map information or traffic information may be outputted to the display screen (S905). Also, when the user selects the download function (S906), the download process is initiated. At this point, the download process may be selected to be either in an automatic download mode or in a manual download mode. Steps 905 and 906 may be performed when the manual download mode is selected.

Figure 10B:
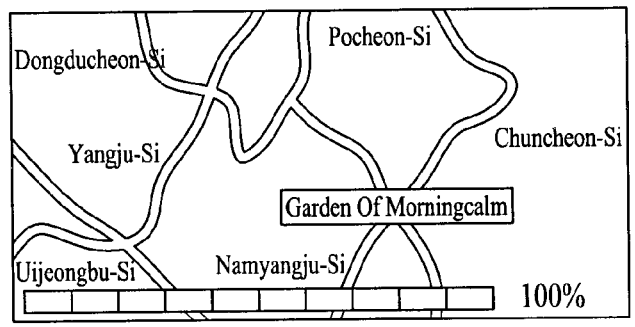
Figure 10C:
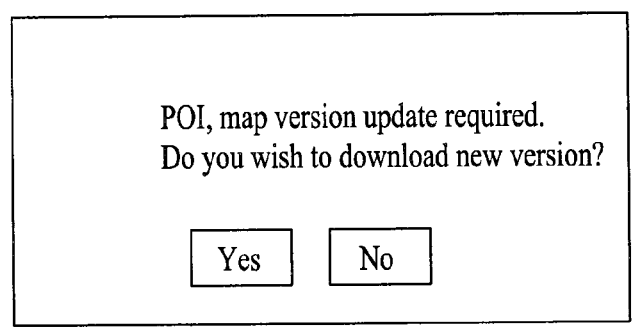

FIG. 10B illustrates an example of an on-screen display for selecting the download function. Referring to FIG. 10B, the user may execute the download process using the on-screen display (OSD) for selecting the download function. For the convenience of the user, once the download is initiated, the system may display the download status (S907). FIG. 10C illustrates an example of an on-screen display for displaying the download status. The on-screen display (OSD) for displaying the status of a downloading process may be embodied so that the OSD is displayed once the downloading process is initiated and disappears from the screen once the downloading process is completed. During the downloading process, the received map information or traffic information may be stored in the download region (or backup region) (S908).

The system then determines whether the downloading process is completed (S909). When the downloading process is completed, the data stored in the data region and the data stored in the download region may be exchanged (S910). Herein, when it is determined in step 909 that the downloading process has not been completed, and yet the power of the vehicle is turned off (S911), the downloading process cannot be continued. Therefore, an indicator notifying the final storage region is stored (S912). The downloaded map information or traffic information may be used in route search functions. FIG. 10D illustrates an example of an on-screen display for inputting travel route search. By using the OSD for inputting travel route search as shown in FIG. 10D, the user may be able to search for specific locations including a specific destination.

Figure 11:
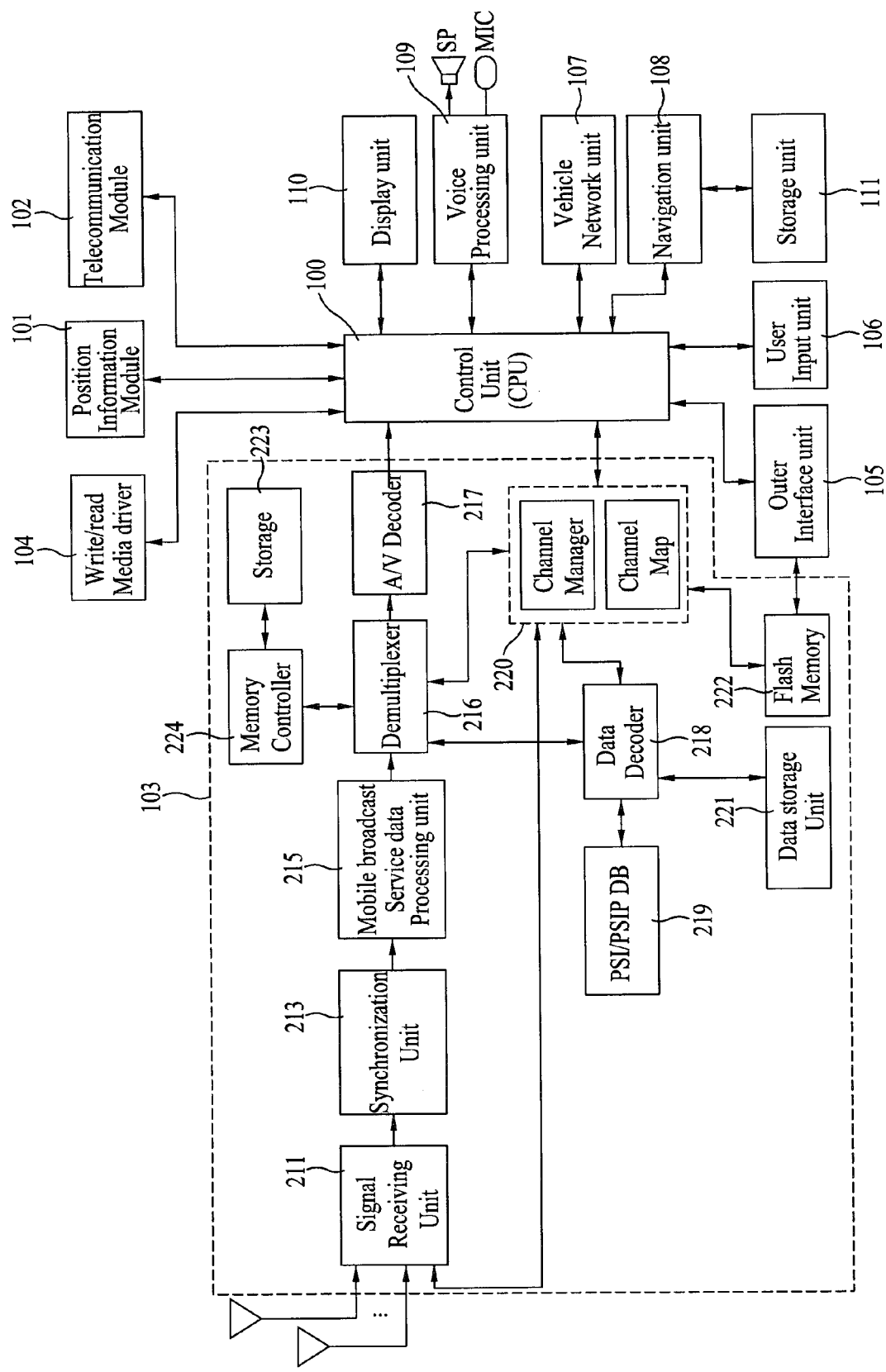
FIG. 11 illustrates a block view showing a structure of a telematics terminal provided with a broadcasting module according to a second embodiment of the present invention, wherein the broadcasting module can receive map information or traffic information through VSB mode mobile broadcast services, thereby storing and using the received information.

FIG. 11 illustrates a block view showing a structure of a telematics terminal provided with a broadcasting module according to a second embodiment of the present invention, wherein the broadcasting module can receive map information or traffic information through VSB mode mobile broadcast services, thereby storing and using the received information. Referring to FIG. 11, the broadcasting module further includes a storage unit 223 and a memory 224, which are used to perform instant recording, reserved (or pre-programmed) recording, and time shift on the mobile broadcast service data. Apart from the storage unit 223 and the memory 224, the structures and operations of the remaining elements of the telematics terminal are identical to the corresponding elements of the telematics terminal shown in FIG. 3. Therefore, the description of FIG. 11 will mainly be focused on the storage unit 223 and the memory 224. Furthermore, the structures and operations of the synchronization unit 213 and the mobile broadcast service data processing unit 215 are identical to those described in FIG. 4. Therefore, in FIG. 11, a detailed description of the same will be omitted for simplicity.

Either a hard disk drive (HDD) or a detachable external memory unit may be used as the storage unit 223. More specifically, the mobile broadcast service data demultiplexed by the demultiplexer 216 may be outputted to the A/V decoder 217 or the data decoder 218. Alternatively, based upon the control of the memory controller 224, the demultiplexed mobile broadcast service data may also be written (or recorded) in the storage unit 213. When the user selects one of instant recording, reserved (or pre-programmed) recording, and time shift, the memory controller 224 records the corresponding mobile broadcast service data demultiplexed by the demultiplexer 216 in the storage unit 213. Additionally, when the user selects the playback of the mobile broadcast service data stored in the storage unit 223, the mobile broadcast service data stored in the storage unit 223 is read and outputted based upon the control of the memory controller 224. Subsequently, after being decoded by the A/V decoder 217 or the data decoder 218, the decoded mobile broadcast service data may be provided to the user.

The storage controller 224 may control the fast-forward, rewind, slow motion, and instant replay functions of the data that are stored in the storage unit 223. Herein, the instant replay function corresponds to repeatedly viewing scenes that the viewer (or user) wishes to view once again. The instant replay function may be performed on stored data and also on data that are currently being received in real time by associating the instant replay function with the time shift function. In order to prevent illegal duplication (or copies) of the input data being stored in the storage unit 223, the storage controller 224 scrambles the input data and stores the scrambled data in the storage unit 223. Also, based upon the playback command of the user, the memory controller 224 reads and outputs the data scrambled and stored in the storage unit 223, so as to descramble the read data, thereby outputting the descrambled data to the demultiplexer 216. According to another embodiment of the present invention, the above-described functions of the memory controller 224 and the storage unit 223, such as the instant recording, pre-programmed recording, time shift, playback, and instant replay, may be performed by the write/read media driver 104 instead of the storage unit 223.

Figure 12:
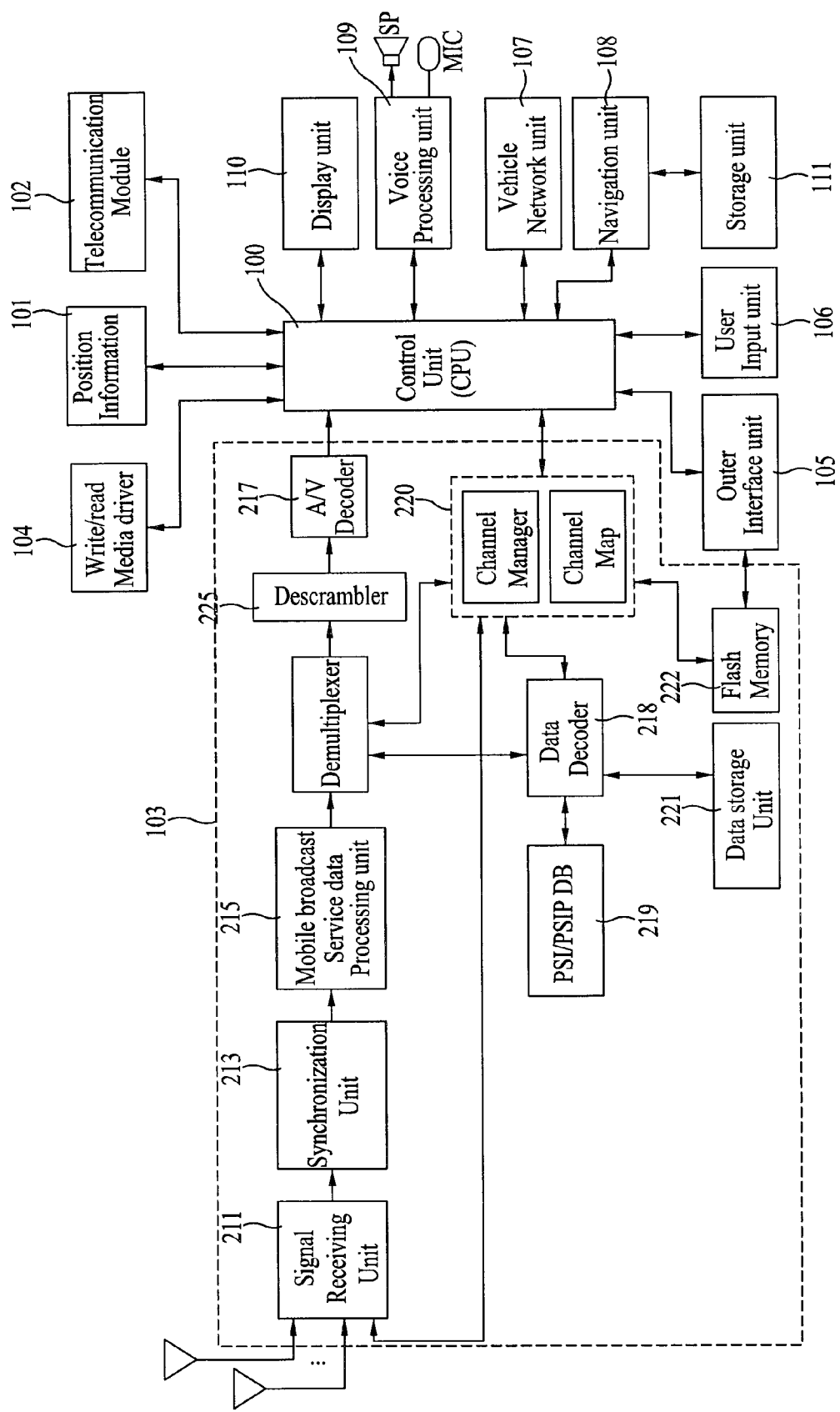
FIG. 12 illustrates a block view showing a structure of a telematics terminal provided with a broadcasting module according to a third embodiment of the present invention, wherein the broadcasting module can receive map information or traffic information through VSB mode mobile broadcast services, thereby storing and using the received information.

FIG. 12 illustrates a block view showing a structure of a telematics terminal provided with a broadcasting module according to a third embodiment of the present invention, wherein the broadcasting module can receive map information or traffic information through VSB mode mobile broadcast services, thereby storing and using the received information. Referring to FIG. 12, the broadcasting module further includes a descrambler 225 between the demultiplexer 216 and the A/V decoder 217, which is used to descramble the mobile broadcast service data that are scrambled and outputted from the transmitting system. Apart from the descrambler 225, the structures and operations of the remaining elements of the telematics terminal are identical to the corresponding elements of the telematics terminal shown in FIG. 3. Therefore, the description of FIG. 12 will mainly be focused on the descrambler 225. Furthermore, the structures and operations of the synchronization unit 213 and the mobile broadcast service data processing unit 215 are identical to those described in FIG. 4. Therefore, in FIG. 12, a detailed description of the same will be omitted for simplicity.

Referring to FIG. 12, the descrambler 225 is provided between the demultiplexer 216 and the A/V decoder 217. However, according to another embodiment of the present invention, the descrambler 225 may also be provided between the demultiplexer 216 and the data decoder 218. Also, an authenticator (not shown) may further be provided in each descrambler. Alternatively, a separate authenticator (not shown) may be provided so as to control the scrambling of the two descramblers. The authentication process may also be performed by the control unit 100. When the mobile broadcast service data demultiplexed by the demultiplexer 216 are scrambled, the descrambler 225 descrambles the corresponding data and outputs the descrambled data to the A/V decoder 217. At this point, the descrambler 225 receives the authentication result and/or data required for the descrambling process, which are then used to descramble the corresponding data.

More specifically, in order to provide service to prevent the transmitted mobile broadcast service data from being illegally duplicated (or copied) or viewed, or in order to provide charged broadcast services, the broadcasting station may scramble the mobile broadcast service data and transmit the scrambled data. Accordingly, since the descrambler 225 is required to descramble the scrambled mobile broadcast service data, an authentication process may be performed by an authentication means prior to the descrambling process. Herein, the descrambler 225 may also be provided as a detachable unit of the telematics terminals in the form of a slot or a memory stick.

In order to perform the descrambling process, the descrambler 225 may perform the authentication process. Herein, the authentication process determines whether the telematics terminal is a legitimate host entitled to receive the charged mobile broadcast service data (i.e., charged broadcast programs (or contents)). For example, the authentication process may be carried out by comparing an internet protocol (IP) address of an IP datagram, which is included in the broadcast program (or contents) being received, to a unique address of the corresponding telematics terminal. Herein, the unique address of the telematics terminal may correspond to a media access control (MAC) address.

According to another embodiment of the authentication process, identification (ID) information pre-standardized by the transmitting system and receiving system may be defined. Then, the transmitting system may transmit ID information of the telematics terminal that has requested the charged broadcast service. Accordingly, the telematics terminal may determine the authenticity between its own identification number and the ID information received from the transmitting system, thereby performing the authentication process. The transmitting system generates a database so as to store the unique ID information of the telematics terminal that has requested the charged broadcast service. Thereafter, when scrambling the charged mobile broadcast service data, the transmitting system include an entitlement management message (EMM) in the ID information and transmits the processed ID information. Alternatively, when the corresponding mobile broadcast service data are scrambled, a message (e.g., entitlement control message (ECM) or EMM), such as a conditional access system (CAS) information, mode information, message position information, and so on, which are applied in the scrambling process, may be transmitted via a corresponding data header or another packet.

More specifically, the ECM may include a control word (CW) that is used in the scrambling process. At this point, the control word may be encoded (or encrypted) with an authentication key. The EMM may include an authentication key and entitlement information of the corresponding data header. The authentication information may be encoded with a unique distribution key of the telematics terminal. When the mobile broadcast service data are scrambled by using the control word (CW), and when the information required for authentication and the information for descrambling are transmitted from the transmitting system, the transmitting system may encode the control word (CW) with an authentication key, which is then included in an entitlement control message (ECM) and transmitted.

Furthermore, the transmitting system includes the authentication key used for encoding the control word (CW) and a reception entitlement of the telematics terminal (e.g., a standardized serial number of a telematics terminal that is entitled to receive data) in an entitlement management message (EMM), which is then transmitted. Therefore, the telematics terminal may extract its unique ID information and may extract the ID information included in the EMM of the mobile broadcast service data being received, so as to determine the authenticity between the extracted ID information, thereby carrying out the authentication process. If the authentication result shows that the ID information are identical, the corresponding telematics terminals may be determined as a legitimate receiver entitled to receive data.

According to yet another embodiment of the authentication process, the telematics terminal may be provided with an authenticator on a detachable external (or outer) module. At this point, the telematics terminal and the outer module are interfaced via a common interface (CI). More specifically, the outer module may receiver scrambled data from the telematics terminal via the common interface (CI), thereby descrambling the received data. Alternatively, the telematics terminal may also selectively transmit only the information required for the descrambling process to the corresponding telematics terminal. Furthermore, the common interface (CI) may be configured of one physical layer and at least one protocol layer. Herein, in consideration of a future expansion, the protocol layer may include at least one layer each providing an independent function.

The outer module may correspond to a memory or card having no descrambling function yet having key information and authentication information, which were used in the scrambling process, stored therein. Alternatively, the outer module may also correspond to a card including a descrambling function. More specifically, the module may include the descrambling function in the form of middleware or software. At this point, the telematics terminal and the outer module should both be authenticated in order to be able to provide the user with the charged mobile broadcast service data, which are supplied by the transmitting system. Therefore, the transmitting system may provide the charged mobile broadcast service data only to the authenticated telematics terminal and module pair. Thus, the telematics terminal and outer module may be mutually authenticated (or processed with two-way authentication) via the common interface (CI). The outer module may also communicate with the control unit 100 of the telematics terminal, thereby authenticating the corresponding telematics terminal.

The telematics terminal may authenticate the outer module via the common interface. And, the module may extract the unique ID of the telematics terminal and its own unique ID during the mutual authentication (or two-way authentication) process, which are then transmitted to the transmitting system. Thereafter, the transmitting system uses the received ID information (or value) as information for determining whether to start the requested service or as charged fee information. When required, the control unit 100 may transmit the charged fee information to a transmitting system located in a remote site via the telecommunication module 102. Furthermore, the telematics terminal may also receive authentication-associated data from a mobile telecommunications service provider to which the user is subscribed, instead of receiving the authentication-associated data from the transmitting system that provides the mobile broadcast service data. In this case, the authentication-associated data may be scrambled by the transmitting system that provides the mobile broadcast service data and transmitted by passing through the domestic carrier. Otherwise, the authentication-associated data may be scrambled by the domestic carrier and then transmitted.

According to yet another embodiment of the authentication process, the authentication process may be performed using software without having to depend on hardware. More specifically, when a memory card having software pre-stored therein by downloading CAS software is inserted, the telematics terminal receives the CAS software from the inserted memory card. Thereafter, the CAS software is loaded so as to perform the authentication process. Herein, a flash memory or a compact hard disk may be used as the memory card. The memory card may be used in at least one telematics terminal depending upon the contents, authentication, scrambling, fee-charging of the CAS software stored therein. However, the CAS software includes at least information required for the authentication process and information required for the descrambling process.

The CAS software read from the memory card is stored in a storage unit (e.g., flash memory 222) within the telematics terminal. Then, the stored CAS software may be operated on the middleware in the form of an application. In this example, a Java middleware will be given as the middleware. Herein, the outer interface unit 105 may include a common interface (CI) in order to be connected with the flash memory 222. In this case, an authentication process between the transmitting system and telematics terminal or between the telematics terminal and memory card is performed. The memory card entitled to receive data may include information on an ordinary (or normal) authenticatable telematics terminal. For example, information on the telematics terminal includes unique information, such as a standardized serial number, on the corresponding telematics terminal. Therefore, the authentication process between the memory card and telematics terminal may be performed by comparing the unique information, such as the standardized serial number, included in the memory card with the unique information of the corresponding telematics terminal.

Herein, the authentication process between the telematics terminal and memory card may be performed while the CAS software performs a Java middleware-based execution (or operation). For example, the telematics terminal determines whether the unique serial number of the telematics terminal, which is included in the CAS software, identically matches the unique serial number of the telematics terminal, which has been read by the control unit 100 of the telematics terminal. Then, when the comparison result shows that the two unique serial numbers, the corresponding memory card is determined to be a normal memory card, which can be used by the telematics terminal. At this point, the CAS software may also be equipped in the flash memory 222 prior to the shipping of the telematics terminal. Alternatively, the CAS software may be stored in the flash memory 222 from the transmitting system, the module or memory card. The descrambling function may be operated in the form of an application by the data broadcasting application.

The CAS software parses the EMM/ECM packet outputted from the demultiplexer 216 in order to verify whether the corresponding telematics terminal is entitled to receive data. Thus, the CAS software may obtain information required for the descrambling process (i.e., a CW) and provide the information to the descrambler 225. The CAS software performing Java middleware-based operation reads the unique number of the corresponding telematics terminal. Then, the CAS software compares the read unique number with the unique number of the telematics terminal that is transmitted to the EMM, thereby verifying whether the corresponding telematics terminal is entitled to receive data. Once the entitlement of the telematics terminal is verified, the corresponding mobile broadcast service information transmitted to the ECM and the entitlement of the corresponding mobile broadcast service are used to verify whether the telematics terminal is entitled to receive the corresponding mobile broadcast service.

Once the entitlement of receiving the corresponding (or requested) mobile broadcast service is verified, the authentication key transmitted to the EMM is used to decipher the encoded (or encrypted) control word (CW), which is transmitted to the ECM. Thereafter, the deciphered control word is outputted to the descrambler 225. The descrambler 225 then uses the control word to descramble the mobile broadcast service. Meanwhile, the CAS software that is stored in the memory card may be expanded depending upon a charged mobile broadcast service that is to be provided by the broadcasting station. Also, the CAS software may also include other supplemental (or additional) information other than information associated with authentication or descrambling. The telematics terminal may also download the CAS software from the transmitting system, thereby upgrading the CAS software already stored in the memory card.

Similar to the telematics terminal shown in FIG. 11, the telematics terminal of FIG. 12 may also further include a storage unit 223 and a memory controller 224. Also, the scrambled mobile broadcast service data that are received may also either be directly stored in the storage unit 223 without modification or be descrambled and then stored in the storage unit 223. Alternatively, the mobile broadcast service data may also be stored in a write/read medium inserted in the write/read media driver 104 instead of the storage unit 223. If the mobile broadcast service data stored in the write/read medium inserted in the write/read media driver 104 instead or in the storage unit 223 are scrambled, the corresponding data may be descrambled after an authentication process when being played (or reproduced).

More specifically, also in FIG. 12, the mobile broadcast service data demultiplexed by the demultiplexer 216 may be outputted to the A/V decoder 217 or the data decoder 218. Alternatively, based upon the control of the memory controller 224, the demultiplexed mobile broadcast service data may also be written (or recorded) in the storage unit 213. When the user selects one of instant recording, reserved (or pre-programmed) recording, and time shift, the memory controller 224 records the corresponding mobile broadcast service data demultiplexed by the demultiplexer 216 in the storage unit 213. Additionally, when the user selects the playback of the mobile broadcast service data stored in the storage unit 223, the mobile broadcast service data stored in the storage unit 223 is read and outputted based upon the control of the memory controller 224. Subsequently, after being decoded by the A/V decoder 217 or the data decoder 218, the decoded mobile broadcast service data may be provided to the user.

The memory controller 224 may control the fast-forward, rewind, slow motion, and instant replay functions of the data that are stored in the storage unit 223. Herein, the instant replay function corresponds to repeatedly viewing scenes that the viewer (or user) wishes to view once again. The instant replay function may be performed on stored data and also on data that are currently being received in real time by associating the instant replay function with the time shift function. Also, when the memory controller 224 is provided with a scramble/descramble algorithm, the memory controller 224 may scramble the scrambled and received mobile broadcast service data once again, thereby storing the re-scrambled mobile broadcast service data in the storage unit 223. Alternatively, the memory controller 224 may scramble the mobile broadcast service data, which have not been scrambled, and store the scrambled mobile broadcast service data in the storage unit. Then, playing-back the data, the memory controller 224 may descramble the stored mobile broadcast data and output the descrambled data to the demultiplexer 216.

MPH Frame Structure

In the embodiment of the present invention, the mobile broadcast service data including traffic information are first multiplexed with main broadcast service data in MPH frame units and, then, modulated in a VSB mode and transmitted to the receiving system. At this point, one MPH frame consists of K1 number of sub-frames, wherein one sub-frame includes K2 number of slots. Also, each slot may be configured of K3 number of data packets. In the embodiment of the present invention, K1 will be set to 5, K2 will be set to 16, and K3 will be set to 156 (i.e., K1=5, K2=16, and K3=156). The values for K1, K2, and K3 presented in this embodiment either correspond to values according to a preferred embodiment or are merely exemplary. Therefore, the above-mentioned values will not limit the scope of the present invention.

Figure 13:
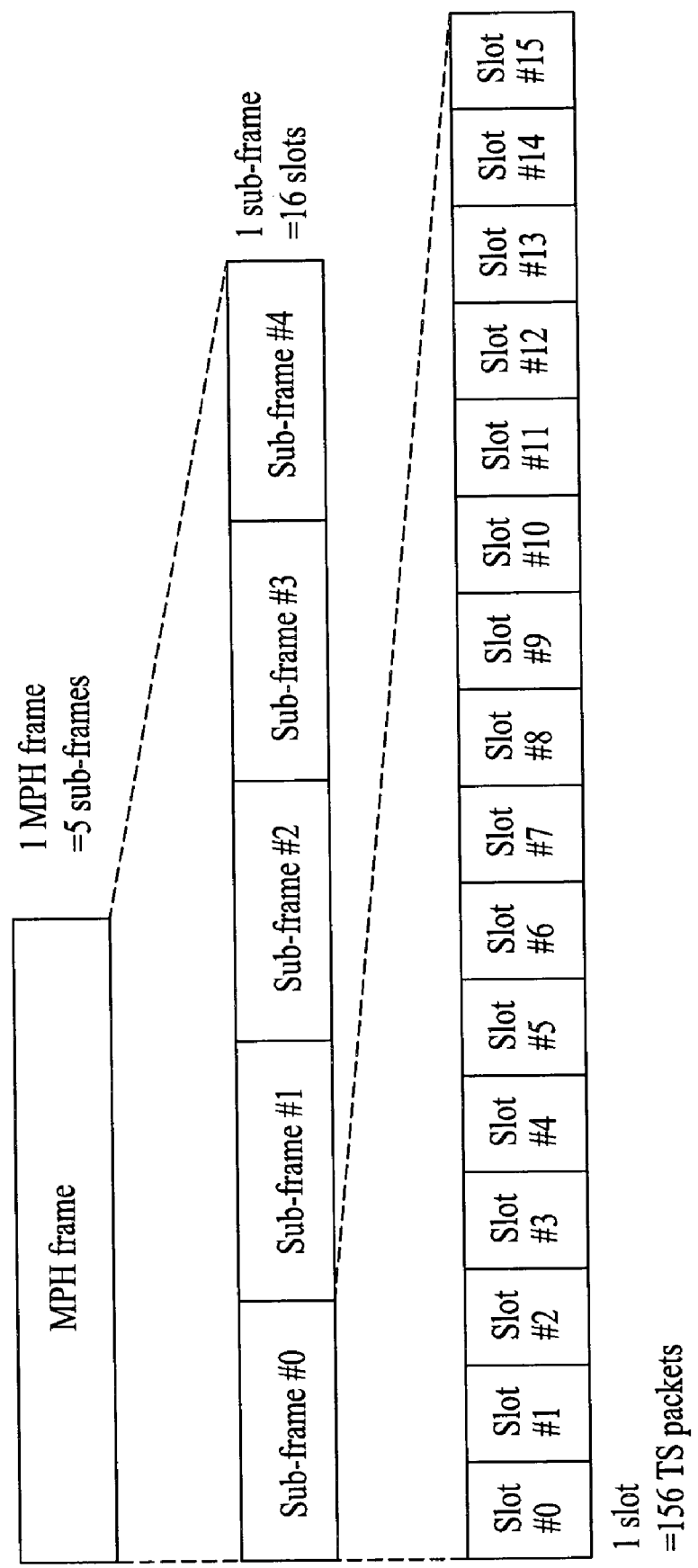
FIG. 13 illustrates a structure of a MPH frame for transmitting and receiving mobile broadcast service data according to the present invention.

FIG. 13 illustrates a structure of a MPH frame for transmitting and receiving mobile broadcast service data according to the present invention. In the example shown in FIG. 13, one MPH frame consists of 5 sub-frames, wherein each sub-frame includes 16 slots. In this case, the MPH frame according to the present invention includes 5 sub-frames and 80 slots. Also, in a packet level, one slot is configured of 156 data packets (i.e., transport stream packets), and in a symbol level, one slot is configured of 156 data segments. Herein, the size of one slot corresponds to one half (½) of a VSB field. More specifically, since one 207-byte data packet has the same amount of data as a data segment, a data packet prior to being interleaved may also be used as a data segment. At this point, two VSB fields are grouped to form a VSB frame.

Figure 14:
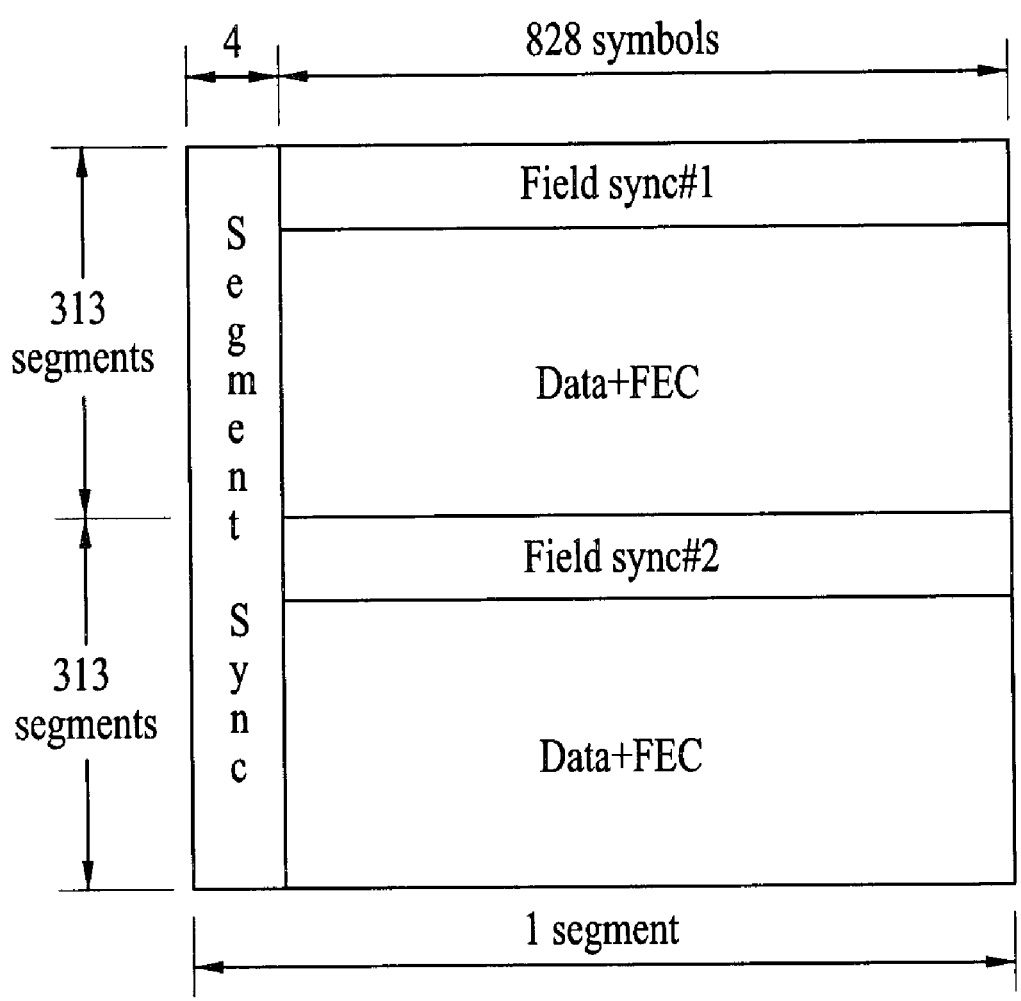
FIG. 14 illustrates an exemplary structure of a VSB frame.

FIG. 14 illustrates an exemplary structure of a VSB frame, wherein one VSB frame consists of 2 VSB fields (i.e., an odd field and an even field). Herein, each VSB field includes a field synchronization segment and 312 data segments. The slot corresponds to a basic time period for multiplexing the mobile broadcast service data and the main broadcast service data. Herein, one slot may either include the mobile broadcast service data or be configured only of the main broadcast service data. If one MPH frame is transmitted during one slot, the first 118 data packets within the slot correspond to a data group. And, the remaining 38 data packets become the main broadcast service data packets. In another example, when no data group exists in a slot, the corresponding slot is configured of 156 main broadcast service data packets. Meanwhile, when the slots are assigned to a VSB frame, an off-set exists for each assigned position.

Figure 15:
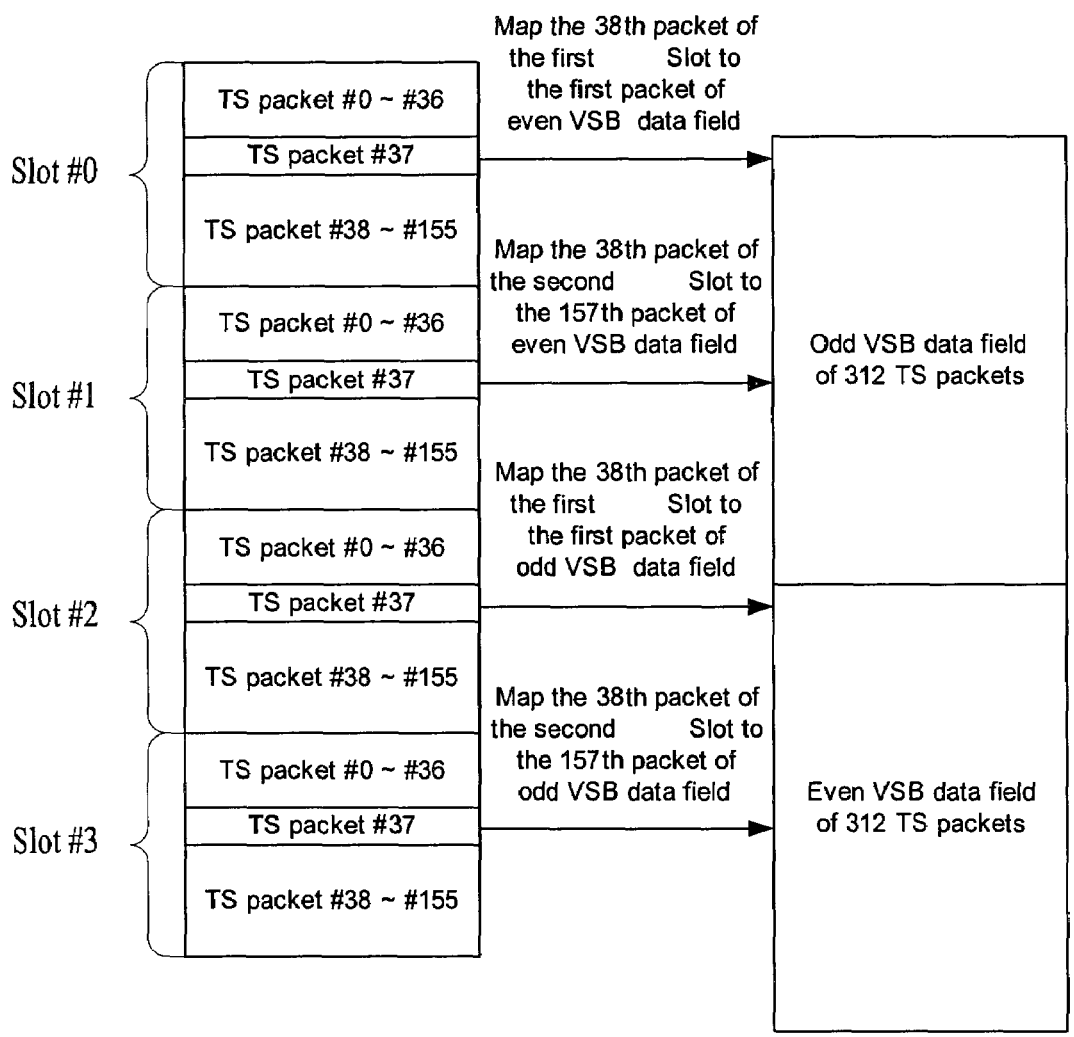
FIG. 15 illustrates a mapping example of the positions to which the first 4 slots of a sub-frame are assigned with respect to a VSB frame in a space region.
Figure 16:
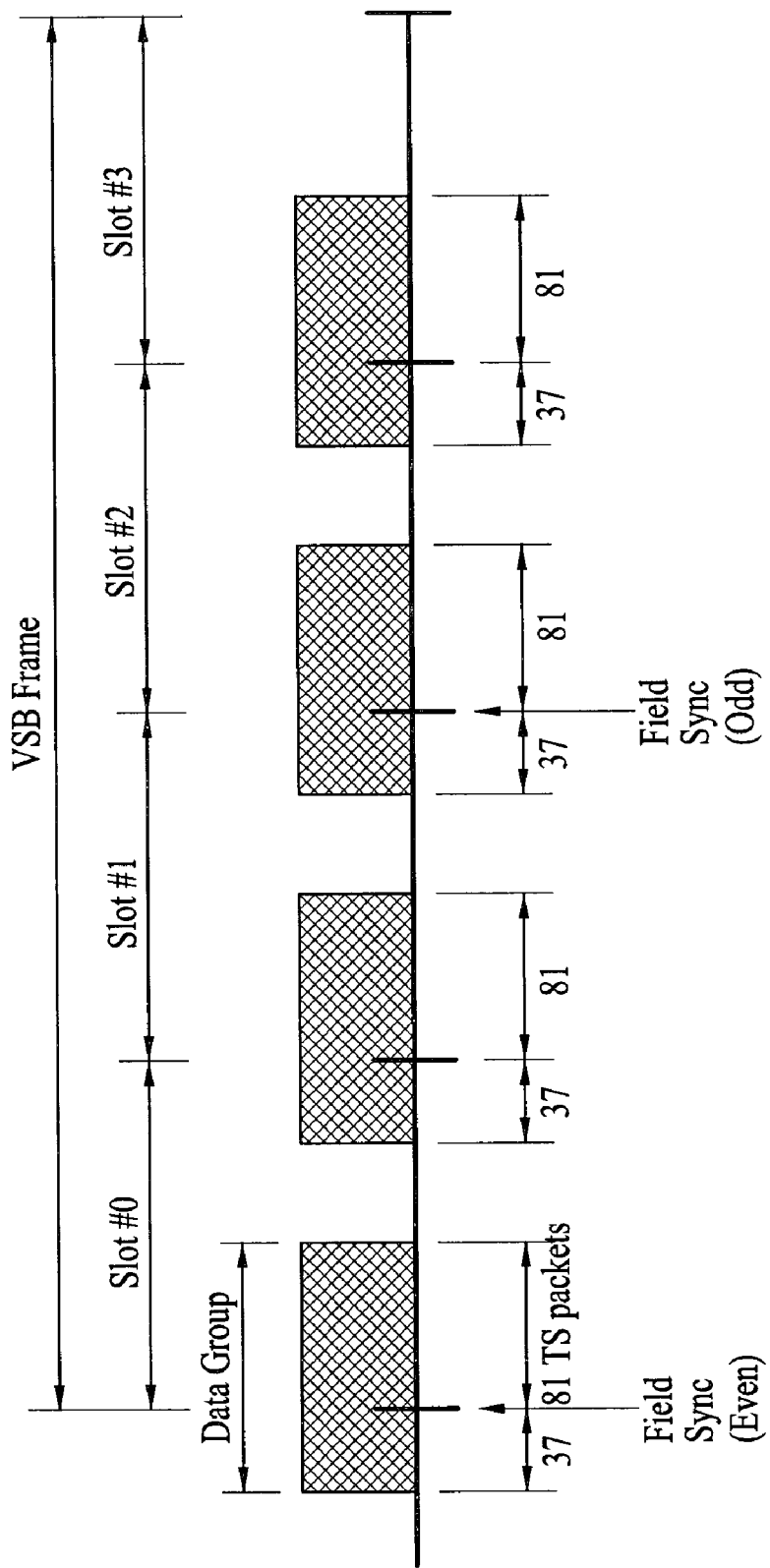
FIG. 16 illustrates a mapping example of the positions to which the first 4 slots of a sub-frame are assigned with respect to a VSB frame in a time region.

FIG. 15 illustrates a mapping example of the positions to which the first 4 slots of a sub-frame are assigned with respect to a VSB frame in a space region. And, FIG. 16 illustrates a mapping example of the positions to which the first 4 slots of a sub-frame are assigned with respect to a VSB frame in a time region. Referring to FIG. 15 and FIG. 16, a $38^{th}$ data packet (TS packet #37) of a $1^{st}$ slot (Slot #0) is mapped to the $1^{st}$ data packet of an odd VSB field. A $38^{th}$ data packet (TS packet #37) of a $2^{nd}$ slot (Slot #1) is mapped to the $157^{th}$ data packet of an odd VSB field. Also, a $38^{th}$ data packet (TS packet #37) of a $3^{rd}$ slot (Slot #2) is mapped to the $1^{st}$ data packet of an even VSB field. And, a $38^{th}$ data packet (TS packet #37) of a $4^{th}$ slot (Slot #3) is mapped to the $157^{th}$ data packet of an even VSB field. Similarly, the remaining 12 slots within the corresponding sub-frame are mapped in the subsequent VSB frames using the same method.

Meanwhile, one data group may be divided into at least one or more hierarchical regions. And, depending upon the characteristics of each hierarchical region, the type of mobile broadcast service data being inserted in each region may vary. For example, the data group within each region may be divided (or categorized) based upon the receiving performance. In an example given in the present invention, a data group is divided into regions A, B, C, and D in a data configuration prior to data deinterleaving.

Figure 17:
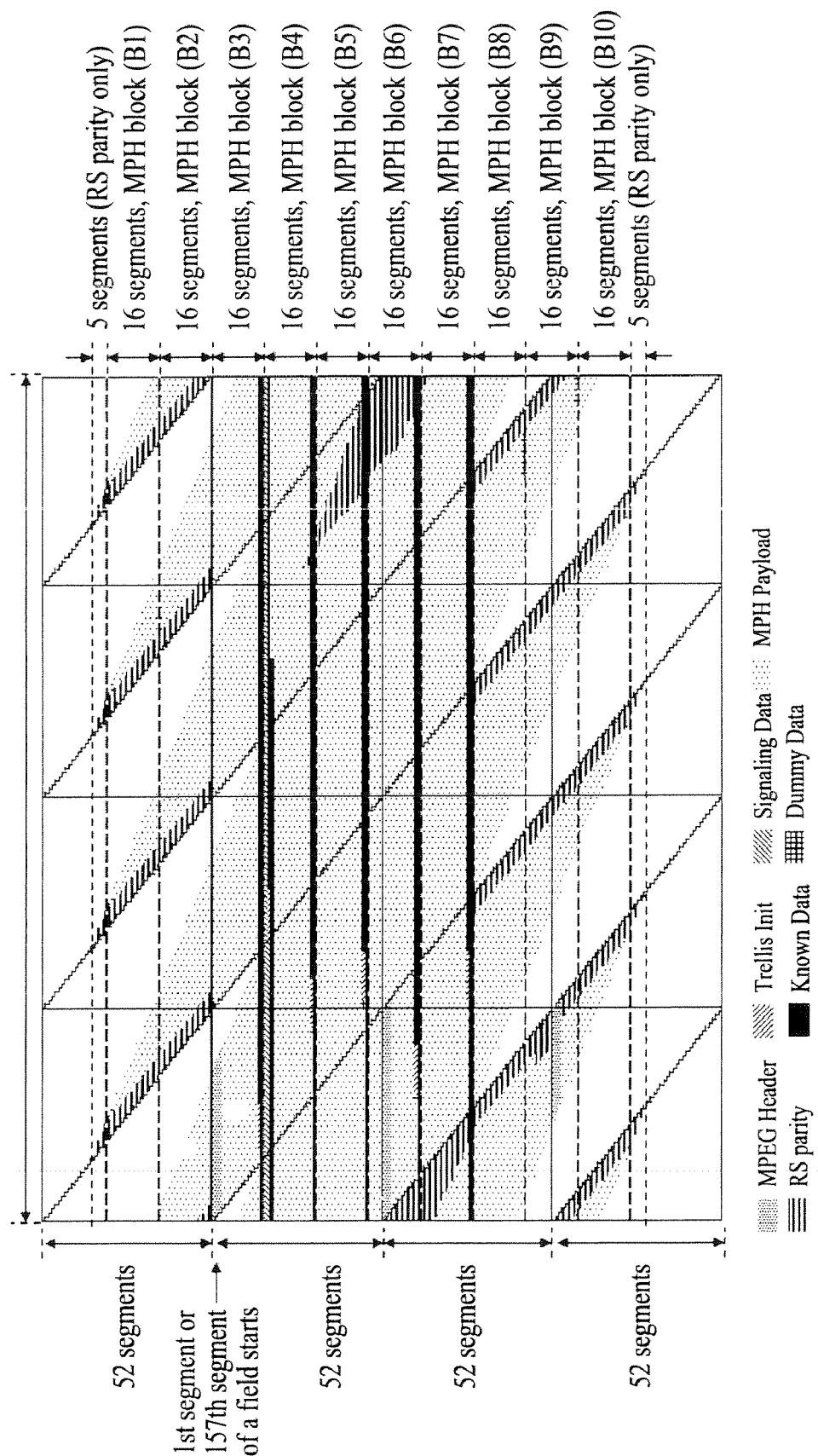
FIG. 17 illustrates an alignment of data after being data interleaved and identified.
Figure 18:
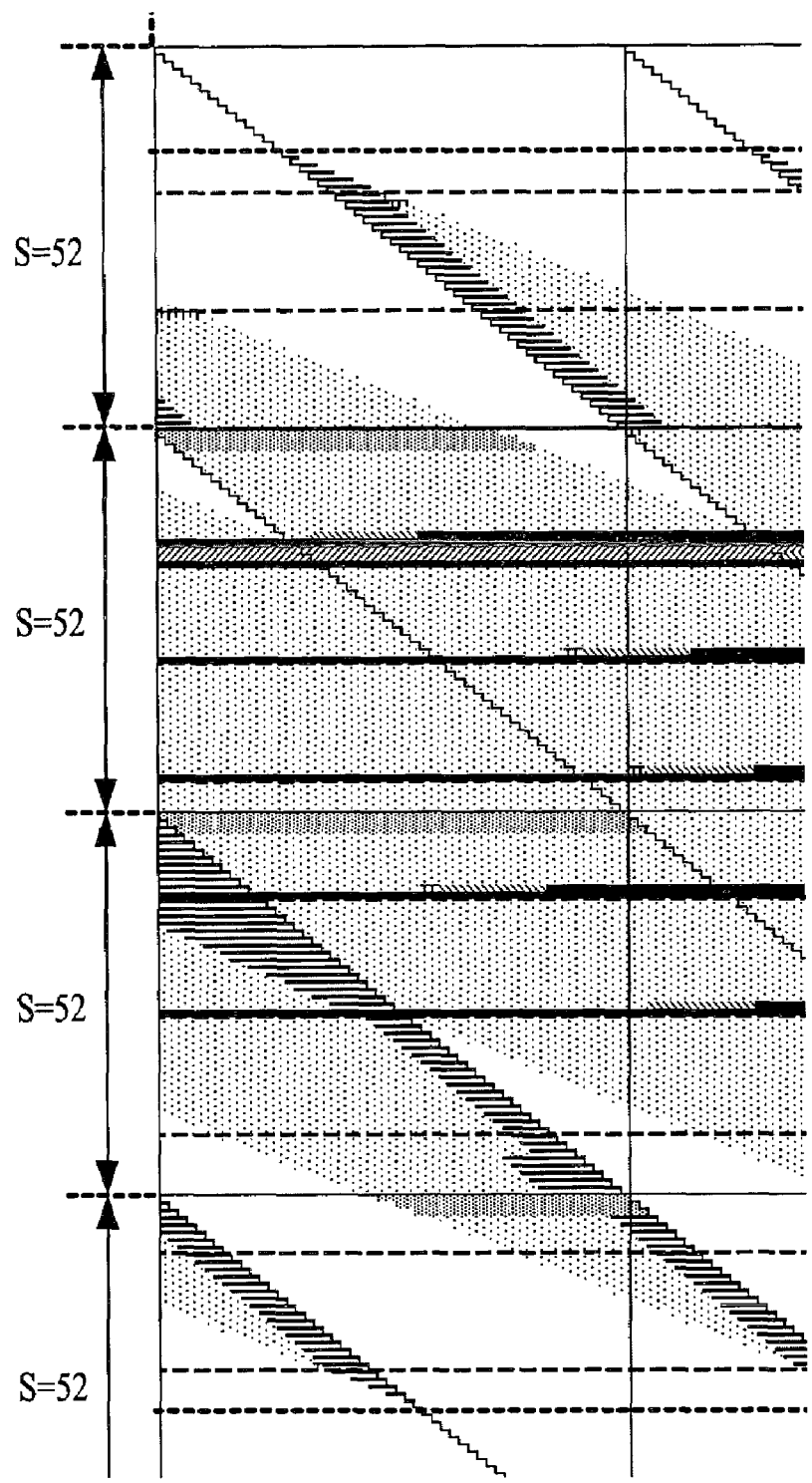
FIG. 18 illustrates an enlarged portion of the data group shown in FIG. 17 for a better understanding of the present invention.
Figure 19:
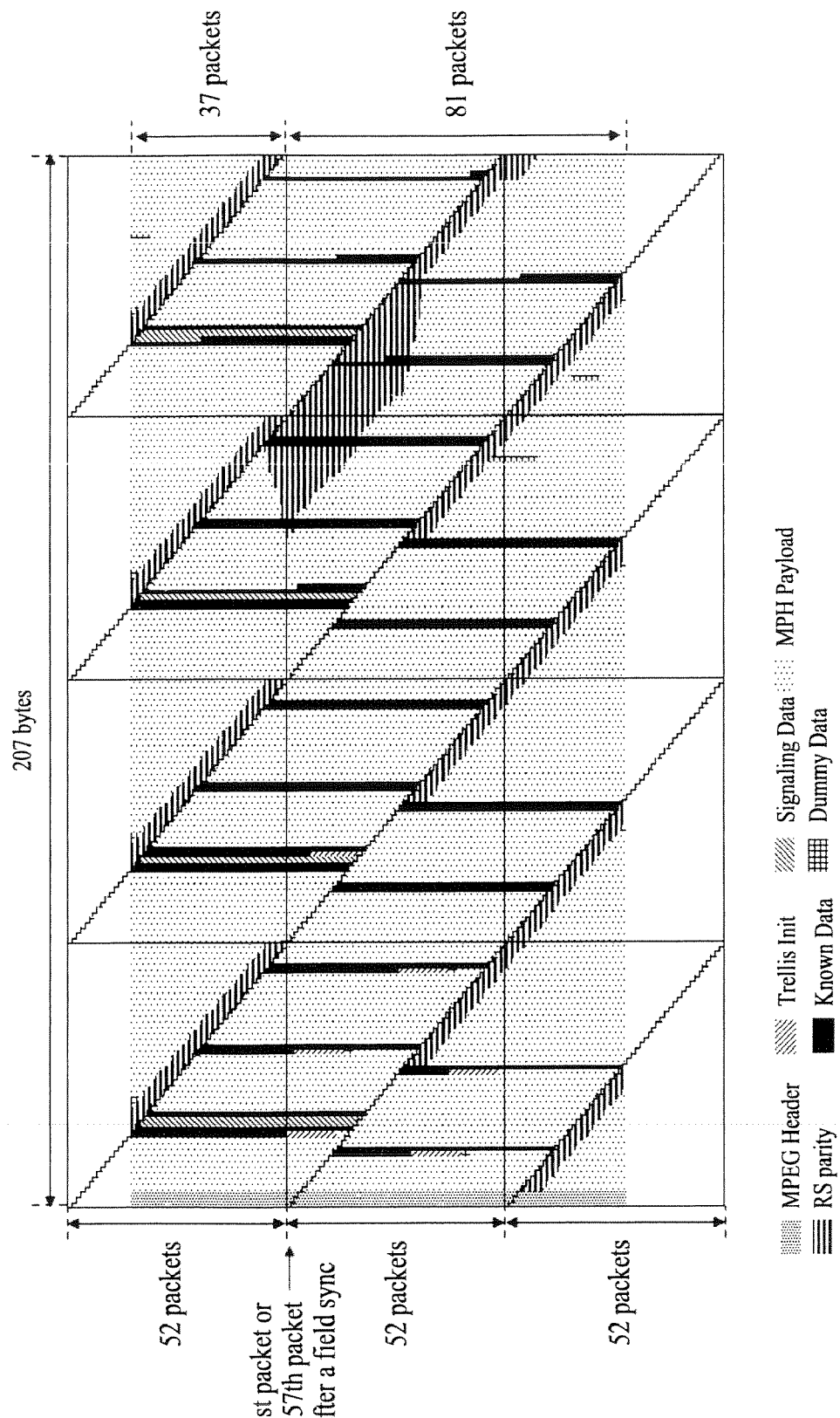
FIG. 19 illustrates an alignment of data before being data interleaved and identified.
Figure 20:
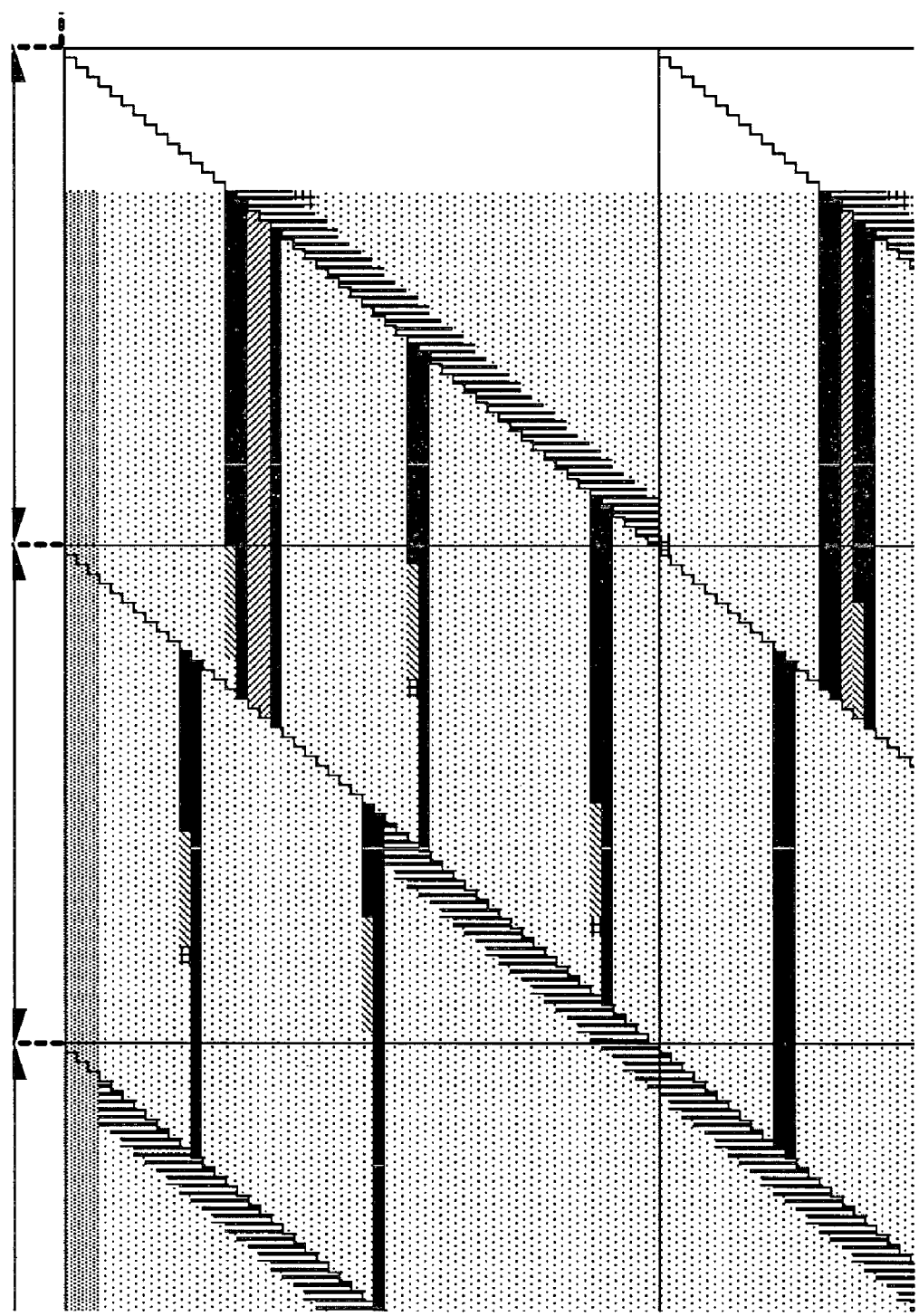
FIG. 20 illustrates an enlarged portion of the data group shown in FIG. 19 for a better understanding of the present invention.

FIG. 17 illustrates an alignment of data after being data interleaved and identified. FIG. 18 illustrates an enlarged portion of the data group shown in FIG. 17 for a better understanding of the present invention. FIG. 19 illustrates an alignment of data before being data interleaved and identified. And, FIG. 20 illustrates an enlarged portion of the data group shown in FIG. 19 for a better understanding of the present invention. More specifically, a data structure identical to that shown in FIG. 17 is transmitted to a receiving system. In other words, one data packet is data-interleaved so as to be scattered to a plurality of data segments, thereby being transmitted to the receiving system. FIG. 17 illustrates an example of one data group being scattered to 170 data segments. At this point, since one 207-byte packet has the same amount of data as one data segment, the packet that is not yet processed with data-interleaving may be used as the data segment.

FIG. 17 shows an example of dividing a data group prior to being data-interleaved into 10 MPH blocks (i.e., MPH block 1 (B1) to MPH block 10 (B10)). In this example, each MPH block has the length of 16 segments. Referring to FIG. 17, only the RS parity data are allocated to portions of the first 5 segments of the MPH block 1 (B1) and the last 5 segments of the MPH block 10 (B10). The RS parity data are excluded in regions A to D of the data group. More specifically, when it is assumed that one data group is divided into regions A, B, C, and D, each MPH block may be included in any one of region A to region D depending upon the characteristic of each MPH block within the data group.

Herein, the data group is divided into a plurality of regions to be used for different purposes. More specifically, a region of the main broadcast service data having no interference or a very low interference level may be considered to have a more resistant (or stronger) receiving performance as compared to regions having higher interference levels. Additionally, when using a system inserting and transmitting known data in the data group, wherein the known data are known based upon an agreement between the transmitting system and the receiving system, and when consecutively long known data are to be periodically inserted in the mobile broadcast service data, the known data having a predetermined length may be periodically inserted in the region having no interference from the main broadcast service data (i.e., a region wherein the main broadcast service data are not mixed). However, due to interference from the main broadcast service data, it is difficult to periodically insert known data and also to insert consecutively long known data to a region having interference from the main broadcast service data.

Referring to FIG. 17, MPH block 4 (B4) to MPH block 7 (B7) correspond to regions without interference of the main broadcast service data. MPH block 4 (B4) to MPH block 7 (B7) within the data group shown in FIG. 17 correspond to a region where no interference from the main broadcast service data occurs. In this example, a long known data sequence is inserted at both the beginning and end of each MPH block. In the description of the present invention, the region including MPH block 4 (B4) to MPH block 7 (B7) will be referred to as "region A (=B4+B5+B6+B7)". As described above, when the data group includes region A having a long known data sequence inserted at both the beginning and end of each MPH block, the receiving system is capable of performing equalization by using the channel information that can be obtained from the known data. Therefore, the strongest equalizing performance may be yielded (or obtained) from one of region A to region D.

In the example of the data group shown in FIG. 17, MPH block 3 (B3) and MPH block 8 (B8) correspond to a region having little interference from the main broadcast service data. Herein, a long known data sequence is inserted in only one side of each MPH block B3 and B8. More specifically, due to the interference from the main broadcast service data, a long known data sequence is inserted at the end of MPH block 3 (B3), and another long known data sequence is inserted at the beginning of MPH block 8 (B8). In the present invention, the region including MPH block 3 (B3) and MPH block 8 (B8) will be referred to as "region B(=B3+B8)". As described above, when the data group includes region B having a long known data sequence inserted at only one side (beginning or end) of each MPH block, the receiving system is capable of performing equalization by using the channel information that can be obtained from the known data. Therefore, a stronger equalizing performance as compared to region C/D may be yielded (or obtained).

Referring to FIG. 17, MPH block 2 (B2) and MPH block 9 (B9) correspond to a region having more interference from the main broadcast service data as compared to region B. A long known data sequence cannot be inserted in any side of MPH block 2 (B2) and MPH block 9 (B9). Herein, the region including MPH block 2 (B2) and MPH block 9 (B9) will be referred to as "region C(=B2+B9)". Finally, in the example shown in FIG. 17, MPH block 1 (B1) and MPH block 10 (B10) correspond to a region having more interference from the main broadcast service data as compared to region C. Similarly, a long known data sequence cannot be inserted in any side of MPH block 1 (B1) and MPH block 10 (B10). Herein, the region including MPH block 1 (B1) and MPH block 10 (B10) will be referred to as "region D (=B1+B10)". Since region C/D is spaced further apart from the known data sequence, when the channel environment undergoes frequent and abrupt changes, the receiving performance of region C/D may be deteriorated.

FIG. 19 illustrates a data structure prior to data interleaving. More specifically, FIG. 19 illustrates an example of 118 data packets being allocated to a data group. FIG. 19 shows an example of a data group consisting of 118 data packets, wherein, based upon a reference packet (e.g., a $1^{st}$ packet (or data segment) or $157^{th}$ packet (or data segment) after a field synchronization signal), when allocating data packets to a VSB frame, 37 packets are included before the reference packet and 81 packets (including the reference packet) are included afterwards. In other words, with reference to FIG. 17, a field synchronization signal is placed (or assigned) between MPH block 2 (B2) and MPH block 3 (B3). Accordingly, this indicates that the slot has an off-set of 37 data packets with respect to the corresponding VSB field. The size of the data groups, number of hierarchical regions within the data group, the size of each region, the number of MPH blocks included in each region, the size of each MPH block, and so on described above are merely exemplary. Therefore, the present invention will not be limited to the examples described above.

Figure 21:
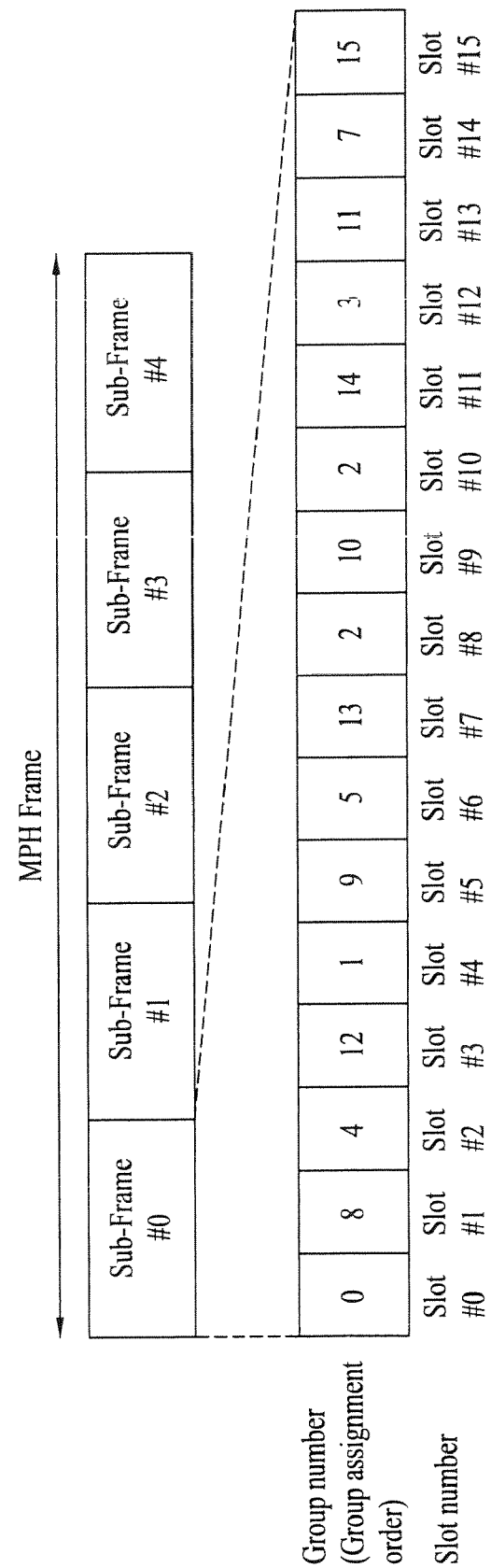
FIG. 21 illustrates an exemplary assignment order of data groups being assigned to one of 5 sub-frames according to the present invention.

FIG. 21 illustrates an exemplary assignment order of data groups being assigned to one of 5 sub-frames, wherein the 5 sub-frames configure an MPH frame. For example, the method of assigning data groups may be identically applied to all MPH frames or differently applied to each MPH frame. Furthermore, the method of assigning data groups may be identically applied to all sub-frames or differently applied to each sub-frame. At this point, when it is assumed that the data groups are assigned using the same method in all sub-frames of the corresponding MPH frame, the total number of data groups being assigned to an MPH frame is equal to a multiple of '5'. According to the embodiment of the present invention, a plurality of consecutive data groups is assigned to be spaced as far apart from one another as possible within the MPH frame. Thus, the system can be capable of responding promptly and effectively to any burst error that may occur within a sub-frame.

For example, when it is assumed that 3 data groups are assigned to a sub-frame, the data groups are assigned to a $1^{st}$ slot (Slot #0), a $5^{th}$ slot (Slot #4), and a $9^{th}$ slot (Slot #8) in the sub-frame, respectively. FIG. 21 illustrates an example of assigning 16 data groups in one sub-frame using the above-described pattern (or rule). In other words, each data group is serially assigned to 16 slots corresponding to the following numbers: 0, 8, 4, 12, 1, 9, 5, 13, 2, 10, 6, 14, 3, 11, 7, and 15. Equation 1 below shows the above-described rule (or pattern) for assigning data groups in a sub-frame.

$$j = (4i + 0) \bmod 16 \qquad \text{Equation 1}$$

$$\text{Herein,} \quad \begin{aligned} 0 &= 0 \text{ if } i < 4, \\ 0 &= 2 \text{ else if } i < 8, \\ 0 &= 1 \text{ else if } i < 12, \\ 0 &= 3 \text{ else.} \end{aligned}$$

Herein, j indicates the slot number within a sub-frame. The value of j may range from 0 to 15 (i.e., $0 \leq j \leq 15$). Also, variable i indicates the data group number. The value of i may range from 0 to 15 (i.e., $0 \leq i \leq 15$).

In the present invention, a collection of data groups included in a MPH frame will be referred to as a "parade". Based upon the RS frame mode, the parade transmits data of at least one specific RS frame. The mobile broadcast service data within one RS frame may be assigned either to all of regions A/B/C/D within the corresponding data group, or to at least one of regions A/B/C/D. In the embodiment of the present invention, the mobile broadcast service data within one RS frame may be assigned either to all of regions A/B/C/D, or to at least one of regions A/B and regions C/D. If the mobile broadcast service data are assigned to the latter case (i.e., one of regions A/B and regions C/D), the RS frame being assigned to regions A/B and the RS frame being assigned to regions C/D within the corresponding data group are different from one another.

In the description of the present invention, the RS frame being assigned to regions A/B within the corresponding data group will be referred to as a "primary RS frame", and the RS frame being assigned to regions C/D within the corresponding data group will be referred to as a "secondary RS frame", for simplicity. Also, the primary RS frame and the secondary RS frame form (or configure) one parade. More specifically, when the mobile broadcast service data within one RS frame are assigned either to all of regions A/B/C/D within the corresponding data group, one parade transmits one RS frame. Conversely, when the mobile broadcast service data within one RS frame are assigned either to at least one of regions A/B and regions C/D, one parade may transmit up to 2 RS frames. More specifically, the RS frame mode indicates whether a parade transmits one RS frame, or whether the parade transmits two RS frames. Table 1 below shows an example of the RS frame mode.

TABLE 1

| RS frame mode (2 bits) | Description |
|---|---|
| 00 | There is only one primary RS frame for all group regions |
| 01 | There are two separate RS frames. Primary RS frame for group regions A and B Secondary RS frame for group regions C and D |
| 10 | Reserved |
| 11 | Reserved |

Table 1 illustrates an example of allocating 2 bits in order to indicate the RS frame mode. For example, referring to Table 1, when the RS frame mode value is equal to '00', this indicates that one parade transmits one RS frame. And, when the RS frame mode value is equal to '01', this indicates that one parade transmits two RS frames, i.e., the primary RS frame and the secondary RS frame. More specifically, when the RS frame mode value is equal to '01', data of the primary RS frame for regions A/B are assigned and transmitted to regions A/B of the corresponding data group. Similarly, data of the secondary RS frame for regions C/D are assigned and transmitted to regions C/D of the corresponding data group.

Additionally, one RS frame transmits one ensemble. Herein, the ensemble is a collection of services requiring the same quality of service (QOS) and being encoded with the same FEC codes. More specifically, when one parade is configured of one RS frame, then one parade transmits one ensemble. Conversely, when one parade is configured of two RS frames, i.e., when one parade is configured of a primary RS frame and a secondary RS frame, then one parade transmits two ensembles (i.e., a primary ensemble and a secondary ensemble). More specifically, the primary ensemble is transmitted through a primary RS frame of a parade, and the secondary ensemble is transmitted through a secondary RS frame of a parade. The RS frame is a 2-dimensional data frame through which an ensemble is RS-CRC encoded.

As described in the assignment of data groups, the parades are also assigned to be spaced as far apart from one another as possible within the sub-frame. Thus, the system can be capable of responding promptly and effectively to any burst error that may occur within a sub-frame. Furthermore, the method of assigning parades may be identically applied to all sub-frames or differently applied to each sub-frame. According to the embodiment of the present invention, the parades may be assigned differently for each MPH frame and identically for all sub-frames within an MPH frame. More specifically, the MPH frame structure may vary by MPH frame units. Thus, an ensemble rate may be adjusted on a more frequent and flexible basis.

Figure 22:
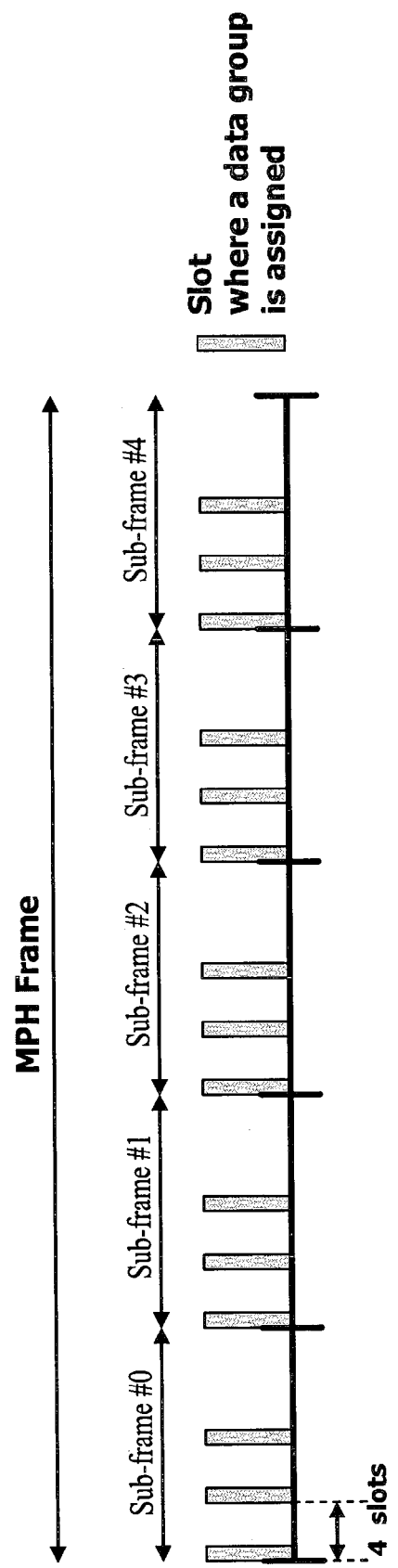
FIG. 22 illustrates an example of multiple data groups of a single parade being assigned (or allocated) to an MPH frame.

FIG. 22 illustrates an example of multiple data groups of a single parade being assigned (or allocated) to an MPH frame. More specifically, FIG. 22 illustrates an example of a plurality of data groups included in a single parade, wherein the number of data groups included in a sub-frame is equal to '3', being allocated to an MPH frame. Referring to FIG. 22, 3 data groups are sequentially assigned to a sub-frame at a cycle period of 4 slots. Accordingly, when this process is equally performed in the 5 sub-frames included in the corresponding MPH frame, 15 data groups are assigned to a single MPH frame. Herein, the 15 data groups correspond to data groups included in a parade. Therefore, since one sub-frame is configured of 4 VSB frame, and since 3 data groups are included in a sub-frame, the data group of the corresponding parade is not assigned to one of the 4 VSB frames within a sub-frame.

For example, when it is assumed that one parade transmits one RS frame, and that a RS frame encoder located in a later block performs RS-encoding on the corresponding RS frame, thereby adding 24 bytes of parity data to the corresponding RS frame and transmitting the processed RS frame, the parity data occupy approximately 11.37% ($=24/(187+24) \times 100$) of the total code word length. Meanwhile, when one sub-frame includes 3 data groups, and when the data groups included in the parade are assigned, as shown in FIG. 22, a total of 15 data groups form an RS frame. Accordingly, even when an error occurs in an entire data group due to a burst noise within a channel, the percentile is merely 6.67% ($=1/15 \times 100$). Therefore, the receiving system may correct all errors by performing an erasure RS decoding process. More specifically, when the erasure RS decoding is performed, a number of channel errors corresponding to the number of RS parity bytes may be corrected. By doing so, the receiving system may correct the error of at least one data group within one parade. Thus, the minimum burst noise length correctable by a RS frame is over 1 VSB frame.

Meanwhile, when data groups of a parade are assigned as described above, either main broadcast service data may be assigned between each data group, or data groups corresponding to different parades may be assigned between each data group. More specifically, data groups corresponding to multiple parades may be assigned to one MPH frame. Basically, the method of assigning data groups corresponding to multiple parades is very similar to the method of assigning data groups corresponding to a single parade. In other words, data groups included in other parades that are to be assigned to an MPH frame are also respectively assigned according to a cycle period of 4 slots. At this point, data groups of a different parade may be sequentially assigned to the respective slots in a circular method. Herein, the data groups are assigned to slots starting from the ones to which data groups of the previous parade have not yet been assigned. For example, when it is assumed that data groups corresponding to a parade are assigned as shown in FIG. 22, data groups corresponding to the next parade may be assigned to a sub-frame starting either from the $12^{th}$ slot of a sub-frame. However, this is merely exemplary. In another example, the data groups of the next parade may also be sequentially assigned to a different slot within a sub-frame at a cycle period of 4 slots starting from the $3^{rd}$ slot.

Figure 23:
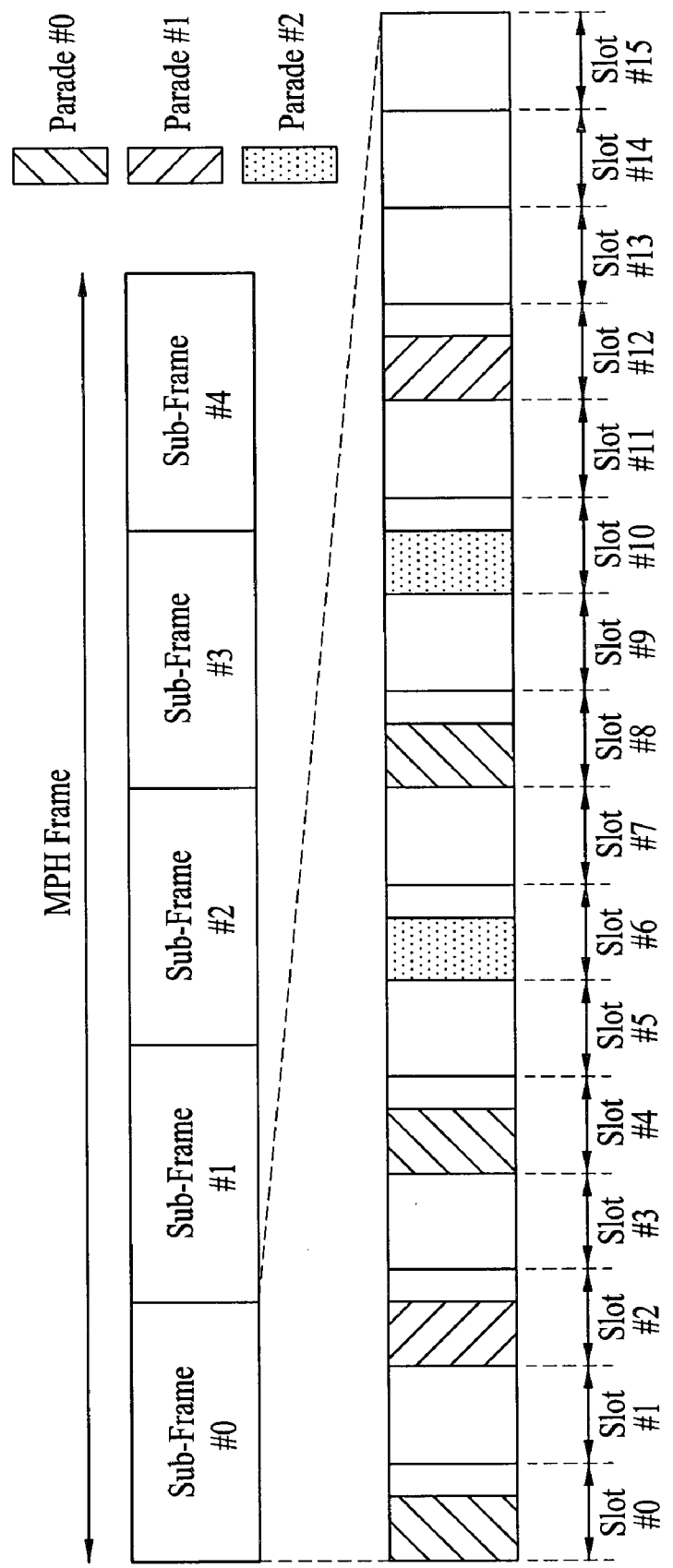
FIG. 23 illustrates an example of transmitting 3 parades to an MPH frame according to the present invention.

FIG. 23 illustrates an example of transmitting 3 parades (Parade #0, Parade #1, and Parade #2) to an MPH frame. More specifically, FIG. 23 illustrates an example of transmitting parades included in one of 5 sub-frames, wherein the 5 sub-frames configure one MPH frame. When the $1^{st}$ parade (Parade #0) includes 3 data groups for each sub-frame, the positions of each data groups within the sub-frames may be obtained by substituting values '0' to '2' for i in Equation 1. More specifically, the data groups of the $1^{st}$ parade (Parade #0) are sequentially assigned to the $1^{st}$, $5^{th}$, and $9^{th}$ slots (Slot #0, Slot #4, and Slot #8) within the sub-frame. Also, when the $2^{nd}$ parade includes 2 data groups for each sub-frame, the positions of each data groups within the sub-frames may be obtained by substituting values '3' and '4' for i in Equation 1. More specifically, the data groups of the $2^{nd}$ parade (Parade #1) are sequentially assigned to the $2^{nd}$ and $12^{th}$ slots (Slot #3 and Slot #11) within the sub-frame. Finally, when the $3^{rd}$ parade includes 2 data groups for each sub-frame, the positions of each data groups within the sub-frames may be obtained by substituting values '5' and '6' for i in Equation 1. More specifically, the data groups of the $3^{rd}$ parade (Parade #2) are sequentially assigned to the $7^{th}$ and $11^{th}$ slots (Slot #6 and Slot #10) within the sub-frame.

As described above, data groups of multiple parades may be assigned to a single MPH frame, and, in each sub-frame, the data groups are serially allocated to a group space having 4 slots from left to right. Therefore, a number of groups of one parade per sub-frame (NOG) may correspond to any one integer from '1' to '8'. Herein, since one MPH frame includes 5 sub-frames, the total number of data groups within a parade that can be allocated to an MPH frame may correspond to any one multiple of '5' ranging from '5' to '40'.

Figure 24:
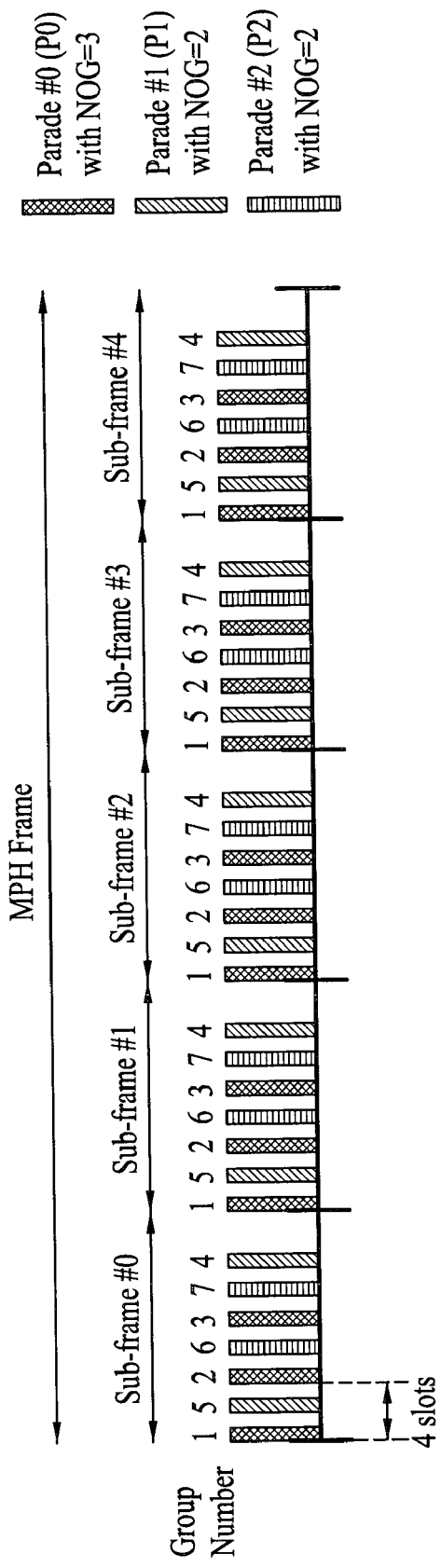
FIG. 24 illustrates an example of expanding the assignment process of 3 parades to 5 sub-frames within an MPH frame.

FIG. 24 illustrates an example of expanding the assignment process of 3 parades, shown in FIG. 23, to 5 sub-frames within an MPH frame.

General Description of the Transmitting System

Figure 25:
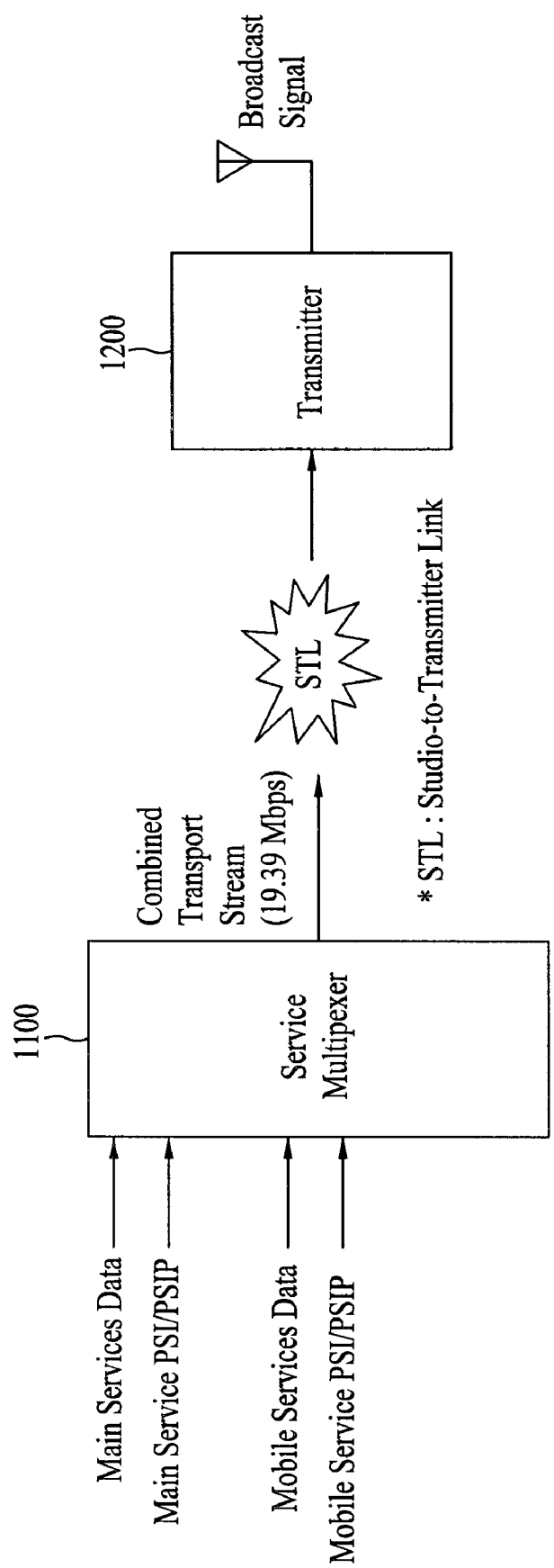
FIG. 25 illustrates a block diagram showing a general structure of a digital broadcast transmitting system according to an embodiment of the present invention.

FIG. 25 illustrates a block diagram showing a general structure of a digital broadcast transmitting system according to an embodiment of the present invention.

Herein, the digital broadcast transmitting includes a service multiplexer 1100 and a transmitter 1200. Herein, the service multiplexer 1100 is located in the studio of each broadcast station, and the transmitter 1200 is located in a site placed at a predetermined distance from the studio. The transmitter 1200 may be located in a plurality of different locations. Also, for example, the plurality of transmitters may share the same frequency. And, in this case, the plurality of transmitters receives the same signal. Accordingly, in the receiving system, a channel equalizer may compensate signal distortion, which is caused by a reflected wave, so as to recover the original signal. In another example, the plurality of transmitters may have different frequencies with respect to the same channel.

The receiving system may become a telematics terminal, a mobile phone, a terminal for receiving mobile broadcast, PDA, and a notebook computer, and so on.

A variety of methods may be used for data communication each of the transmitters, which are located in remote positions, and the service multiplexer. For example, an interface standard such as a synchronous serial interface for transport of MPEG-2 data (SMPTE-310M). In the SMPTE-310M interface standard, a constant data rate is decided as an output data rate of the service multiplexer. For example, in case of the 8VSB mode, the output data rate is 19.39 Mbps, and, in case of the 16VSB mode, the output data rate is 38.78 Mbps. Furthermore, in the conventional 8VSB mode transmitting system, a transport stream (TS) packet having a data rate of approximately 19.39 Mbps may be transmitted through a single physical channel. Also, in the transmitting system according to the present invention provided with backward compatibility with the conventional transmitting system, additional encoding is performed on the mobile broadcast service data. Thereafter, the additionally encoded mobile broadcast service data are multiplexed with the main broadcast service data to a TS packet form, which is then transmitted. At this point, the data rate of the multiplexed TS packet is approximately 19.39 Mbps.

At this point, the service multiplexer 1100 receives at least one type of mobile broadcast service data and program specific information/program and system information protocol (PSI/PSIP) table data for each mobile broadcast service so as to encapsulate the received data to each TS packet. Also, the service multiplexer 1100 receives at least one type of main broadcast service data and PSI/PSIP table data for each main broadcast service and encapsulates the received data to a transport stream (TS) packet. Subsequently, the TS packets are multiplexed according to a predetermined multiplexing rule and outputs the multiplexed packets to the transmitter 1200.

Service Multiplexer

Figure 26:
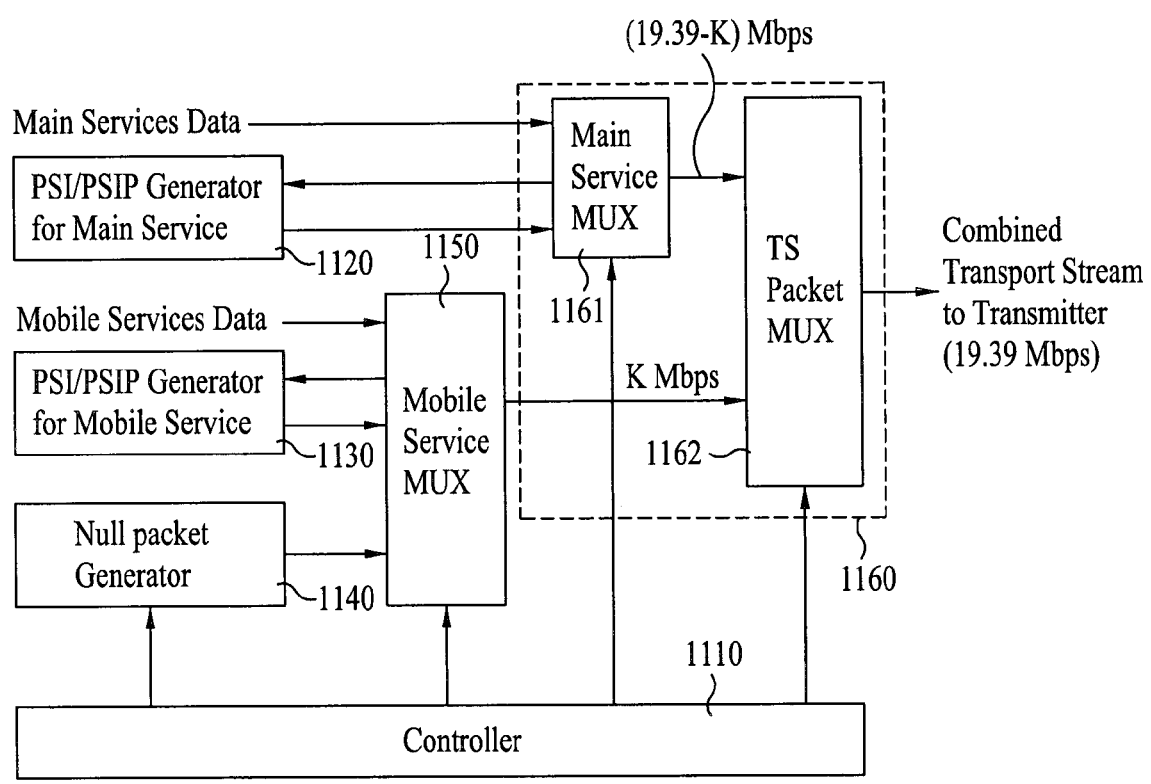
FIG. 26 illustrates a block diagram showing an example of a service multiplexer.

FIG. 26 illustrates a block diagram showing an example of the service multiplexer. The service multiplexer includes a controller 1110 for controlling the overall operations of the service multiplexer, a PSI/PSIP generator 1120 for the main broadcast service, a PSI/PSIP generator 1130 for the mobile broadcast service, a null packet generator 1140, a mobile broadcast service multiplexer 1150, and a transport multiplexer 1160.

The transport multiplexer 1160 may include a main broadcast service multiplexer 1161 and a transport stream (TS) packet multiplexer 1162.

Referring to FIG. 26, at least one type of compression encoded main broadcast service data and the PSI/PSIP table data generated from the PSI/PSIP generator 1120 for the main broadcast service are inputted to the main broadcast service multiplexer 1161 of the transport multiplexer 1160. The main broadcast service multiplexer 1161 encapsulates each of the inputted main broadcast service data and PSI/PSIP table data to MPEG-2 TS packet forms. Then, the MPEG-2 TS packets are multiplexed and outputted to the TS packet multiplexer 1162. Herein, the data packet being outputted from the main broadcast service multiplexer 1161 will be referred to as a main broadcast service data packet for simplicity.

Thereafter, at least one type of the compression encoded mobile broadcast service data and the PSI/PSIP table data generated from the PSI/PSIP generator 1130 for the mobile broadcast service are inputted to the mobile broadcast service multiplexer 1150.

The mobile broadcast service multiplexer 1150 encapsulates each of the inputted mobile broadcast service data and PSI/PSIP table data to MPEG-2 TS packet forms. Then, the MPEG-2 TS packets are multiplexed and outputted to the TS packet multiplexer 1162. Herein, the data packet being outputted from the mobile broadcast service multiplexer 1150 will be referred to as a mobile broadcast service data packet for simplicity.

At this point, the transmitter 1200 requires identification information in order to identify and process the main broadcast service data packet and the mobile broadcast service data packet. Herein, the identification information may use values pre-decided in accordance with an agreement between the transmitting system and the receiving system, or may be configured of a separate set of data, or may modify predetermined location value with in the corresponding data packet.

As an example of the present invention, a different packet identifier (PID) may be assigned to identify each of the main broadcast service data packet and the mobile broadcast service data packet.

In another example, by modifying a synchronization data byte within a header of the mobile broadcast service data, the service data packet may be identified by using the synchronization data byte value of the corresponding service data packet. For example, the synchronization byte of the main broadcast service data packet directly outputs the value decided by the ISO/IEC13818-1 standard (i.e., 0x47) without any modification. The synchronization byte of the mobile broadcast service data packet modifies and outputs the value, thereby identifying the main broadcast service data packet and the mobile broadcast service data packet. Conversely, the synchronization byte of the main broadcast service data packet is modified and outputted, whereas the synchronization byte of the mobile broadcast service data packet is directly outputted without being modified, thereby enabling the main broadcast service data packet and the mobile broadcast service data packet to be identified.

A plurality of methods may be applied in the method of modifying the synchronization byte. For example, each bit of the synchronization byte may be inversed, or only a portion of the synchronization byte may be inversed.

As described above, any type of identification information may be used to identify the main broadcast service data packet and the mobile broadcast service data packet. Therefore, the scope of the present invention is not limited only to the example set forth in the description of the present invention.

Meanwhile, a transport multiplexer used in the conventional digital broadcasting system may be used as the transport multiplexer 1160 according to the present invention. More specifically, in order to multiplex the mobile broadcast service data and the main broadcast service data and to transmit the multiplexed data, the data rate of the main broadcast service is limited to a data rate of (19.39-K) Mbps. Then, K Mbps, which corresponds to the remaining data rate, is assigned as the data rate of the mobile broadcast service. Thus, the transport multiplexer which is already being used may be used as it is without any modification.

Herein, the transport multiplexer 1160 multiplexes the main broadcast service data packet being outputted from the main broadcast service multiplexer 1161 and the mobile broadcast service data packet being outputted from the mobile broadcast service multiplexer 1150. Thereafter, the transport multiplexer 1160 transmits the multiplexed data packets to the transmitter 1200.

However, in some cases, the output data rate of the mobile broadcast service multiplexer 1150 may not be equal to K Mbps. In this case, the mobile broadcast service multiplexer 1150 multiplexes and outputs null data packets generated from the null packet generator 1140 so that the output data rate can reach K Mbps. More specifically, in order to match the output data rate of the mobile broadcast service multiplexer 1150 to a constant data rate, the null packet generator 1140 generates null data packets, which are then outputted to the mobile broadcast service multiplexer 1150.

For example, when the service multiplexer 1100 assigns K Mbps of the 19.39 Mbps to the mobile broadcast service data, and when the remaining (19.39-K) Mbps is, therefore, assigned to the main broadcast service data, the data rate of the mobile broadcast service data that are multiplexed by the service multiplexer 1100 actually becomes lower than K Mbps. This is because, in case of the mobile broadcast service data, the pre-processor of the transmitting system performs additional encoding, thereby increasing the amount of data. Eventually, the data rate of the mobile broadcast service data, which may be transmitted from the service multiplexer 1100, becomes smaller than K Mbps.

For example, since the pre-processor of the transmitter performs an encoding process on the mobile broadcast service data at a coding rate of at least 1/2, the amount of the data outputted from the pre-processor is increased to more than twice the amount of the data initially inputted to the pre-processor. Therefore, the sum of the data rate of the main broadcast service data and the data rate of the mobile broadcast service data, both being multiplexed by the service multiplexer 1100, becomes either equal to or smaller than 19.39 Mbps.

Therefore, in order to match the data rate of the data that are finally outputted from the service multiplexer 1100 to a constant data rate (e.g., 19.39 Mbps), an amount of null data packets corresponding to the amount of lacking data rate is generated from the null packet generator 1140 and outputted to the mobile broadcast service multiplexer 1150.

Accordingly, the mobile broadcast service multiplexer 1150 encapsulates each of the mobile broadcast service data and the PSI/PSIP table data that are being inputted to a MPEG-2 TS packet form. Then, the above-described TS packets are multiplexed with the null data packets and, then, outputted to the TS packet multiplexer 1162.

Thereafter, the TS packet multiplexer 1162 multiplexes the main broadcast service data packet being outputted from the main broadcast service multiplexer 1161 and the mobile broadcast service data packet being outputted from the mobile broadcast service multiplexer 1150 and transmits the multiplexed data packets to the transmitter 1200 at a data rate of 19.39 Mbps.

According to an embodiment of the present invention, the mobile broadcast service multiplexer 1150 receives the null data packets. However, this is merely exemplary and does not limit the scope of the present invention. In other words, according to another embodiment of the present invention, the TS packet multiplexer 1162 may receive the null data packets, so as to match the data rate of the finally outputted data to a constant data rate. Herein, the output path and multiplexing rule of the null data packet is controlled by the controller 1110. The controller 1110 controls the multiplexing processed performed by the mobile broadcast service multiplexer 1150, the main broadcast service multiplexer 1161 of the transport multiplexer 1160, and the TS packet multiplexer 1162, and also controls the null data packet generation of the null packet generator 1140. At this point, the transmitter 1200 discards the null data packets transmitted from the service multiplexer 1100 instead of transmitting the null data packets.

Further, in order to allow the transmitter 1200 to discard the null data packets transmitted from the service multiplexer 1100 instead of transmitting them, identification information for identifying the null data packet is required. Herein, the identification information may use values pre-decided in accordance with an agreement between the transmitting system and the receiving system. For example, the value of the synchronization byte within the header of the null data packet may be modified so as to be used as the identification information. Alternatively, a transport_error_indicator flag may also be used as the identification information.

In the description of the present invention, an example of using the transport_error_indicator flag as the identification information will be given to describe an embodiment of the present invention. In this case, the transport_error_indicator flag of the null data packet is set to '1', and the transport_error_indicator flag of the remaining data packets are reset to '0', so as to identify the null data packet. More specifically, when the null packet generator 1140 generates the null data packets, if the transport_error_indicator flag from the header field of the null data packet is set to '1' and then transmitted, the null data packet may be identified and, therefore, be discarded. In the present invention, any type of identification information for identifying the null data packets may be used. Therefore, the scope of the present invention is not limited only to the examples set forth in the description of the present invention.

According to another embodiment of the present invention, a transmission parameter may be included in at least a portion of the null data packet, or at least one table or an operations and maintenance (OM) packet (or OMP) of the PSI/PSIP table for the mobile broadcast service. In this case, the transmitter 1200 extracts the transmission parameter and outputs the extracted transmission parameter to the corresponding block and also transmits the extracted parameter to the receiving system if required. More specifically, a packet referred to as an OMP is defined for the purpose of operating and managing the transmitting system. For example, the OMP is configured in accordance with the MPEG-2 TS packet format, and the corresponding PID is given the value of 0x1FFA. The OMP is configured of a 4-byte header and a 184-byte payload. Herein, among the 184 bytes, the first byte corresponds to an OM_type field, which indicates the type of the OM packet.

In the present invention, the transmission parameter may be transmitted in the form of an OMP. And, in this case, among the values of the reserved fields within the OM_type field, a pre-arranged value is used, thereby indicating that the transmission parameter is being transmitted to the transmitter 1200 in the form of an OMP. More specifically, the transmitter 1200 may find (or identify) the OMP by referring to the PID. Also, by parsing the OM_type field within the OMP, the transmitter 1200 can verify whether a transmission parameter is included after the OM_type field of the corresponding packet. The transmission parameter corresponds to supplemental data required for processing mobile broadcast service data from the transmitting system and the receiving system.

The transmission parameter corresponds to supplemental data required for processing mobile broadcast service data from the transmitting system and the receiving system. Herein, the transmission parameter may include data group information, region information within the data group, block information, RS frame information, super frame information, MPH frame information, parade information, ensemble information, information associated with serial concatenated convolution code (SCCC), and RS code information. The significance of some information within the transmission parameters has already been described in detail. Descriptions of other information that have not yet been described will be in detail in a later process.

The transmission parameter may also include information on how signals of a symbol domain are encoded in order to transmit the mobile broadcast service data, and multiplexing information on how the main broadcast service data and the mobile broadcast service data or various types of mobile broadcast service data are multiplexed.

The information included in the transmission parameter are merely exemplary to facilitate the understanding of the present invention. And, the adding and deleting of the information included in the transmission parameter may be easily modified and changed by anyone skilled in the art. Therefore, the present invention is not limited to the examples proposed in the description set forth herein.

Furthermore, the transmission parameters may be provided from the service multiplexer 1100 to the transmitter 1200. Alternatively, the transmission parameters may also be set up by an internal controller (not shown) within the transmitter 1200 or received from an external source.

Transmitter

Figure 27:
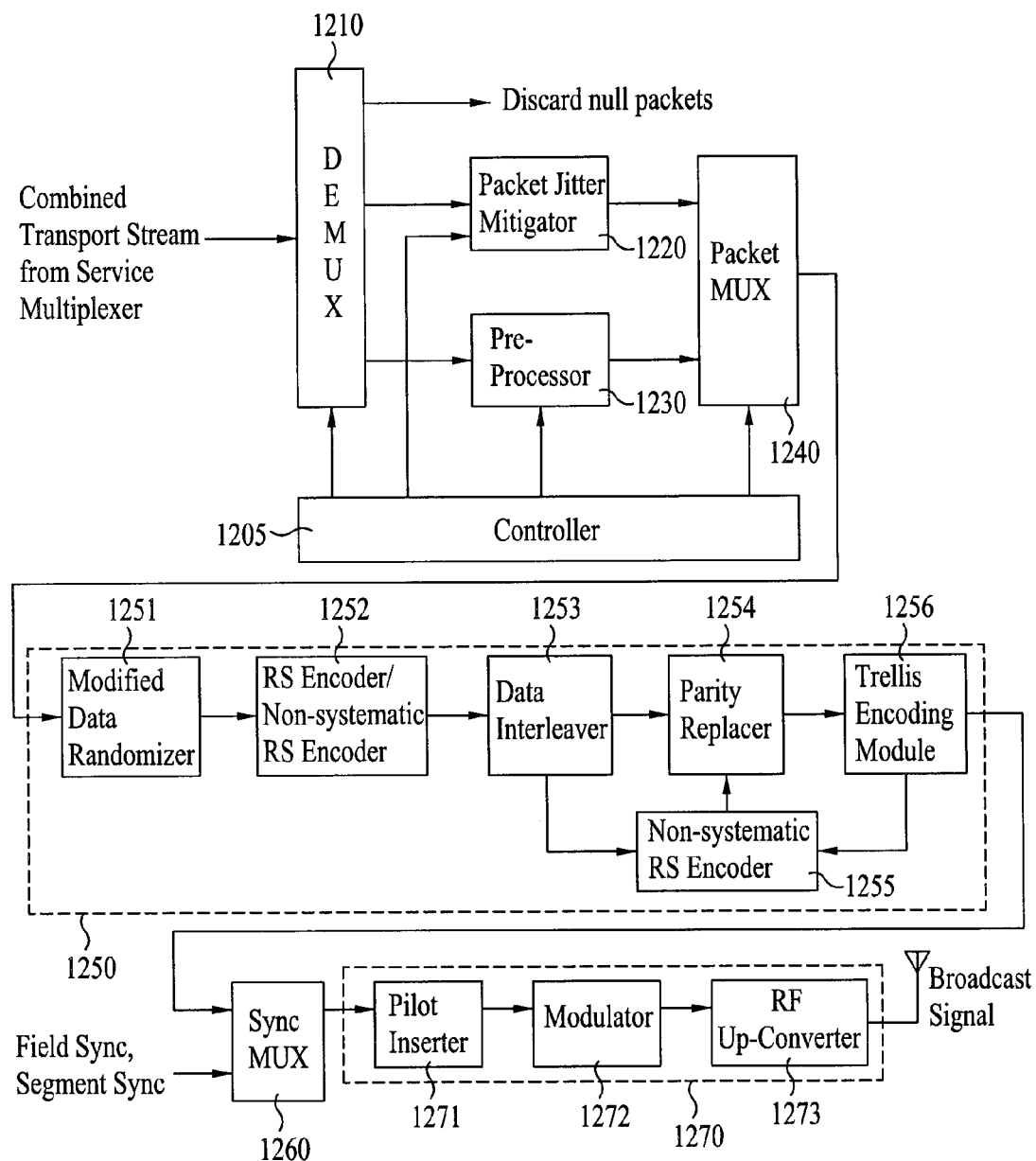
FIG. 27 illustrates a block diagram showing an example of a transmitter according to an embodiment of the present invention.

FIG. 27 illustrates a block diagram showing an example of the transmitter 1200 according to an embodiment of the present invention. Herein, the transmitter 1200 includes a controller 1205, a demultiplexer 1210, a packet jitter mitigator 1220, a pre-processor 1230, a packet multiplexer 1240, a post-processor 1250, a synchronization (sync) multiplexer 1260, and a transmission unit 1270. Herein, when a data packet is received from the service multiplexer 1100, the demultiplexer 1210 should identify whether the received data packet corresponds to a main broadcast service data packet, a mobile broadcast service data packet, or a null data packet. For example, the demultiplexer 1210 uses the PID within the received data packet so as to identify the main broadcast service data packet and the mobile broadcast service data packet. Then, the demultiplexer 1210 uses a transport_error_indicator field to identify the null data packet. The main broadcast service data packet identified by the demultiplexer 1210 is outputted to the packet jitter mitigator 1220, the mobile broadcast service data packet is outputted to the pre-processor 1230, and the null data packet is discarded. If a transmission parameter is included in the null data packet, then the transmission parameter is first extracted and outputted to the corresponding block. Thereafter, the null data packet is discarded.

The pre-processor 1230 performs an additional encoding process of the mobile broadcast service data included in the service data packet, which is demultiplexed and outputted from the demultiplexer 1210. The pre-processor 1230 also performs a process of configuring a data group so that the data group may be positioned at a specific place in accordance with the purpose of the data, which are to be transmitted on a transmission frame. This is to enable the mobile broadcast service data to respond swiftly and strongly against noise and channel changes. The pre-processor 1230 may also refer to the transmission parameter when performing the additional encoding process. Also, the pre-processor 1230 groups a plurality of mobile broadcast service data packets to configure a data group. Thereafter, known data, mobile broadcast service data, RS parity data, and MPEG header are allocated to pre-determined regions within the data group.

Pre-Processor within Transmitter

Figure 28:
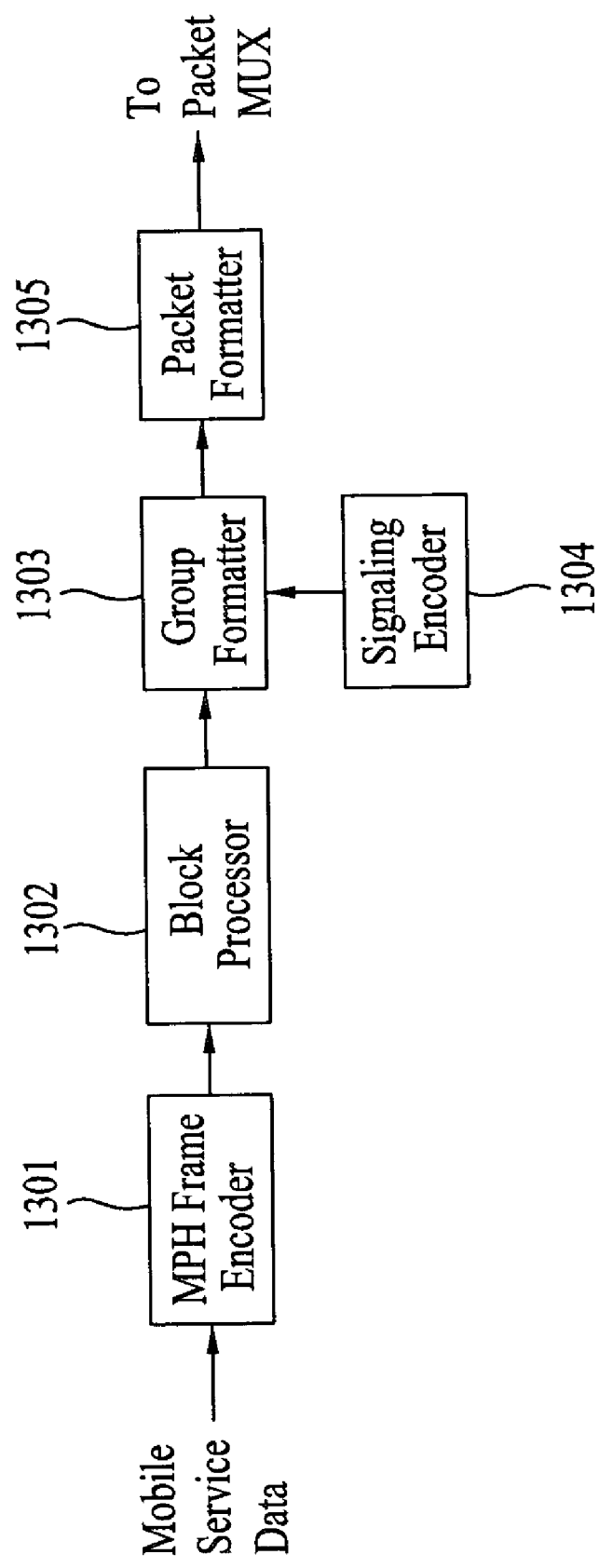
FIG. 28 illustrates a block diagram showing an example of a pre-processor according to the present invention.

FIG. 28 illustrates a block diagram showing the structure of a pre-processor 1230 according to the present invention. Herein, the pre-processor 1230 includes an MPH frame encoder 1301, a block processor 1302, a group formatter 1303, a signaling encoder 1304, and a packet encoder 1304. The MPH frame encoder 1301, which is included in the pre-processor 1230 having the above-described structure, data-randomizes the mobile broadcast service data that are inputted to the demultiplexer 1210, thereby creating a RS frame. Then, the MPH frame encoder 1301 performs an encoding process for error correction in RS frame units. The MPH frame encoder 1301 may include at least one RS frame encoder. More specifically, RS frame encoders may be provided in parallel, wherein the number of RS frame encoders is equal to the number of parades within the MPH frame. As described above, the MPH frame is a basic time cycle period for transmitting at least one parade. Also, each parade consists of one or two RS frames.

Figure 29:
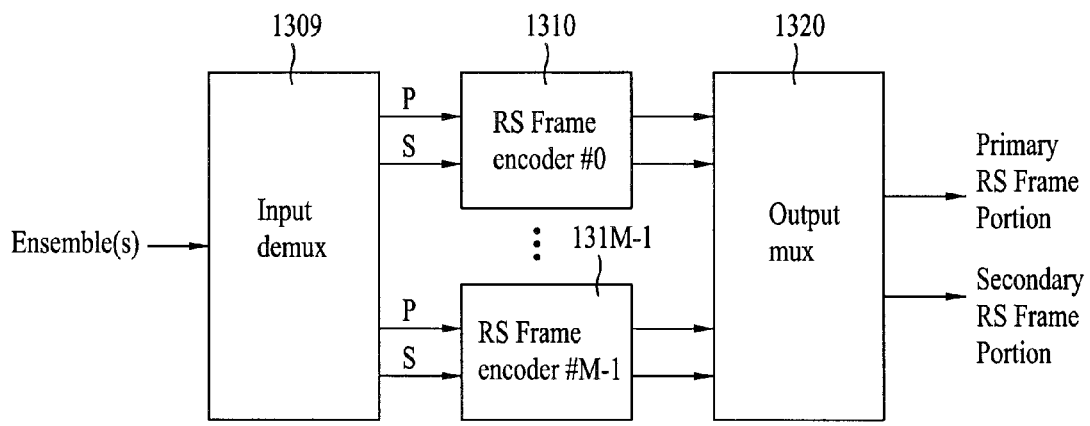
FIG. 29 illustrates a conceptual block diagram of the MPH frame encoder according to an embodiment of the present invention.

FIG. 29 illustrates a conceptual block diagram of the MPH frame encoder 1301 according to an embodiment of the present invention. The MPH frame encoder 1301 includes an input demultiplexer (DEMUX) 1309, M number of RS frame encoders 1310 to 131M-1, and an output multiplexer (MUX) 1320. Herein, M represent the number of parades included in one MPH frame. The input demultiplexer (DEMUX) 1309 splits input ensembles. Then, the split input ensembles decide the RS frame to which the ensembles are to be inputted. Thereafter, the inputted ensembles are outputted to the respective RS frame. At this point, an ensemble may be mapped to each RS frame encoder or parade. For example, when one parade configures one RS frame, the ensembles, RS frames, and parades may each be mapped to be in a one-to-one (1:1) correspondence with one another. More specifically, the data in one ensemble configure a RS frame. And, a RS frame is divided into a plurality of data groups. Based upon the RS frame mode of Table 1, the data within one RS frame may be assigned either to all of regions A/B/C/D within multiple data groups, or to at least one of regions A/B and regions C/D within multiple data groups.

When the RS frame mode value is equal to '01', i.e., when the data of the primary RS frame are assigned to regions A/B of the corresponding data group and data of the secondary RS frame are assigned to regions C/D of the corresponding data group, each RS frame encoder creates a primary RS frame and a secondary RS frame for each parade. Conversely, when the RS frame mode value is equal to '00', when the data of the primary RS frame are assigned to all of regions A/B/C/D, each RS frame encoder creates a RS frame (i.e., a primary RS frame) for each parade. Also, each RS frame encoder divides each RS frame into several portions. Each portion of the RS frame is equivalent to a data amount that can be transmitted by a data group.

The output multiplexer (MUX) 1320 multiplexes portions within M number of RS frame encoders 1310 to 131M-1 are multiplexed and then outputted to the block processor 1302. For example, if one parade transmits two RS frames, portions of primary RS frames within M number of RS frame encoders 1310 to 131M-1 are multiplexed and outputted. Thereafter, portions of secondary RS frames within M number of RS frame encoders 1310 to 131M-1 are multiplexed and transmitted. The input demultiplexer (DEMUX) 1309 and the output multiplexer (MUX) 1320 operate based upon the control of the control unit 1205. The control unit 1205 may provide necessary (or required) FEC modes to each RS frame encoder. The FEC mode includes the RS code mode, which will be described in detail in a later process.

Figure 30:
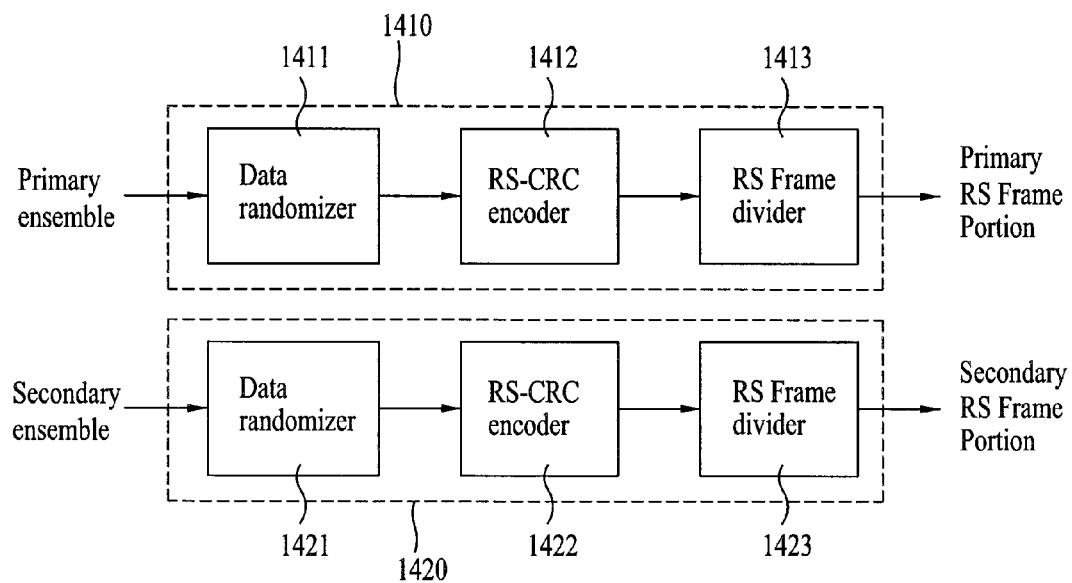
FIG. 30 illustrates a detailed block diagram of an RS frame encoder among a plurality of RS frame encoders within an MPH frame encoder.

FIG. 30 illustrates a detailed block diagram of an RS frame encoder among a plurality of RS frame encoders within an MPH frame encoder. One RS frame encoder may include a primary encoder 410 and a secondary encoder 1420. Herein, the secondary encoder 1420 may or may not operate based upon the RS frame mode. For example, when the RS frame mode value is equal to '00', as shown in Table 1, the secondary encoder 1420 does not operate. The primary encoder 1410 may include a data randomizer 1411, a Reed-Solomon-cyclic redundancy check (RS-CRC) encoder 1412, and a RS frame divider 1413. And, the secondary encoder 1420 may also include a data randomizer 1421, a RS-CRC encoder 1422, and a RS frame divider 1423.

More specifically, the data randomizer 1411 of the primary encoder 1410 receives mobile broadcast service data of a primary ensemble outputted from the output demultiplexer (DEMUX) 1309. Then, after randomizing the received mobile broadcast service data, the data randomizer 1411 outputs the randomized data to the RS-CRC encoder 1412. At this point, since the data randomizer 1411 performs the randomizing process on the mobile broadcast service data, the randomizing process that is to be performed by the data randomizer 1251 of the post-processor 1250 on the mobile broadcast service data may be omitted. The data randomizer 1411 may also discard the synchronization byte within the mobile broadcast service data packet and perform the randomizing process. This is an option that may be chosen by the system designer. In the example given in the present invention, the randomizing process is performed without discarding the synchronization byte within the corresponding mobile broadcast service data packet.

The RS-CRC encoder 1412 uses at least one of a Reed-Solomon (RS) code and a cyclic redundancy check (CRC) code, so as to perform forward error collection (FEC) encoding on the randomized primary ensemble, thereby forming a primary RS frame. Therefore, the RS-CRC encoder 1412 outputs the newly formed primary RS frame to the RS frame divider 1413. The RS-CRC encoder 1412 groups a plurality of mobile broadcast service data packets that is randomized and inputted, so as to create a RS frame. Then, the RS-CRC encoder 1412 performs at least one of an error correction encoding process and an error detection encoding process in RS frame units. Accordingly, robustness may be provided to the mobile broadcast service data, thereby scattering group error that may occur during changes in a frequency environment, thereby enabling the mobile broadcast service data to respond to the frequency environment, which is extremely vulnerable and liable to frequent changes. Also, the RS-CRC encoder 1412 groups a plurality of RS frame so as to create a super frame, thereby performing a row permutation process in super frame units. The row permutation process may also be referred to as a "row interleaving process". Hereinafter, the process will be referred to as "row permutation" for simplicity.

More specifically, when the RS-CRC encoder 1412 performs the process of permuting each row of the super frame in accordance with a pre-determined rule, the position of the rows within the super frame before and after the row permutation process is changed. If the row permutation process is performed by super frame units, and even though the section having a plurality of errors occurring therein becomes very long, and even though the number of errors included in the RS frame, which is to be decoded, exceeds the extent of being able to be corrected, the errors become dispersed within the entire super frame. Thus, the decoding ability is even more enhanced as compared to a single RS frame.

At this point, as an example of the present invention, RS-encoding is applied for the error correction encoding process, and a cyclic redundancy check (CRC) encoding is applied for the error detection process in the RS-CRC encoder 1412. When performing the RS-encoding, parity data that are used for the error correction are generated. And, when performing the CRC encoding, CRC data that are used for the error detection are generated. The CRC data generated by CRC encoding may be used for indicating whether or not the mobile broadcast service data have been damaged by the errors while being transmitted through the channel. In the present invention, a variety of error detection coding methods other than the CRC encoding method may be used, or the error correction coding method may be used to enhance the overall error correction ability of the receiving system. Herein, the RS-CRC encoder 1412 refers to a pre-determined transmission parameter provided by the control unit 1205 and/or a transmission parameter provided from the service multiplexer 1100 so as to perform operations including RS frame configuration, RS encoding, CRC encoding, super frame configuration, and row permutation in super frame units.

FIG. 31 illustrates a process of one or two RS frame being divided into several portions, based upon an RS frame mode value, and a process of each portion being assigned to a corresponding region within the respective data group. More specifically, FIG. 31(*a*) shows an example of the RS frame mode value being equal to '00'. Herein, only the primary encoder 1410 of FIG. 30 operates, thereby forming one RS frame for one parade. Then, the RS frame is divided into several portions, and the data of each portion are assigned to regions A/B/C/D within the respective data group. FIG. 31(*b*) shows an example of the RS frame mode value being equal to '01'. Herein, both the primary encoder 1410 and the secondary encoder 1420 of FIG. 30 operate, thereby forming two RS frames for one parade, i.e., one primary RS frame and one secondary RS frame. Then, the primary RS frame is divided into several portions, and the secondary RS frame is divided into several portions. At this point, the data of each portion of the primary RS frame are assigned to regions A/B within the respective data group. And, the data of each portion of the secondary RS frame are assigned to regions C/D within the respective data group.

Detailed Description of the RS Frame

Figure 32:
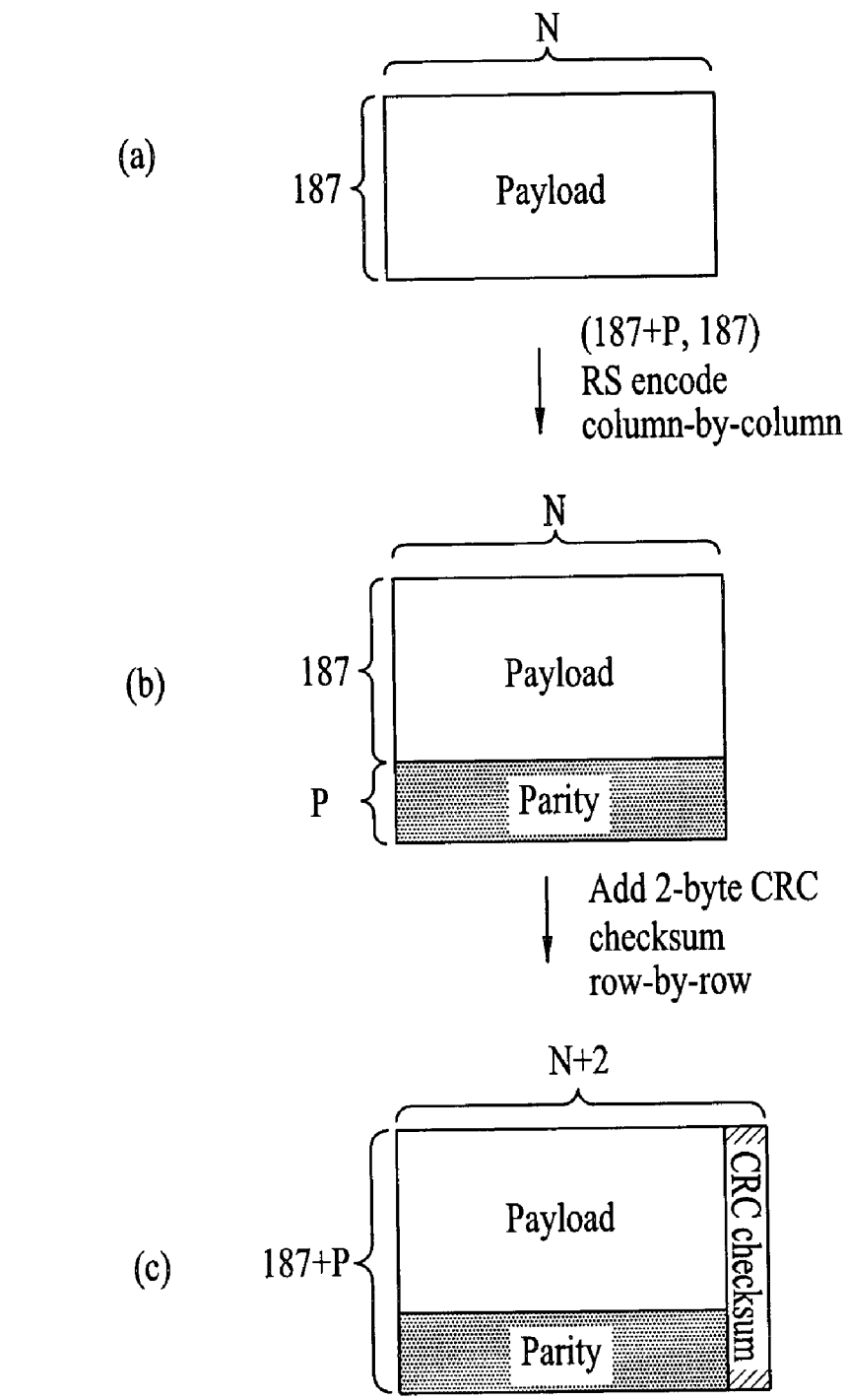
FIG. 32($a$) to FIG. 32($c$) illustrate error correction encoding and error detection encoding processes according to an embodiment of the present invention.

FIG. 32(*a*) illustrates an example of an RS frame being generated from the RS-CRC encoder 1412 according to the present invention. According to this embodiment, in the RS frame, the length of a column (i.e., number of rows) is set to 187 bytes, and the length of a row (i.e., number of column) is set to N bytes. At this point, the value of N, which corresponds to the number of columns within an RS frame, can be decided according to Equation 2.

$$N = \left\lfloor \frac{5 \times NoG \times PL}{187 + P} \right\rfloor - 2 \qquad \text{Equation 2}$$

Herein, NoG indicates the number of data groups assigned to a sub-frame. PL represents the number of SCCC payload data bytes assigned to a data group. And, P signifies the number of RS parity data bytes added to each column of the RS frame. Finally, $\lfloor X \rfloor$ is the greatest integer that is equal to or smaller than X.

More specifically, in Equation 2, PL corresponds to the length of an RS frame portion. The value of PL is equivalent to the number of SCCC payload data bytes that are assigned to the corresponding data group. Herein, the value of PL may vary depending upon the RS frame mode, SCCC block mode, and SCCC outer code mode. Table 2 to Table 5 below respectively show examples of PL values, which vary in accordance with the RS frame mode, SCCC block mode, and SCCC outer code mode. The SCCC block mode and the SCCC outer code mode will be described in detail in a later process.

TABLE 2

| SCCC outer code mode | | | | |
|---|---|---|---|---|
| for Region A | for Region B | for Region C | for Region D | PL |
| 00 | 00 | 00 | 00 | 9624 |
| 00 | 00 | 00 | 01 | 9372 |
| 00 | 00 | 01 | 00 | 8886 |
| 00 | 00 | 01 | 01 | 8634 |
| 00 | 01 | 00 | 00 | 8403 |
| 00 | 01 | 00 | 01 | 8151 |
| 00 | 01 | 01 | 00 | 7665 |
| 00 | 01 | 01 | 01 | 7413 |
| 01 | 00 | 00 | 00 | 7023 |
| 01 | 00 | 00 | 01 | 6771 |
| 01 | 00 | 01 | 00 | 6285 |
| 01 | 00 | 01 | 01 | 6033 |
| 01 | 01 | 00 | 00 | 5802 |
| 01 | 01 | 00 | 01 | 5550 |
| 01 | 01 | 01 | 00 | 5064 |
| 01 | 01 | 01 | 01 | 4812 |
| Others | | | | Reserved |

Table 2 shows an example of the PL values for each data group within an RS frame, wherein each PL value varies depending upon the SCCC outer code mode, when the RS frame mode value is equal to '00', and when the SCCC block mode value is equal to '00'. For example, when it is assumed that each SCCC outer code mode value of regions A/B/C/D within the data group is equal to '00' (i.e., the block processor 1302 of a later block performs encoding at a coding rate of 1/2), the PL value within each data group of the corresponding RS frame may be equal to 9624 bytes. More specifically, 9624 bytes of mobile broadcast service data within one RS frame may be assigned to regions A/B/C/D of the corresponding data group.

TABLE 3

| SCCC outer code mode | PL |
|---|---|
| 00 | 9624 |
| 01 | 4812 |
| Others | Reserved |

Table 3 shows an example of the PL values for each data group within an RS frame, wherein each PL value varies depending upon the SCCC outer code mode, when the RS frame mode value is equal to '00', and when the SCCC block mode value is equal to '01'.

TABLE 4

| SCCC outer code mode | | PL |
|---|---|---|
| for Region A | for Region B | |
| 00 | 00 | 7644 |
| 00 | 01 | 6423 |
| 01 | 00 | 5043 |
| 01 | 01 | 3822 |
| Others | | Reserved |

Table 4 shows an example of the PL values for each data group within a primary RS frame, wherein each PL value varies depending upon the SCCC outer code mode, when the RS frame mode value is equal to '01', and when the SCCC block mode value is equal to '00'. For example, when each SCCC outer code mode value of regions A/B is equal to '00', 7644 bytes of mobile broadcast service data within a primary RS frame may be assigned to regions A/B of the corresponding data group.

TABLE 5

| SCCC outer code mode | | |
|---|---|---|
| for Region C | for Region D | PL |
| 00 | 00 | 1980 |
| 00 | 01 | 1728 |
| 01 | 00 | 1242 |
| 01 | 01 | 990 |
| Others | | Reserved |

Table 5 shows an example of the PL values for each data group within a secondary RS frame, wherein each PL value varies depending upon the SCCC outer code mode, when the RS frame mode value is equal to '01', and when the SCCC block mode value is equal to '00'. For example, when each SCCC outer code mode value of regions C/D is equal to '00', 1980 bytes of mobile broadcast service data within a secondary RS frame may be assigned to regions C/D of the corresponding data group.

According to the embodiment of the present invention, the value of N is equal to or greater than 187 (i.e., N≧187). More specifically, the RS frame of FIG. 32(a) has the size of N(row)×187(column) bytes. More specifically, the RS-CRC encoder 1412 first divides the inputted mobile broadcast service data bytes to units of a predetermined length. The predetermined length is decided by the system designer. And, in the example of the present invention, the predetermined length is equal to 187 bytes, and, therefore, the 187-byte unit will be referred to as a "packet" for simplicity. For example, the inputted mobile broadcast service data may correspond either to an MPEG transport stream (TS) packet configured of 188-byte units or to an IP datagram. Alternatively, the IP datagram may be encapsulated to a TS packet of 188-byte units and, then, inputted.

When the mobile broadcast service data that are being inputted correspond to a MPEG transport packet stream configured of 188-byte units, the first synchronization byte is removed so as to configure a 187-byte unit. Then, N number of packets are grouped to form an RS frame. Herein, the synchronization byte is removed because each mobile broadcast service data packet has the same value. Meanwhile, when the input mobile broadcast service data of the RS frame do not correspond to the MPEG TS packet format, the mobile broadcast service data are inputted N number of times in 187-byte units without being processed with the removing of the MPEG synchronization byte, thereby creating a RS frame.

In addition, when the input data format of the RS frame supports both the input data corresponding to the MPEG TS packet and the input data not corresponding to the MPEG TS packet, such information may be included in a transmission parameter transmitted from the service multiplexer 1100, thereby being sent to the transmitter 1200. Accordingly, the RS-CRC encoder 1412 of the transmitter 1200 receives this information to be able to control whether or not to perform the process of removing the MPEG synchronization byte. Also, the transmitter provides such information to the receiving system so as to control the process of inserting the MPEG synchronization byte that is to be performed by the RS frame decoder of the receiving system. Herein, the process of removing the synchronization byte may be performed during a randomizing process of the data randomizer 1411 in an earlier process. In this case, the process of the removing the synchronization byte by the RS-CRC encoder 1412 may be omitted.

Moreover, when adding synchronization bytes from the receiving system, the process may be performed by the data derandomizer instead of the RS frame decoder. Therefore, if a removable fixed byte (e.g., synchronization byte) does not exist within the mobile broadcast service data packet that is being inputted to the RS-CRC encoder 1412, or if the mobile broadcast service data that are being inputted are not configured in a packet format, the mobile broadcast service data that are being inputted are divided into 187-byte units, thereby configuring a packet for each 187-byte unit.

Subsequently, N number of packets configured of 187 bytes is grouped to configure a RS frame. At this point, the RS frame is configured as a RS frame having the size of N(row)× 187(column) bytes, in which 187-byte packets are sequentially inputted in a row direction. More specifically, each of the N number of columns included in the RS frame includes 187 bytes. When the RS frame is created, as shown in FIG. 32(a), the RS-CRC encoder 1412 performs a (Nc,Kc)-RS encoding process on each column, so as to generate Nc−Kc (=P) number of parity bytes. Then, the RS-CRC encoder 1412 adds the newly generated P number of parity bytes after the very last byte of the corresponding column, thereby creating a column of (187+P) bytes. Herein, as shown in FIG. 32(a), Kc is equal to 187 (i.e., Kc=187), and Nc is equal to 187+P (i.e., Nc=187+P). Herein, the value of P may vary depending upon the RS code mode. Table 6 below shows an example of an RS code mode, as one of the RS encoding information.

TABLE 6

| RS code mode | RS code | Number of Parity Bytes (P) |
|---|---|---|
| 00 | (211, 187) | 24 |
| 01 | (223, 187) | 36 |
| 10 | (235, 187) | 48 |
| 11 | Reserved | Reserved |

Table 6 shows an example of 2 bits being assigned in order to indicate the RS code mode. The RS code mode represents the number of parity bytes corresponding to the RS frame. For example, when the RS code mode value is equal to '10', (235, 187)-RS-encoding is performed on the RS frame of FIG. 32(a), so as to generate 48 parity data bytes. Thereafter, the 48 parity bytes are added after the last data byte of the corresponding column, thereby creating a column of 235 data bytes. When the RS frame mode value is equal to '00' in Table 1 (i.e., when the RS frame mode indicates a single RS frame), only the RS code mode of the corresponding RS frame is indicated. However, when the RS frame mode value is equal to '01' in Table 1 (i.e., when the RS frame mode indicates multiple RS frames), the RS code mode corresponding to a primary RS frame and a secondary RS frame. More specifically, it is preferable that the RS code mode is independently applied to the primary RS frame and the secondary RS frame.

When such RS encoding process is performed on all N number of columns, a RS frame having the size of N(row)× (187+P)(column) bytes may be created, as shown in FIG. 32(b). Each row of the RS frame is configured of N bytes. However, depending upon channel conditions between the transmitting system and the receiving system, error may be included in the RS frame. When errors occur as described above, CRC data (or CRC code or CRC checksum) may be used on each row unit in order to verify whether error exists in each row unit. The RS-CRC encoder 1412 may perform CRC encoding on the mobile broadcast service data being RS encoded so as to create (or generate) the CRC data. The CRC data being generated by CRC encoding may be used to indicate whether the mobile broadcast service data have been damaged while being transmitted through the channel.

The present invention may also use different error detection encoding methods other than the CRC encoding method. Alternatively, the present invention may use the error correction encoding method to enhance the overall error correction ability of the receiving system. FIG. 32(*c*) illustrates an example of using a 2-byte (i.e., 16-bit) CRC checksum as the CRC data. Herein, a 2-byte CRC checksum is generated for N number of bytes of each row, thereby adding the 2-byte CRC checksum at the end of the N number of bytes. Thus, each row is expanded to (N+2) number of bytes. Equation 3 below corresponds to an exemplary equation for generating a 2-byte CRC checksum for each row being configured of N number of bytes.

$$g(x)=x^{16}+x^{12}+x^5+1 \qquad \text{Equation 3}$$

The process of adding a 2-byte checksum in each row is only exemplary. Therefore, the present invention is not limited only to the example proposed in the description set forth herein. As described above, when the process of RS encoding and CRC encoding are completed, the (N×187)-byte RS frame is expanded to a (N+2)×(187+P)-byte RS frame. Based upon an error correction scenario of a RS frame expanded as described above, the data bytes within the RS frame are transmitted through a channel in a row direction. At this point, when a large number of errors occur during a limited period of transmission time, errors also occur in a row direction within the RS frame being processed with a decoding process in the receiving system. However, in the perspective of RS encoding performed in a column direction, the errors are shown as being scattered. Therefore, error correction may be performed more effectively. At this point, a method of increasing the number of parity data bytes (P) may be used in order to perform a more intense error correction process. However, using this method may lead to a decrease in transmission efficiency. Therefore, a mutually advantageous method is required. Furthermore, when performing the decoding process, an erasure decoding process may be used to enhance the error correction performance.

Figure 33:
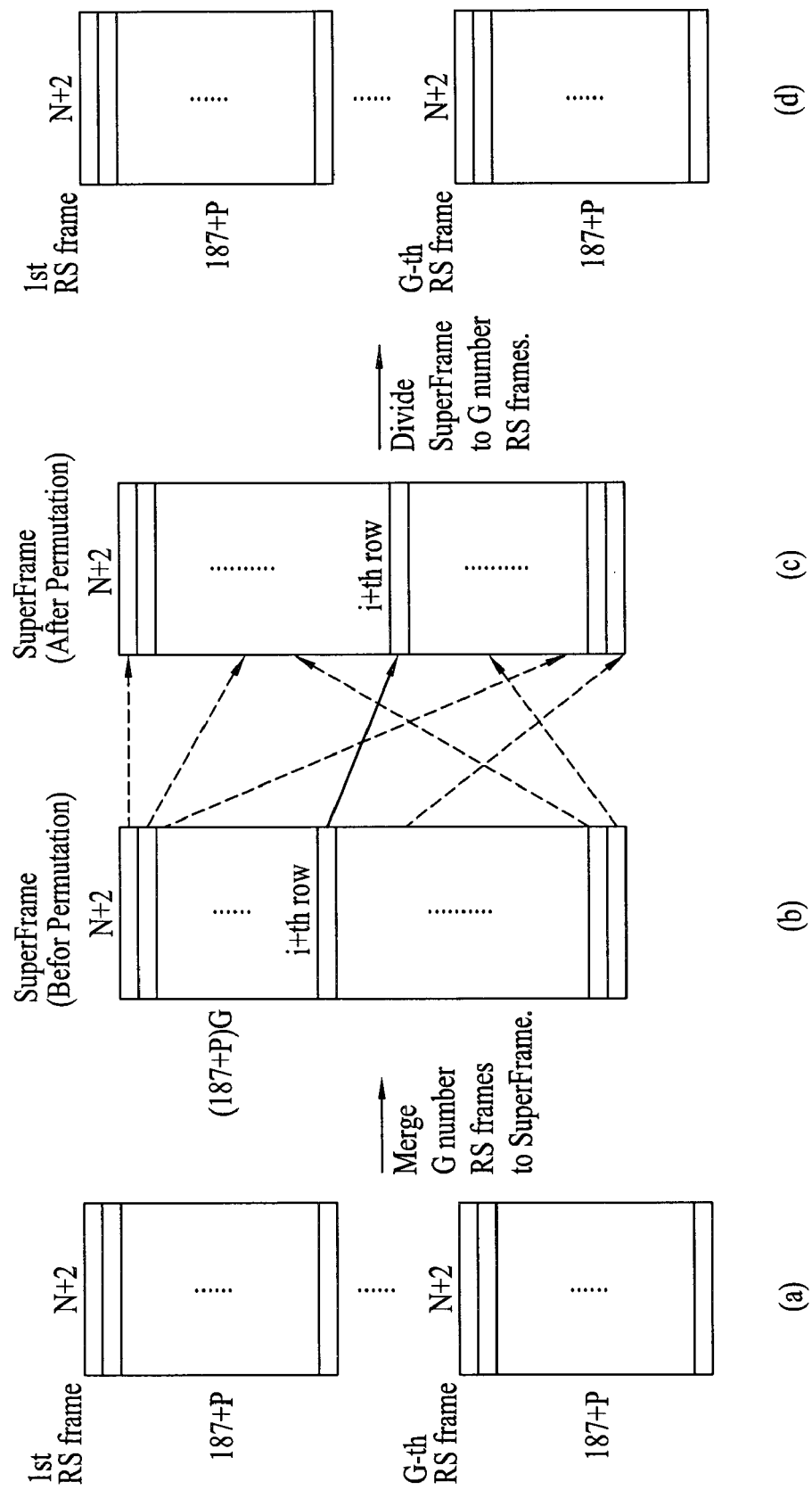
FIG. 33 illustrates an example of performing a row permutation (or interleaving) process in super frame units according to the present invention.

Additionally, the RS-CRC encoder 1412 according to the present invention also performs a row permutation (or interleaving) process in super frame units in order to further enhance the error correction performance when error correction the RS frame. FIG. 33(*a*) to FIG. 33(*d*) illustrates an example of performing a row permutation process in super frame units according to the present invention. More specifically, G number of RS frames RS-CRC-encoded is grouped to form a super frame, as shown in FIG. 33(*a*). At this point, since each RS frame is formed of (N+2)×(187+P) number of bytes, one super frame is configured to have the size of (N+2)×(187+P)×G bytes.

When a row permutation process permuting each row of the super frame configured as described above is performed based upon a pre-determined permutation rule, the positions of the rows prior to and after being permuted (or interleaved) within the super frame may be altered. More specifically, the i$^{th}$ row of the super frame prior to the interleaving process, as shown in FIG. 33(*b*), is positioned in the j$^{th}$ row of the same super frame after the row permutation process, as shown in FIG. 33(*c*). The above-described relation between i and j can be easily understood with reference to a permutation rule as shown in Equation 4 below.

$$j=G(i \bmod (187+P))+\lfloor i/(187+P) \rfloor$$

$$i=(187+P)(j \bmod G)+\lfloor j/G \rfloor \qquad \text{Equation 4}$$

where 0≦i, j≦(187+P)G−1; or
where 0≦i, j<(187+P)G

Herein, each row of the super frame is configured of (N+2) number of data bytes even after being row-permuted in super frame units.

When all row permutation processes in super frame units are completed, the super frame is once again divided into G number of row-permuted RS frames, as shown in FIG. 33(*d*), and then provided to the RS frame divider 1413. Herein, the number of RS parity bytes and the number of columns should be equally provided in each of the RS frames, which configure a super frame. As described in the error correction scenario of a RS frame, in case of the super frame, a section having a large number of error occurring therein is so long that, even when one RS frame that is to be decoded includes an excessive number of errors (i.e., to an extent that the errors cannot be corrected), such errors are scattered throughout the entire super frame. Therefore, in comparison with a single RS frame, the decoding performance of the super frame is more enhanced.

The above description of the present invention corresponds to the processes of forming (or creating) and encoding an RS frame, when a data group is divided into regions A/B/C/D, and when data of an RS frame are assigned to all of regions A/B/C/D within the corresponding data group. More specifically, the above description corresponds to an embodiment of the present invention, wherein one RS frame is transmitted using one parade. In this embodiment, the secondary encoder 1420 does not operate (or is not active).

Meanwhile, 2 RS frames are transmitting using one parade, the data of the primary RS frame may be assigned to regions A/B within the data group and be transmitted, and the data of the secondary RS frame may be assigned to regions C/D within the data group and be transmitted. At this point, the primary encoder 1410 receives the mobile broadcast service data that are to be assigned to regions A/B within the data group, so as to form the primary RS frame, thereby performing RS-encoding and CRC-encoding. Similarly, the secondary encoder 1420 receives the mobile broadcast service data that are to be assigned to regions C/D within the data group, so as to form the secondary RS frame, thereby performing RS-encoding and CRC-encoding. More specifically, the primary RS frame and the secondary RS frame are created independently.

Figure 34:
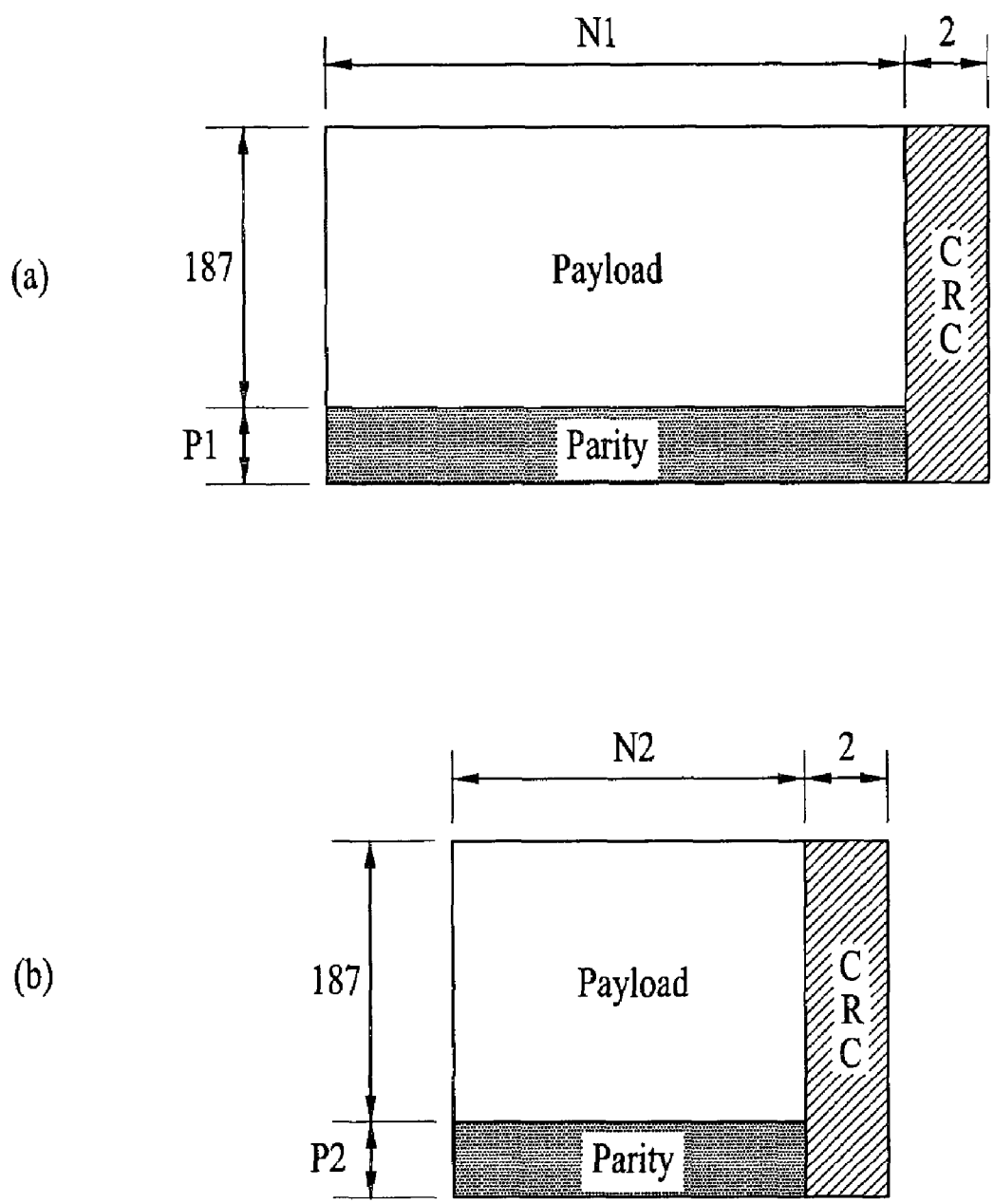
FIG. 34($a$) and FIG. 34($b$) illustrate an example of creating an RS frame by grouping data, thereby performing error correction encoding and error detection encoding.

FIG. 34 illustrates examples of receiving the mobile broadcast service data that are to be assigned to regions A/B within the data group, so as to form the primary RS frame, and receives the mobile broadcast service data that are to be assigned to regions C/D within the data group, so as to form the secondary RS frame, thereby performing error correction encoding and error detection encoding on each of the first and secondary RS frames. More specifically, FIG. 34(*a*) illustrates an example of the RS-CRC encoder 1412 of the primary encoder 1410 receiving mobile broadcast service data of the primary ensemble that are to be assigned to regions A/B within the corresponding data group, so as to create an RS frame having the size of N1(row)×187(column). Then, in this example, the primary encoder 1410 performs RS-encoding on each column of the RS frame created as described above, thereby adding P1 number of parity data bytes in each column. Finally, the primary encoder 1410 performs CRC-encoding on each row, thereby adding a 2-byte checksum in each row.

FIG. 34(b) illustrates an example of the RS-CRC encoder 1422 of the secondary encoder 1420 receiving mobile broadcast service data of the secondary ensemble that are to be assigned to regions C/D within the corresponding data group, so as to create an RS frame having the size of N2(row)×187 (column). Then, in this example, the secondary encoder 1420 performs RS-encoding on each column of the RS frame created as described above, thereby adding P2 number of parity data bytes in each column. Finally, the secondary encoder 1420 performs CRC-encoding on each row, thereby adding a 2-byte checksum in each row. At this point, each of the RS-CRC encoders 1412 and 1422 may refer to a pre-determined transmission parameter provided by the control unit 1205 and/or a transmission parameter provided from the service multiplexer 1100, the RS-CRC encoders 1412 and 1422 may be informed of RS frame information (including RS frame mode), RS encoding information (including RS code mode), SCCC information (including SCCC block information and SCCC outer code mode), data group information, and region information within a data group. The RS-CRC encoders 1412 and 1422 may refer to the transmission parameters for the purpose of RS frame configuration, error correction encoding, error detection encoding. Furthermore, the transmission parameters should also be transmitted to the receiving system so that the receiving system can perform a normal decoding process.

The data of the primary RS frame, which is encoded by RS frame units and row-permuted by super frame units from the RS-CRC encoder 1412 of the primary encoder 1410, are outputted to the RS frame divider 1413. If the secondary encoder 1420 also operates in the embodiment of the present invention, the data of the secondary RS frame, which is encoded by RS frame units and row-permuted by super frame units from the RS-CRC encoder 1422 of the secondary encoder 1420, are outputted to the RS frame divider 1423. The RS frame divider 1413 of the primary encoder 1410 divides the primary RS frame into several portions, which are then outputted to the output multiplexer (MUX) 1320. Each portion of the primary RS frame is equivalent to a data amount that can be transmitted by one data group. Similarly, the RS frame divider 1423 of the secondary encoder 1420 divides the secondary RS frame into several portions, which are then outputted to the output multiplexer (MUX) 1320.

Hereinafter, the RS frame divider 1413 of the primary RS encoder 1410 will now be described in detail. Also, in order to simplify the description of the present invention, it is assumed that an RS frame having the size of N(row)×187(column), as shown in FIG. 32(a) to FIG. 32(c), that P number of parity data bytes are added to each column by RS-encoding the RS frame, and that a 2-byte checksum is added to each row by CRC-encoding the RS frame. Accordingly, the RS frame divider 1413 divides (or partitions) the encoded RS frame having the size of (N+2)(row)×187(column) into several portions, each having the size of PL (wherein PL corresponds to the length of the RS frame portion).

At this point, as shown in Table 2 to Table 5, the value of PL may vary depending upon the RS frame mode, SCCC block mode, and SCCC outer coder mode. Also, the total number of data bytes of the RS-encoded and CRC-encoded RS frame is equal to or smaller than 5×NoG×PL. In this case, the RS frame is divided (or partitioned) into ((5×NoG)−1) number of portions each having the size of PL and one portion having a size equal to smaller than PL. More specifically, with the exception of the last portion of the RS frame, each of the remaining portions of the RS frame has an equal size of PL. If the size of the last portion is smaller than PL, a stuffing byte (or dummy byte) may be inserted in order to fill (or replace) the lacking number of data bytes, thereby enabling the last portion of the RS frame to also be equal to PL. Each portion of an RS frame corresponds to the amount of data that are to be SCCC-encoded and mapped into a single data group of a parade.

Figure 35:
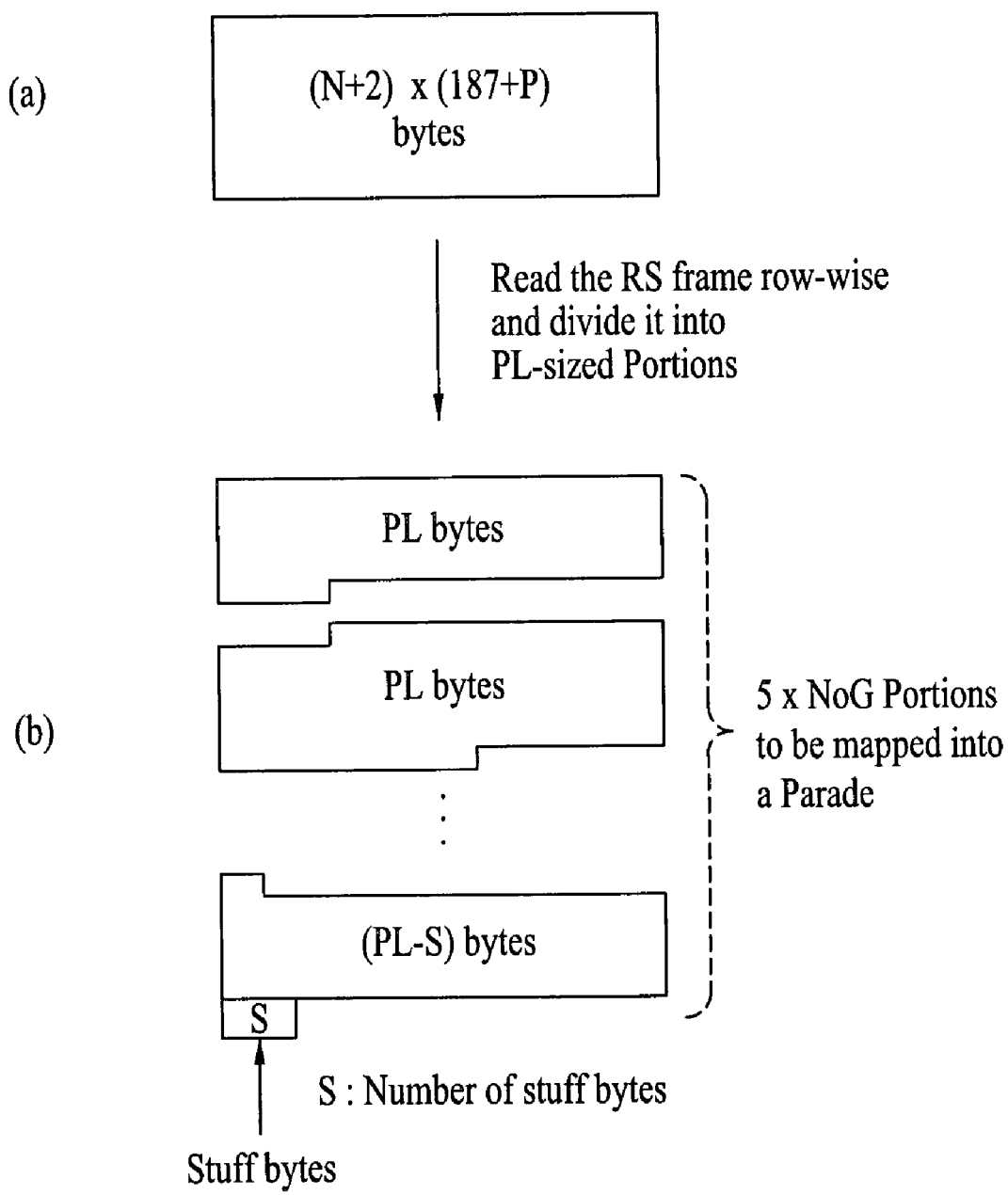
FIG. 35($a$) and FIG. 35($b$) illustrate an exemplary process of dividing an RS frame for configuring a data group according to the present invention.

FIG. 35(a) and FIG. 35(b) respectively illustrate examples of adding S number of stuffing bytes, when an RS frame having the size of (N+2)(row)×(187+P)(column) is divided into 5×NoG number of portions, each having the size of PL. More specifically, the RS-encoded and CRC-encoded RS frame, shown in FIG. 35(a), is divided into several portions, as shown in FIG. 35(b). The number of divided portions at the RS frame is equal to (5×NoG). Particularly, the first ((5× NoG)−1) number of portions each has the size of PL, and the last portion of the RS frame may be equal to or smaller than PL. If the size of the last portion is smaller than PL, a stuffing byte (or dummy byte) may be inserted in order to fill (or replace) the lacking number of data bytes, as shown in Equation 5 below, thereby enabling the last portion of the RS frame to also be equal to PL.

$$S=(5 \times NoG \times PL)-((N+2) \times (187+P)) \qquad \text{Equation 5}$$

Herein, each portion including data having the size of PL passes through the output multiplexer 1320 of the MPH frame encoder 1301, which is then outputted to the block processor 1302.

At this point, the mapping order of the RS frame portions to a parade of data groups in not identical with the group assignment order defined in Equation 1. When given the group positions of a parade in an MPH frame, the SCCC-encoded RS frame portions will be mapped in a time order (i.e., in a left-to-right direction). For example, as shown in FIG. 23, data groups of the $2^{nd}$ parade (Parade #1) are first assigned (or allocated) to the $13^{th}$ slot (Slot #12) and then assigned to the $3^{rd}$ slot (Slot #2). However, when the data are actually placed in the assigned slots, the data are placed in a time sequence (or time order, i.e., in a left-to-right direction). More specifically, the $1^{st}$ data group of Parade #1 is placed in Slot #2, and the $2^{nd}$ data group of Parade #1 is placed in Slot #12.

Block Processor

Meanwhile, the block processor 1302 performs an SCCC outer encoding process on the output of the MPH frame encoder 1301. More specifically, the block processor 1302 receives the data of each error correction encoded portion. Then, the block processor 1302 encodes the data once again at a coding rate of 1/H (wherein H is an integer equal to or greater than 2 (i.e., H≧2)), thereby outputting the 1/H-rate encoded data to the group formatter 1303. According to the embodiment of the present invention, the input data are encoded either at a coding rate of 1/2 (also referred to as "1/2-rate encoding") or at a coding rate of 1/4 (also referred to as "1/4-rate encoding"). The data of each portion outputted from the MPH frame encoder 1301 may include at least one of pure mobile broadcast service data, RS parity data, CRC data, and stuffing data. However, in a broader meaning, the data included in each portion may correspond to data for mobile broadcast services. Therefore, the data included in each portion will all be considered as mobile broadcast service data and described accordingly.

The group formatter 1303 inserts the mobile broadcast service data SCCC-outer-encoded and outputted from the block processor 1302 in the corresponding region within the data group, which is formed in accordance with a pre-defined rule. Also, in association with the data deinterleaving process, the group formatter 1303 inserts various place holders (or known data place holders) in the corresponding region within the data group. Thereafter, the group formatter 1303 deinterleaves the data within the data group and the place holders.

According to the present invention, with reference to data after being data-interleaved, as shown in FIG. 17, a data groups is configured of 10 MPH blocks (B1 to B10) and divided into 4 regions (A, B, C, and D). Also, as shown in FIG. 17, when it is assumed that the data group is divided into a plurality of hierarchical regions, as described above, the block processor 1302 may encode the mobile broadcast service data, which are to be inserted to each region based upon the characteristic of each hierarchical region, at different coding rates. For example, the block processor 1302 may encode the mobile broadcast service data, which are to be inserted in region A/B within the corresponding data group, at a coding rate of 1/2. Then, the group formatter 1303 may insert the 1/2-rate encoded mobile broadcast service data to region A/B. Also, the block processor 1302 may encode the mobile broadcast service data, which are to be inserted in region C/D within the corresponding data group, at a coding rate of 1/4 having higher (or stronger) error correction ability than the 1/2-coding rate. Thereafter, the group formatter 1303 may insert the 1/2-rate encoded mobile broadcast service data to region C/D. In another example, the block processor 1302 may encode the mobile broadcast service data, which are to be inserted in region C/D, at a coding rate having higher error correction ability than the 1/4-coding rate. Then, the group formatter 1303 may either insert the encoded mobile broadcast service data to region C/D, as described above, or leave the data in a reserved region for future usage.

According to another embodiment of the present invention, the block processor 1302 may perform a 1/H-rate encoding process in SCCC block units. Herein, the SCCC block includes at least one MPH block. At this point, when 1/H-rate encoding is performed in MPH block units, the MPH blocks (B1 to B10) and the SCCC block (SCB1 to SCB10) become identical to one another (i.e., SCB1=B1, SCB2=B2, SCB3=B3, SCB4=B4, SCB5=B5, SCB6=B6, SCB7=B7, SCB8=B8, SCB9=B9, and SCB10=B10). For example, the MPH block 1 (B1) may be encoded at the coding rate of 1/2, the MPH block 2 (B2) may be encoded at the coding rate of 1/4, and the MPH block 3 (B3) may be encoded at the coding rate of 1/2. The coding rates are applied respectively to the remaining MPH blocks.

Alternatively, a plurality of MPH blocks within regions A, B, C, and D may be grouped into one SCCC block, thereby being encoded at a coding rate of 1/H in SCCC block units. Accordingly, the receiving performance of region C/D may be enhanced. For example, MPH block 1 (B1) to MPH block 5 (B5) may be grouped into one SCCC block and then encoded at a coding rate of 1/2. Thereafter, the group formatter 1303 may insert the 1/2-rate encoded mobile broadcast service data to a section starting from MPH block 1 (B1) to MPH block 5 (B5). Furthermore, MPH block 6 (B6) to MPH block 10 (B10) may be grouped into one SCCC block and then encoded at a coding rate of 1/4. Thereafter, the group formatter 1303 may insert the 1/4-rate encoded mobile broadcast service data to another section starting from MPH block 6 (B6) to MPH block 10 (B10). In this case, one data group may consist of two SCCC blocks.

According to another embodiment of the present invention, one SCCC block may be formed by grouping two MPH blocks. For example, MPH block 1 (B1) and MPH block 6 (B6) may be grouped into one SCCC block (SCB1). Similarly, MPH block 2 (B2) and MPH block 7 (B7) may be grouped into another SCCC block (SCB2). Also, MPH block 3 (B3) and MPH block 8 (B8) may be grouped into another SCCC block (SCB3). And, MPH block 4 (B4) and MPH block 9 (B9) may be grouped into another SCCC block (SCB4). Furthermore, MPH block 5 (B5) and MPH block 10 (B10) may be grouped into another SCCC block (SCB5). In the above-described example, the data group may consist of 10 MPH blocks and 5 SCCC blocks. Accordingly, in a data (or signal) receiving environment undergoing frequent and severe channel changes, the receiving performance of regions C and D, which is relatively more deteriorated than the receiving performance of region A, may be reinforced. Furthermore, since the number of mobile broadcast service data symbols increases more and more from region A to region D, the error correction encoding performance becomes more and more deteriorated. Therefore, when grouping a plurality of MPH block to form one SCCC block, such deterioration in the error correction encoding performance may be reduced.

As described-above, when the block processor 1302 performs encoding at a 1/H-coding rate, information associated with SCCC should be transmitted to the receiving system in order to accurately recover the mobile broadcast service data. Table 7 below shows an example of a SCCC block mode, which indicating the relation between an MPH block and an SCCC block, among diverse SCCC block information.

TABLE 7

| | SCCC Block Mode | | | |
|---|---|---|---|---|
| | 00 | 01 | 10 | 11 |
| Description | One MPH Block per SCCC Block | Two MPH Blocks per SCCC Block | Reserved | Reserved |
| SCB | SCB input, MPH Block | SCB input, MPH Blocks | | |
| SCB1 | B1 | B1 + B6 | | |
| SCB2 | B2 | B2 + B7 | | |
| SCB3 | B3 | B3 + B8 | | |
| SCB4 | B4 | B4 + B9 | | |
| SCB5 | B5 | B5 + B10 | | |
| SCB6 | B6 | — | | |
| SCB7 | B7 | — | | |
| SCB8 | B8 | — | | |
| SCB9 | B9 | — | | |
| SCB10 | B10 | — | | |

More specifically, Table 4 shows an example of 2 bits being allocated in order to indicate the SCCC block mode. For example, when the SCCC block mode value is equal to '00', this indicates that the SCCC block and the MPH block are identical to one another. Also, when the SCCC block mode value is equal to '01', this indicates that each SCCC block is configured of 2 MPH blocks.

As described above, if one data group is configured of 2 SCCC blocks, although it is not indicated in Table 7, this information may also be indicated as the SCCC block mode. For example, when the SCCC block mode value is equal to '10', this indicates that each SCCC block is configured of 5 MPH blocks and that one data group is configured of 2 SCCC blocks. Herein, the number of MPH blocks included in an SCCC block and the position of each MPH block may vary depending upon the settings made by the system designer. Therefore, the present invention will not be limited to the examples given herein. Accordingly, the SCCC mode information may also be expanded.

An example of a coding rate information of the SCCC block, i.e., SCCC outer code mode, is shown in Table 8 below.

TABLE 8

| SCCC outer code mode (2 bits) | Description |
| --- | --- |
| 00 | Outer code rate of SCCC block is ½ rate |
| 01 | Outer code rate of SCCC block is ¼ rate |
| 10 | Reserved |
| 11 | Reserved |

More specifically, Table 8 shows an example of 2 bits being allocated in order to indicate the coding rate information of the SCCC block. For example, when the SCCC outer code mode value is equal to '00', this indicates that the coding rate of the corresponding SCCC block is 1/2. And, when the SCCC outer code mode value is equal to '01', this indicates that the coding rate of the corresponding SCCC block is 1/4.

If the SCCC block mode value of Table 7 indicates '00', the SCCC outer code mode may indicate the coding rate of each MPH block with respect to each MPH block. In this case, since it is assumed that one data group includes 10 MPH blocks and that 2 bits are allocated for each SCCC block mode, a total of 20 bits are required for indicating the SCCC block modes of the 10 MPH modes. In another example, when the SCCC block mode value of Table 7 indicates '00', the SCCC outer code mode may indicate the coding rate of each region with respect to each region within the data group. In this case, since it is assumed that one data group includes 4 regions (i.e., regions A, B, C, and D) and that 2 bits are allocated for each SCCC block mode, a total of 8 bits are required for indicating the SCCC block modes of the 4 regions. In another example, when the SCCC block mode value of Table 7 is equal to '01', each of the regions A, B, C, and D within the data group has the same SCCC outer code mode.

Meanwhile, an example of an SCCC output block length (SOBL) for each SCCC block, when the SCCC block mode value is equal to '00', is shown in Table 9 below.

TABLE 9

| SCCC Block | SOBL | SIBL | |
| --- | --- | --- | --- |
| | | ½ rate | ¼ rate |
| SCB1 (B1) | 528 | 264 | 132 |
| SCB2 (B2) | 1536 | 768 | 384 |
| SCB3 (B3) | 2376 | 1188 | 594 |
| SCB4 (B4) | 2388 | 1194 | 597 |
| SCB5 (B5) | 2772 | 1386 | 693 |
| SCB6 (B6) | 2472 | 1236 | 618 |
| SCB7 (B7) | 2772 | 1386 | 693 |
| SCB8 (B8) | 2508 | 1254 | 627 |
| SCB9 (B9) | 1416 | 708 | 354 |
| SCB10 (B10) | 480 | 240 | 120 |

More specifically, when given the SCCC output block length (SOBL) for each SCCC block, an SCCC input block length (SIBL) for each corresponding SCCC block may be decided based upon the outer coding rate of each SCCC block. The SOBL is equivalent to the number of SCCC output (or outer-encoded) bytes for each SCCC block. And, the SIBL is equivalent to the number of SCCC input (or payload) bytes for each SCCC block. Table 10 below shows an example of the SOBL and SIBL for each SCCC block, when the SCCC block mode value is equal to '01'.

TABLE 10

| SCCC Block | SOBL | SIBL | |
| --- | --- | --- | --- |
| | | ½ rate | ¼ rate |
| SCB1 (B1 + B6) | 528 | 264 | 132 |
| SCB2 (B2 + B7) | 1536 | 768 | 384 |
| SCB3 (B3 + B8) | 2376 | 1188 | 594 |
| SCB4 (B4 + B9) | 2388 | 1194 | 597 |
| SCB5 (B5 + B10) | 2772 | 1386 | 693 |

Figure 36:
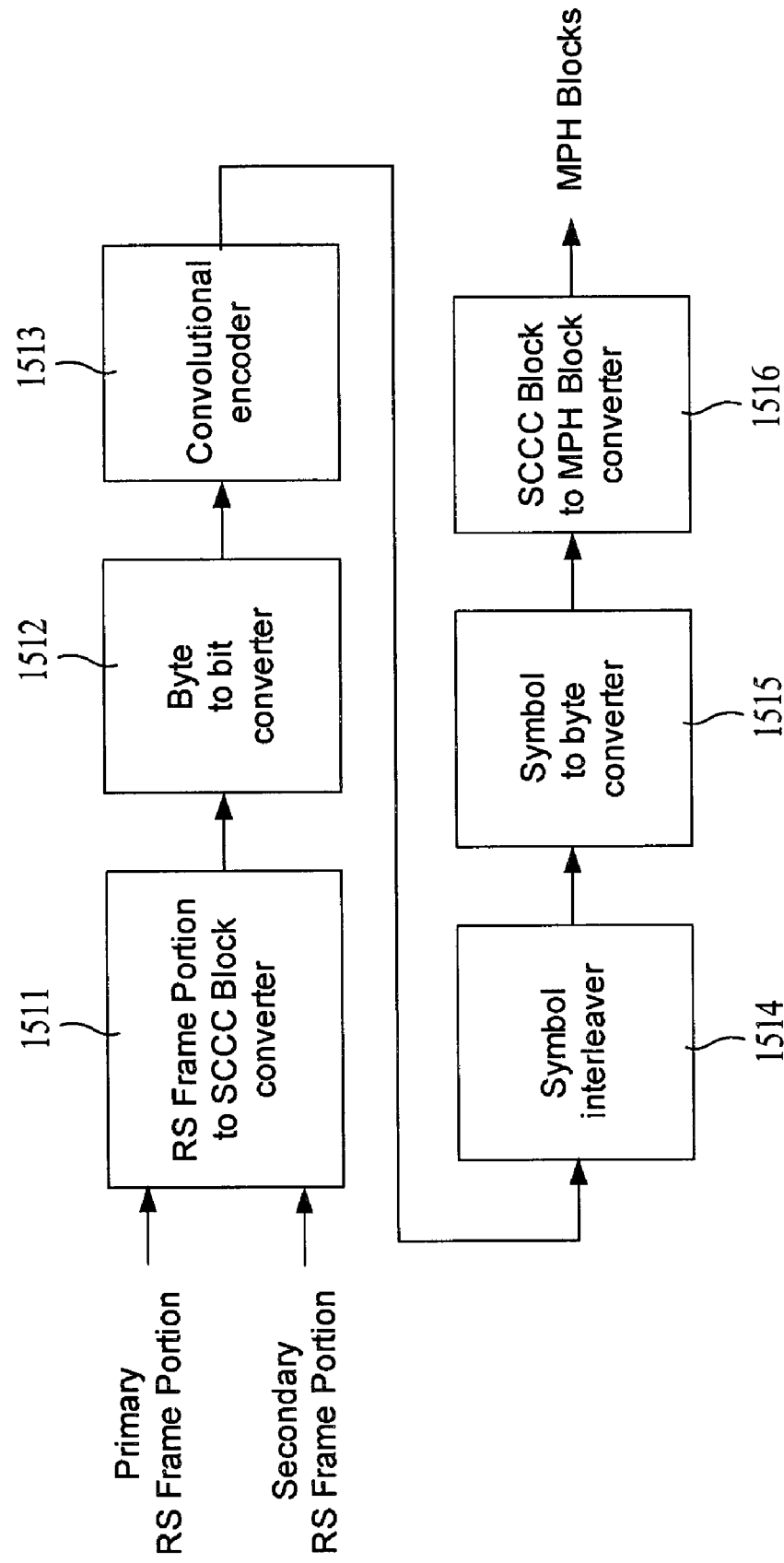
FIG. 36 illustrates a block diagram of a block processor according to an embodiment of the present invention.

In order to do so, as shown in FIG. 36, the block processor 1302 includes a RS frame portion-SCCC block converter 1511, a byte-bit converter 1512, a convolution encoder 1513, a symbol interleaver 1514, a symbol-byte converter 1515, and an SCCC block-MPH block converter 1516. The convolutional encoder 1513 and the symbol interleaver 1514 are virtually concatenated with the trellis encoding module in the post-processor in order to configure an SCCC block. More specifically, the RS frame portion-SCCC block converter 1511 divides the RS frame portions, which are being inputted, into multiple SCCC blocks using the SIBL of Table 9 and Table 10 based upon the RS code mode, SCCC block mode, and SCCC outer code mode. Herein, the MPH frame encoder 1301 may output only primary RS frame portions or both primary RS frame portions and secondary RS frame portions in accordance with the RS frame mode.

When the RS Frame mode is set to '00', a portion of the primary RS Frame equal to the amount of data, which are to be SCCC outer encoded and mapped to 10 MPH blocks (B1 to B10) of a data group, will be provided to the block processor 1302. When the SCCC block mode value is equal to '00', then the primary RS frame portion will be split into 10 SCCC Blocks according to Table 9. Alternatively, when the SCCC block mode value is equal to '01', then the primary RS frame will be split into 5 SCCC blocks according to Table 10.

When the RS frame mode value is equal to '01', then the block processor 1302 may receive two RS frame portions. The RS frame mode value of '01' will not be used with the SCCC block mode value of '01'. The first portion from the primary RS frame will be SCCC-outer-encoded as SCCC Blocks SCB3, SCB4, SCB5, SCB6, SCB7, and SCB8 by the block processor 1302. The SCCC Blocks SCB3 and SCB8 will be mapped to region B and the SCCC blocks SCB4, SCB5, SCB6, and SCB7 shall be mapped to region A by the group formatter 1303. The second portion from the secondary RS frame will also be SCCC-outer-encoded, as SCB1, SCB2, SCB9, and SCB10, by the block processor 1302. The group formatter 1303 will map the SCCC blocks SCB1 and SCB10 to region D as the MPH blocks B1 and B10, respectively. Similarly, the SCCC blocks SCB2 and SCB9 will be mapped to region C as the MPH blocks B2 and B9.

The byte-bit converter 1512 identifies the mobile broadcast service data bytes of each SCCC block outputted from the RS frame portion-SCCC block converter 1511 as data bits, which are then outputted to the convolution encoder 1513. The convolution encoder 1513 performs one of 1/2-rate encoding and 1/4-rate encoding on the inputted mobile broadcast service data bits.

Figure 37:
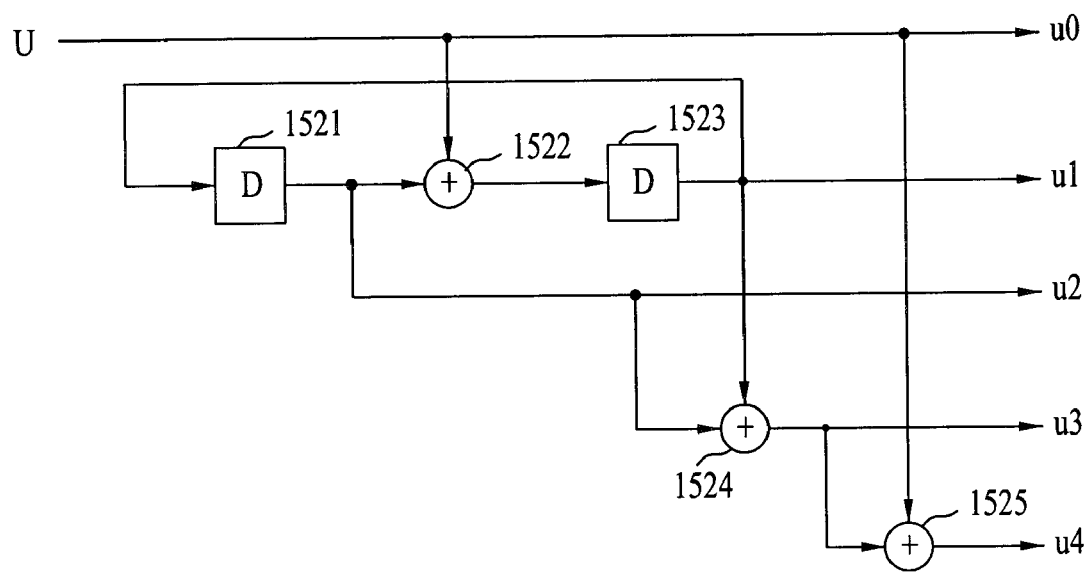
FIG. 37 illustrates a detailed block diagram of a convolution encoder of the block processor of FIG. 36.

FIG. 37 illustrates a detailed block diagram of the convolution encoder 1513. The convolution encoder 1513 includes two delay units 1521 and 1523 and three adders 1522, 1524, and 1525. Herein, the convolution encoder 1513 encodes an input data bit U and outputs the coded bit U to 5 bits (u0 to u4). At this point, the input data bit U is directly outputted as uppermost bit u0 and simultaneously encoded as lower bit u1u2u3u4 and then outputted. More specifically, the input data bit U is directly outputted as the uppermost bit u0 and simultaneously outputted to the first and third adders 1522 and 1525.

The first adder 1522 adds the input data bit U and the output bit of the first delay unit 1521 and, then, outputs the added bit to the second delay unit 1523. Then, the data bit delayed by a pre-determined time (e.g., by 1 clock) in the second delay unit 1523 is outputted as a lower bit u1 and simultaneously fed-back to the first delay unit 1521. The first delay unit 1521 delays the data bit fed-back from the second delay unit 1523 by a pre-determined time (e.g., by 1 clock). Then, the first delay unit 1521 outputs the delayed data bit as a lower bit u2 and, at the same time, outputs the fed-back data to the first adder 1522 and the second adder 1524. The second adder 1524 adds the data bits outputted from the first and second delay units 1521 and 1523 and outputs the added data bits as a lower bit u3. The third adder 1525 adds the input data bit U and the output of the second delay unit 1523 and outputs the added data bit as a lower bit u4.

At this point, the first and second delay units 1521 and 1523 are reset to '0', at the starting point of each SCCC block. The convolution encoder 1513 of FIG. 37 may be used as a 1/2-rate encoder or a 1/4-rate encoder. More specifically, when a portion of the output bit of the convolution encoder 1513, shown in FIG. 37, is selected and outputted, the convolution encoder 1513 may be used as one of a 1/2-rate encoder and a 1/4-rate encoder. Table 11 below shown an example of output symbols of the convolution encoder 1513.

TABLE 11

| Region | 1/2 rate | 1/4 rate SCCC block mode = '00' | SCCC block mode = '01' |
|---|---|---|---|
| A, B | (u0, u1) | (u0, u2), (u1, u3) | (u0, u2), (u1, u4) |
| C, D | | (u0, u1), (u3, u4) | |

For example, at the 1/2-coding rate, 1 output symbol (i.e., u0 and u1 bits) may be selected and outputted. And, at the 1/4-coding rate, depending upon the SCCC block mode, 2 output symbols (i.e., 4 bits) may be selected and outputted. For example, when the SCCC block mode value is equal to '01', and when an output symbol configured of u0 and u2 and another output symbol configured of u1 and u4 are selected and outputted, a 1/4-rate coding result may be obtained.

The mobile broadcast service data encoded at the coding rate of 1/2 or 1/4 by the convolution encoder 1513 are outputted to the symbol interleaver 1514. The symbol interleaver 1514 performs block interleaving, in symbol units, on the output data symbol of the convolution encoder 1513. More specifically, the symbol interleaver 1514 is a type of block interleaver. Any interleaver performing structural rearrangement (or realignment) may be applied as the symbol interleaver 1514 of the block processor. However, in the present invention, a variable length symbol interleaver that can be applied even when a plurality of lengths is provided for the symbol, so that its order may be rearranged, may also be used.

FIG. 38 illustrates a symbol interleaver according to an embodiment of the present invention. Particularly, FIG. 38 illustrates an example of the symbol interleaver when B=2112 and L=4096. Herein, B indicates a block length in symbols that are outputted for symbol interleaving from the convolution encoder 1513. And, L represents a block length in symbols that are actually interleaved by the symbol interleaver 1514. At this point, the block length in symbols B inputted to the symbol interleaver 1514 is equivalent to 4× SOBL. More specifically, since one symbol is configured of 2 bits, the value of B may be set to be equal to 4× SOBL.

In the present invention, when performing the symbol-intereleaving process, the conditions of $L=2^m$ (wherein m is an integer) and of $L \geq B$ should be satisfied. If there is a difference in value between B and L, (L−B) number of null (or dummy) symbols is added, thereby creating an interleaving pattern, as shown in P'(i) of FIG. 38. Therefore, B becomes a block size of the actual symbols that are inputted to the symbol interleaver 1514 in order to be interleaved. L becomes an interleaving unit when the interleaving process is performed by an interleaving pattern created from the symbol interleaver 1514.

Equation 6 shown below describes the process of sequentially receiving B number of symbols, the order of which is to be rearranged, and obtaining an L value satisfying the conditions of $L=2^m$ (wherein m is an integer) and of $L \geq B$, thereby creating the interleaving so as to realign (or rearrange) the symbol order.

In relation to all places, wherein $0 \leq i \leq B-1$, $$P'(i) = \{89 \times i \times (i+1)/2\} \bmod L \qquad \text{Equation 6}$$

Herein, $L \geq B$, $L=2^m$, wherein m is an integer.

As shown in P'(i) of FIG. 38, the order of B number of input symbols and (L−B) number of null symbols is rearranged by using the above-mentioned Equation 6. Then, as shown in P(i) of FIG. 38, the null byte places are removed, so as to rearrange the order. Starting with the lowest value of i, the P(i) are shifted to the left in order to fill the empty entry locations. Thereafter, the symbols of the aligned interleaving pattern P(i) are outputted to the symbol-byte converter 1515 in order. Herein, the symbol-byte converter 1515 converts to bytes the mobile broadcast service data symbols, having the rearranging of the symbol order completed and then outputted in accordance with the rearranged order, and thereafter outputs the converted bytes to the SCCC block-MPH block converter 1516. The SCCC block-MPH block converter 1516 converts the symbol-interleaved SCCC blocks to MPH blocks, which are then outputted to the group formatter 1303.

If the SCCC block mode value is equal to '00', the SCCC block is mapped at a one-to-one (1:1) correspondence with each MPH block within the data group. In another example, if the SCCC block mode value is equal to '01', each SCCC block is mapped with two MPH blocks within the data group. For example, the SCCC block SCB1 is mapped with (B1, B6), the SCCC block SCB2 is mapped with (B2, B7), the SCCC block SCB3 is mapped with (B3, B8), the SCCC block SCB4 is mapped with (B4, B9), and the SCCC block SCB5 is mapped with (B5, B10). The MPH block that is outputted from the SCCC block-MPH block converter 1516 is configured of mobile broadcast service data and FEC redundancy. In the present invention, the mobile broadcast service data as well as the FEC redundancy of the MPH block will be collectively considered as mobile broadcast service data.

Group Formatter

The group formatter 1303 inserts data of MPH blocks outputted from the block processor 1302 to the corresponding MPH blocks within the data group, which is formed in accordance with a pre-defined rule. Also, in association with the data-deinterleaving process, the group formatter 1303 inserts various place holders (or known data place holders) in the corresponding region within the data group. More specifically, apart from the encoded mobile broadcast service data outputted from the block processor 1302, the group formatter 1303 also inserts MPEG header place holders, non-systematic RS parity place holders, main broadcast service data place holders, which are associated with the data deinterleaving in a later process, as shown in FIG. 17.

Herein, the main broadcast service data place holders are inserted because the mobile broadcast service data bytes and the main broadcast service data bytes are alternately mixed with one another in regions B to D based upon the input of the data deinterleaver, as shown in FIG. 17. For example, based upon the data outputted after data deinterleaving, the place holder for the MPEG header may be allocated at the very beginning of each packet. Also, in order to configure an intended group format, dummy bytes may also be inserted. Furthermore, the group formatter 1303 inserts place holders for initializing the trellis encoding module 1256 in the corresponding regions. For example, the initialization data place holders may be inserted in the beginning of the known data sequence. Additionally, the group formatter 1303 may also insert signaling information, which are encoded and outputted from the signaling encoder 1304, in corresponding regions within the data group. At this point, reference may be made to the signaling information when the group formatter 1303 inserts each data type and respective place holders in the data group. The process of encoding the signaling information and inserting the encoded signaling information to the data group will be described in detail in a later process.

Figure 39:
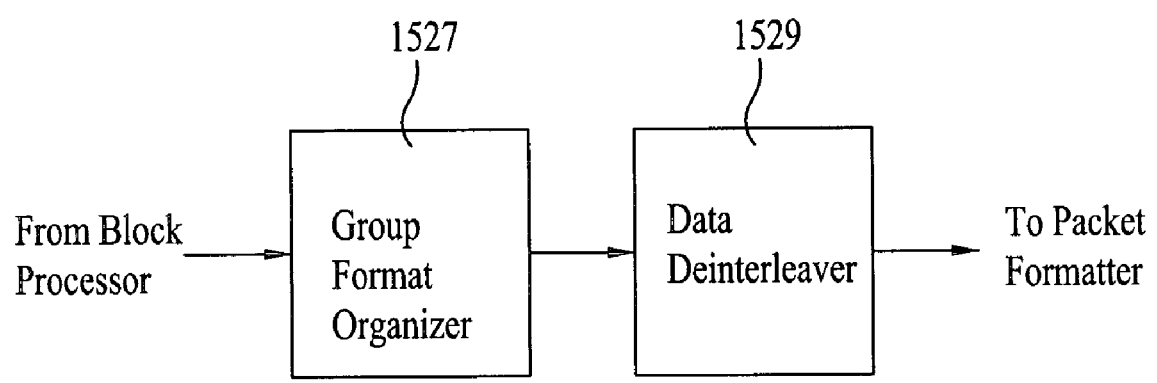
FIG. 39 illustrates a block diagram of a group formatter according to an embodiment of the present invention.

After inserting each data type and respective place holders in the data group, the group formatter 1303 may deinterleave the data and respective place holders, which have been inserted in the data group, as an inverse process of the data interleaver, thereby outputting the deinterleaved data and respective place holders to the packet encoder 1304. More specifically, when the data and respective place holders within the data group, which is configured (or structured) as shown in FIG. 17, are deinterleaved by the group formatter 1303 and outputted to the packet encoder 1304, the structure of the data group may be identical to the structure shown in FIG. 19. In order to do so, the group formatter 1303 may include a group format organizer 1527, and a data deinterleaver 1529, as shown in FIG. 39. The group format organizer 1527 inserts data and respective place holders in the corresponding regions within the data group, as described above. And, the data deinterleaver 1529 deinterleaves the inserted data and respective place holders as an inverse process of the data interleaver.

The packet encoder 1304 removes the main broadcast service data place holders and the RS parity place holders that were allocated for the deinterleaving process from the deinterleaved data being inputted. Then, the packet encoder 1304 groups the remaining portion and inserts the 3-byte MPEG header place holder in an MPEG header having a null packet PID (or an unused PID from the main broadcast service data packet). Furthermore, the packet encoder 1304 adds a synchronization data byte at the beginning of each 187-byte data packet. Also, when the group formatter 1303 inserts known data place holders, the packet formatter 1303 may insert actual known data in the known data place holders, or may directly output the known data place holders without any modification in order to make replacement insertion in a later process. Thereafter, the packet encoder 1304 identifies the data within the packet-formatted data group, as described above, as a 188-byte unit mobile broadcast service data packet (i.e., MPEG TS packet), which is then provided to the packet multiplexer 1240.

Based upon the control of the control unit 1205, the packet multiplexer 1240 multiplexes the data group packet-formatted and outputted from the packet formatter 306 and the main broadcast service data packet outputted from the packet jitter mitigator 1220. Then, the packet multiplexer 1240 outputs the multiplexed data packets to the data randomizer 1251 of the post-processor 1250. More specifically, the control unit 1205 controls the time-multiplexing of the packet multiplexer 1240. If the packet multiplexer 1240 receives 118 mobile broadcast service data packets from the packet encoder 1304, 37 mobile broadcast service data packets are placed before a place for inserting VSB field synchronization. Then, the remaining 81 mobile broadcast service data packets are placed after the place for inserting VSB field synchronization. The multiplexing method may be adjusted by diverse variables of the system design. The multiplexing method and multiplexing rule of the packet multiplexer 1240 will be described in more detail in a later process.

Also, since a data group including mobile broadcast service data in-between the data bytes of the main broadcast service data is multiplexed (or allocated) during the packet multiplexing process, the shifting of the chronological position (or place) of the main broadcast service data packet becomes relative. Also, a system object decoder (i.e., MPEG decoder) for processing the main broadcast service data of the receiving system, receives and decodes only the main broadcast service data and recognizes the mobile broadcast service data packet as a null data packet.

Therefore, when the system object decoder of the receiving system receives a main broadcast service data packet that is multiplexed with the data group, a packet jitter occurs.

At this point, since a multiple-level buffer for the video data exists in the system object decoder and the size of the buffer is relatively large, the packet jitter generated from the packet multiplexer 1240 does not cause any serious problem in case of the video data. However, since the size of the buffer for the audio data in the object decoder is relatively small, the packet jitter may cause considerable problem. More specifically, due to the packet jitter, an overflow or underflow may occur in the buffer for the main broadcast service data of the receiving system (e.g., the buffer for the audio data). Therefore, the packet jitter mitigator 1220 re-adjusts the relative position of the main broadcast service data packet so that the overflow or underflow does not occur in the system object decoder.

In the present invention, examples of repositioning places for the audio data packets within the main broadcast service data in order to minimize the influence on the operations of the audio buffer will be described in detail. The packet jitter mitigator 1220 repositions the audio data packets in the main broadcast service data section so that the audio data packets of the main broadcast service data can be as equally and uniformly aligned and positioned as possible. Additionally, when the positions of the main broadcast service data packets are relatively re-adjusted, associated program clock reference (PCR) values may also be modified accordingly. The PCR value corresponds to a time reference value for synchronizing the time of the MPEG decoder. Herein, the PCR value is inserted in a specific region of a TS packet and then transmitted.

In the example of the present invention, the packet jitter mitigator 1220 also performs the operation of modifying the PCR value. The output of the packet jitter mitigator 1220 is inputted to the packet multiplexer 1240. As described above, the packet multiplexer 1240 multiplexes the main broadcast service data packet outputted from the packet jitter mitigator 1220 with the mobile broadcast service data packet outputted from the pre-processor 1230 into a burst structure in accordance with a pre-determined multiplexing rule. Then, the packet multiplexer 1240 outputs the multiplexed data packets to the data randomizer 1251 of the post-processor 1250.

If the inputted data correspond to the main broadcast service data packet, the data randomizer 1251 performs the same randomizing process as that of the conventional randomizer. More specifically, the synchronization byte within the main broadcast service data packet is deleted. Then, the remaining 187 data bytes are randomized by using a pseudo random byte generated from the data randomizer 1251. Thereafter, the randomized data are outputted to the RS encoder/non-systematic RS encoder 1252.

On the other hand, if the inputted data correspond to the mobile broadcast service data packet, the data randomizer 1251 may randomize only a portion of the data packet. For example, if it is assumed that a randomizing process has already been performed in advance on the mobile broadcast service data packet by the pre-processor 1230, the data randomizer 1251 deletes the synchronization byte from the 4-byte MPEG header included in the mobile broadcast service data packet and, then, performs the randomizing process only on the remaining 3 data bytes of the MPEG header. Thereafter, the randomized data bytes are outputted to the RS encoder/non-systematic RS encoder 1252. More specifically, the randomizing process is not performed on the remaining portion of the mobile broadcast service data excluding the MPEG header. In other words, the remaining portion of the mobile broadcast service data packet is directly outputted to the RS encoder/non-systematic RS encoder 1252 without being randomized. Also, the data randomizer 1251 may or may not perform a randomizing process on the known data (or known data place holders) and the initialization data place holders included in the mobile broadcast service data packet.

The RS encoder/non-systematic RS encoder 1252 performs an RS encoding process on the data being randomized by the data randomizer 1251 or on the data bypassing the data randomizer 1251, so as to add 20 bytes of RS parity data. Thereafter, the processed data are outputted to the data interleaver 1253. Herein, if the inputted data correspond to the main broadcast service data packet, the RS encoder/non-systematic RS encoder 1252 performs the same systematic RS encoding process as that of the conventional broadcasting system, thereby adding the 20-byte RS parity data at the end of the 187-byte data. Alternatively, if the inputted data correspond to the mobile broadcast service data packet, the RS encoder/non-systematic RS encoder 1252 performs a non-systematic RS encoding process. At this point, the 20-byte RS parity data obtained from the non-systematic RS encoding process are inserted in a pre-decided parity byte place within the mobile broadcast service data packet.

The data interleaver 1253 corresponds to a byte unit convolutional interleaver. The output of the data interleaver 1253 is inputted to the parity replacer 1254 and to the non-systematic RS encoder 1255. Meanwhile, a process of initializing a memory within the trellis encoding module 1256 is primarily required in order to decide the output data of the trellis encoding module 1256, which is located after the parity replacer 1254, as the known data pre-defined according to an agreement between the receiving system and the transmitting system. More specifically, the memory of the trellis encoding module 1256 should first be initialized before the received known data sequence is trellis-encoded. At this point, the beginning portion of the known data sequence that is received corresponds to the initialization data place holder and not to the actual known data. Herein, the initialization data place holder has been included in the data by the group formatter within the pre-processor 1230 in an earlier process. Therefore, the process of generating initialization data and replacing the initialization data place holder of the corresponding memory with the generated initialization data are required to be performed immediately before the inputted known data sequence is trellis-encoded.

Additionally, a value of the trellis memory initialization data is decided and generated based upon a memory status of the trellis encoding module 1256. Further, due to the newly replaced initialization data, a process of newly calculating the RS parity and replacing the RS parity, which is outputted from the data interleaver 1253, with the newly calculated RS parity is required. Therefore, the non-systematic RS encoder 1255 receives the mobile broadcast service data packet including the initialization data place holders, which are to be replaced with the actual initialization data, from the data interleaver 1253 and also receives the initialization data from the trellis encoding module 1256.

Among the inputted mobile broadcast service data packet, the initialization data place holders are replaced with the initialization data, and the RS parity data that are added to the mobile broadcast service data packet are removed and processed with non-systematic RS encoding. Thereafter, the new RS parity obtained by performing the non-systematic RS encoding process is outputted to the parity replacer 255. Accordingly, the parity replacer 255 selects the output of the data interleaver 1253 as the data within the mobile broadcast service data packet, and the parity replacer 255 selects the output of the non-systematic RS encoder 1255 as the RS parity. The selected data are then outputted to the trellis encoding module 1256.

Meanwhile, if the main broadcast service data packet is inputted or if the mobile broadcast service data packet, which does not include any initialization data place holders that are to be replaced, is inputted, the parity replacer 1254 selects the data and RS parity that are outputted from the data interleaver 1253. Then, the parity replacer 1254 directly outputs the selected data to the trellis encoding module 1256 without any modification. The trellis encoding module 1256 converts the byte-unit data to symbol units and performs a 12-way interleaving process so as to trellis-encode the received data. Thereafter, the processed data are outputted to the synchronization multiplexer 1260.

Figure 40:
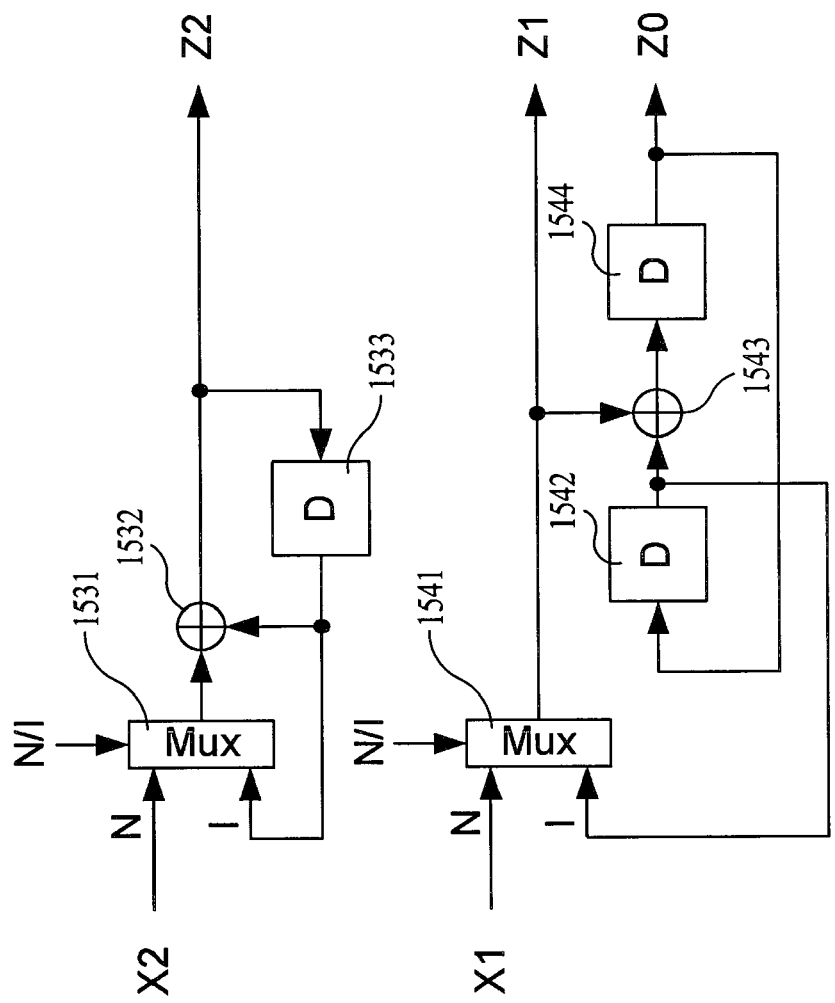
FIG. 40 illustrates a detailed diagram of one of 12 trellis encoders included in the trellis encoding module of FIG. 27.

FIG. 40 illustrates a detailed diagram of one of 12 trellis encoders included in the trellis encoding module 1256. Herein, the trellis encoder includes first and second multiplexers 1531 and 1541, first and second adders 1532 and 1542, and first to third memories 1533, 1542, and 1544. More specifically, the first to third memories 1533, 1542, and 1544 are initialized by a set of trellis initialization data inserted in an initialization data place holder by the parity replacer 1254 and, then, outputted. More specifically, when the first two 2-bit symbols, which are converted from each trellis initialization data byte, are inputted, the input bits of the trellis encoder will be replaced by the memory values of the trellis encoder, as shown in FIG. 40.

Since 2 symbols (i.e., 4 bits) are required for trellis initialization, the last 2 symbols (i.e., 4 bits) from the trellis initialization bytes are not used for trellis initialization and are considered as a symbol from a known data byte and processed accordingly. When the trellis encoder is in the initialization mode, the input comes from an internal trellis status (or state) and not from the parity replacer 1254. When the trellis encoder is in the normal mode, the input symbol provided from the parity replacer 1254 will be processed. The trellis encoder provides the converted (or modified) input data for trellis initialization to the non-systematic RS encoder 1255.

More specifically, when a selection signal designates a normal mode, the first multiplexer 1531 selects an upper bit X2 of the input symbol. And, when a selection signal designates an initialization mode, the first multiplexer 1531 selects the output of the first memory 1533 and outputs the selected output data to the first adder 1532. The first adder 1532 adds the output of the first multiplexer 1531 and the output of the first memory 1533, thereby outputting the added result to the first memory 1533 and, at the same time, as a most significant (or uppermost) bit Z2. The first memory 1533 delays the output data of the first adder 1532 by 1 clock, thereby outputting the delayed data to the first multiplexer 1531 and the first adder 1532.

Meanwhile, when a selection signal designates a normal mode, the second multiplexer 1541 selects a lower bit X1 of the input symbol. And, when a selection signal designates an initialization mode, the second multiplexer 1541 selects the output of the second memory 1542, thereby outputting the selected result to the second adder 1543 and, at the same time, as a lower bit Z1. The second adder 1543 adds the output of the second multiplexer 1541 and the output of the second memory 1542, thereby outputting the added result to the third memory 1544. The third memory 1544 delays the output data of the second adder 1543 by 1 clock, thereby outputting the delayed data to the second memory 1542 and, at the same time, as a least significant (or lowermost) bit Z0. The second memory 1542 delays the output data of the third memory 1544 by 1 clock, thereby outputting the delayed data to the second adder 1543 and the second multiplexer 1541.

The synchronization multiplexer 1260 inserts a field synchronization signal and a segment synchronization signal to the data outputted from the trellis encoding module 1256 and, then, outputs the processed data to the pilot inserter 1271 of the transmission unit 1270. Herein, the data having a pilot inserted therein by the pilot inserter 1271 are modulated by the modulator 1272 in accordance with a pre-determined modulating method (e.g., a VSB method). Thereafter, the modulated data are transmitted to each receiving system though the radio frequency (RF) up-converter 1273.

Multiplexing Method of Packet Multiplexer 1240

Data of the error correction encoded and 1/H-rate encoded primary RS frame (i.e., when the RS frame mode value is equal to '00') or primary/secondary RS frame (i.e., when the RS frame mode value is equal to '01'), are divided into a plurality of data groups by the group formatter 1303. Then, the divided data portions are assigned to at least one of regions A to D of each data group or to an MPH block among the MPH blocks B1 to B10, thereby being deinterleaved. Then, the deinterleaved data group passes through the packet encoder 1304, thereby being multiplexed with the main broadcast service data by the packet multiplexer 1240 based upon a de-decided multiplexing rule. The packet multiplexer 1240 multiplexes a plurality of consecutive data groups, so that the data groups are assigned to be spaced as far apart from one another as possible within the sub-frame. For example, when it is assumed that 3 data groups are assigned to a sub-frame, the data groups are assigned to a $1^{st}$ slot (Slot #0), a $5^{th}$ slot (Slot #4), and a $9^{th}$ slot (Slot #8) in the sub-frame, respectively.

As described-above, in the assignment of the plurality of consecutive data groups, a plurality of parades are multiplexed and outputted so as to be spaced as far apart from one another as possible within a sub-MPH frame. For example, the method of assigning data groups and the method of assigning parades may be identically applied to all sub-frames for each MPH frame or differently applied to each MPH frame.

FIG. 22 illustrates an example of a plurality of data groups included in a single parade, wherein the number of data groups included in a sub-frame is equal to '3', and wherein the data groups are assigned to an MPH frame by the packet multiplexer 1240. Referring to FIG. 22, 3 data groups are sequentially assigned to a sub-frame at a cycle period of 4 slots. Accordingly, when this process is equally performed in the 5 sub-frames included in the corresponding MPH frame, 15 data groups are assigned to a single MPH frame. Herein, the 15 data groups correspond to data groups included in a parade.

When data groups of a parade are assigned as shown in FIG. 22, the packet multiplexer 1240 may either assign main broadcast service data to each data group, or assign data groups corresponding to different parades between each data group. More specifically, the packet multiplexer 1240 may assign data groups corresponding to multiple parades to one MPH frame. Basically, the method of assigning data groups corresponding to multiple parades is very similar to the method of assigning data groups corresponding to a single parade. In other words, the packet multiplexer 1240 may assign data groups included in other parades to an MPH frame according to a cycle period of 4 slots. At this point, data groups of a different parade may be sequentially assigned to the respective slots in a circular method. Herein, the data groups are assigned to slots starting from the ones to which data groups of the previous parade have not yet been assigned. For example, when it is assumed that data groups corresponding to a parade are assigned as shown in FIG. 22, data groups corresponding to the next parade may be assigned to a sub-frame starting either from the $12^{th}$ slot of a sub-frame.

FIG. 23 illustrates an example of assigning and transmitting 3 parades (Parade #0, Parade #1, and Parade #2) to an MPH frame. For example, when the $1^{st}$ parade (Parade #0) includes 3 data groups for each sub-frame, the packet multiplexer 1240 may obtain the positions of each data groups within the sub-frames by substituting values '0' to '2' for i in Equation 1. More specifically, the data groups of the $1^{st}$ parade (Parade #0) are sequentially assigned to the $1^{st}$, $5^{th}$, and $9^{th}$ slots (Slot #0, Slot #4, and Slot #8) within the sub-frame. Also, when the $2^{nd}$ parade includes 2 data groups for each sub-frame, the packet multiplexer 1240 may obtain the positions of each data groups within the sub-frames by substituting values '3' and '4' for i in Equation 1. More specifically, the data groups of the $2^{nd}$ parade (Parade #1) are sequentially assigned to the $2^{nd}$ and $12^{th}$ slots (Slot #3 and Slot #11) within the sub-frame. Finally, when the $3^{rd}$ parade includes 2 data groups for each sub-frame, the packet multiplexer 1240 may obtain the positions of each data groups within the sub-frames by substituting values '5' and '6' for in Equation 1. More specifically, the data groups of the $3^{rd}$ parade (Parade #2) are sequentially assigned and outputted to the $7^{th}$ and $11^{th}$ slots (Slot #6 and Slot #10) within the sub-frame.

As described above, the packet multiplexer 1240 may multiplex and output data groups of multiple parades to a single MPH frame, and, in each sub-frame, the multiplexing process of the data groups may be performed serially with a group space of 4 slots from left to right. Therefore, a number of groups of one parade per sub-frame (NOG) may correspond to any one integer from '1' to '8'. Herein, since one MPH frame includes 5 sub-frames, the total number of data groups within a parade that can be allocated to an MPH frame may correspond to any one multiple of '5' ranging from '5' to '40'.

Processing Signaling Information

Figure 41:
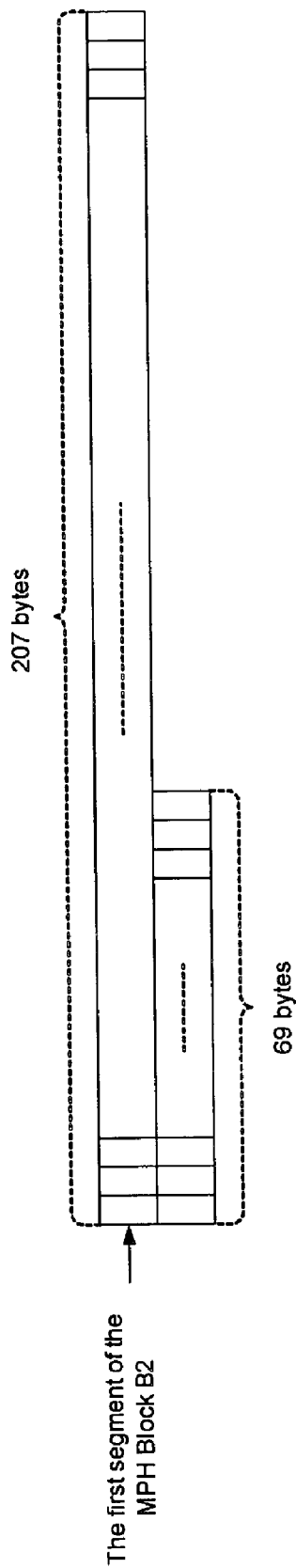
FIG. 41 illustrates an example of assigning signaling information area according to an embodiment of the present invention.

The present invention assigns signaling information areas for inserting signaling information to some areas within each data group. FIG. 41 illustrates an example of assigning signaling information areas for inserting signaling information starting from the $1^{st}$ segment of the $4^{th}$ MPH block (B4) to a portion of the $2^{nd}$ segment. More specifically, 276(=207+69) bytes of the $4^{th}$ MPH block (B4) in each data group are assigned as the signaling information area. In other words, the signaling information area consists of 207 bytes of the 1$^{st}$ segment and the first 69 bytes of the 2$^{nd}$ segment of the 4$^{th}$ MPH block (B4). For example, the 1$^{st}$ segment of the 4$^{th}$ MPH block (B4) corresponds to the 17$^{th}$ or 173$^{rd}$ segment of a VSB field. The signaling information that is to be inserted in the signaling information area is FEC-encoded by the signaling encoder 1304, thereby inputted to the group formatter 1303.

The group formatter 1303 inserts the signaling information, which is FEC-encoded and outputted by the signaling encoder 1304, in the signaling information area within the data group. Herein, the signaling information may be identified by two different types of signaling channels: a transmission parameter channel (TPC) and a fast information channel (FIC). Herein, the TPC information corresponds to signaling information including transmission parameters, such as RS frame-associated information, SCCC-associated information, and MPH frame-associated information. However, the signaling information presented herein is merely exemplary. And, since the adding or deleting of signaling information included in the TPC may be easily adjusted and modified by one skilled in the art, the present invention will, therefore, not be limited to the examples set forth herein. Furthermore, the FIC is provided to enable a fast service acquisition of data receivers, and the FIC includes cross layer information between the physical layer and the upper layer(s)

Figure 42:
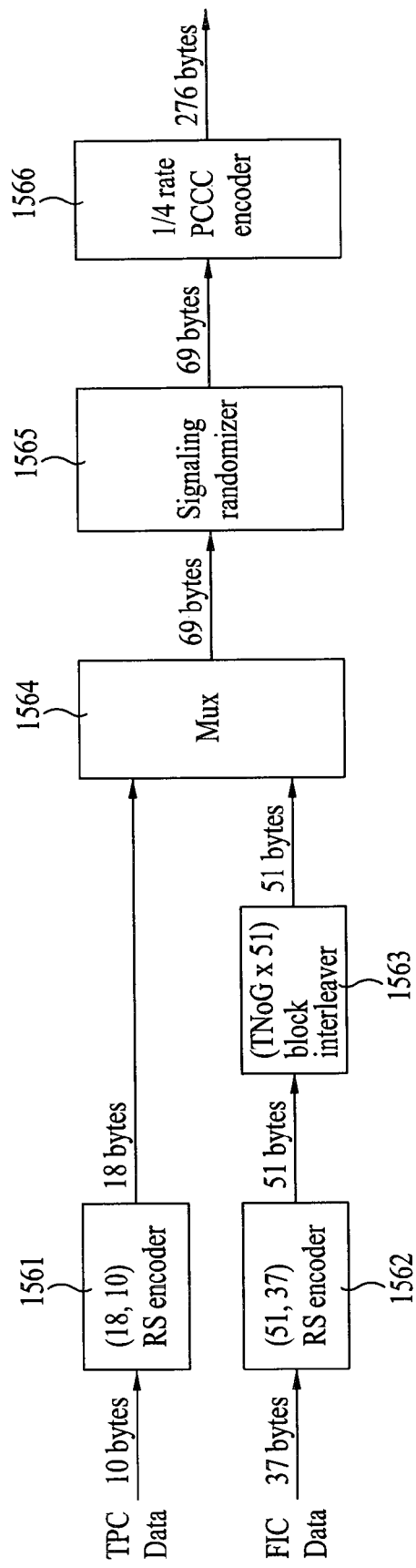
FIG. 42 illustrates a detailed block diagram of a signaling encoder according to the present invention.

FIG. 42 illustrates a detailed block diagram of the signaling encoder 1304 according to the present invention. Referring to FIG. 42, the signaling encoder 1304 includes a TPC encoder 1561, an FIC encoder 1562, a block interleaver 1563, a multiplexer 1564, a signaling randomizer 1565, and a PCCC encoder 1566. The TPC encoder 1561 receives 10-bytes of TPC data and performs (18, 10)-RS encoding on the 10-bytes of TPC data, thereby adding 8 bytes of parity data to the 10 bytes of TPC data. The 18 bytes of RS-encoded TPC data are outputted to the multiplexer 1564. The FIC encoder 1562 receives 37-bytes of FIC data and performs (51, 37)-RS encoding on the 37-bytes of FIC data, thereby adding 14 bytes of parity data to the 37 bytes of FIC data. Thereafter, the 51 bytes of RS-encoded FIC data are inputted to the block interleaver 1563, thereby being interleaved in predetermined block units.

Herein, the block interleaver 1563 corresponds to a variable length block interleaver. The block interleaver 1563 interleaves the FIC data within each sub-frame in TNoG (column)×51(row) block units and then outputs the interleaved data to the multiplexer 1564. Herein, the TNOG corresponds to the total number of data groups being assigned to all sub-frames within an MPH frame. The block interleaver 1563 is synchronized with the first set of FIC data in each sub-frame. The block interleaver 1563 writes 51 bytes of incoming (or inputted) RS codewords in a row direction (i.e., row-by-row) and left-to-right and up-to-down directions and reads 51 bytes of RS codewords in a column direction (i.e., column-by-column) and left-to-right and up-to-down directions, thereby outputting the RS codewords.

The multiplexer 1564 multiplexes the RS-encoded TPC data from the TPC encoder 1561 and the block-interleaved FIC data from the block interleaver 1563 along a time axis. Then, the multiplexer 1564 outputs 69 bytes of the multiplexed data to the signaling randomizer 1565. The signaling randomizer 1565 randomizes the multiplexed data and outputs the randomized data to the PCCC encoder 1566. The signaling randomizer 1565 may use the same generator polynomial of the randomizer used for mobile broadcast service data. Also, initialization occurs in each data group. The PCCC encoder 1566 corresponds to an inner encoder performing PCCC-encoding on the randomized data (i.e., signaling information data). The PCCC encoder 1566 may include 6 even component encoders and 6 odd component encoders.

FIG. 43 illustrates an example of a syntax structure of TPC data being inputted to the TPC encoder 1561. The TPC data are inserted in the signaling information area of each data group and then transmitted. The TPC data may include a sub-frame_number field, a slot_number field, a parade_id field, a starting_group_number (SGN) field, a number_of_ groups (NoG) field, a parade_repetition_cycle (PRC) field, an RS_frame_mode field, an RS_code_mode_primary field, an RS_code_mode_secondary field, an SCCC_block_mode field, an SCCC_outer_code_mode_A field, an SCCC_outer_ code_mode_B field, an SCCC_outer_code_mode_C field, an SCCC_outer_code_mode_D field, an FIC_version field, a parade_continuity_counter field, and a TNOG field.

The Sub-Frame_number field corresponds to the current Sub-Frame number within the MPH frame, which is transmitted for MPH frame synchronization. The value of the Sub-Frame_number field may range from 0 to 4. The Slot_ number field indicates the current slot number within the sub-frame, which is transmitted for MPH frame synchronization. Also, the value of the Sub-Frame_number field may range from 0 to 15. The Parade_id field identifies the parade to which this group belongs. The value of this field may be any 7-bit value. Each parade in a MPH transmission shall have a unique Parade_id field.

Communication of the Parade_id between the physical layer and the management layer may be performed by means of an Ensemble_id field formed by adding one bit to the left of the Parade_id field. If the Ensemble_id field is used for the primary Ensemble delivered through this parade, the added MSB shall be equal to '0'. Otherwise, if the Ensemble_id field is used for the secondary ensemble, the added MSB shall be equal to '1'. Assignment of the Parade_id field values may occur at a convenient level of the system, usually in the management layer. The starting_group_number (SGN) field shall be the first Slot_number for a parade to which this group belongs, as determined by Equation 1 (i.e., after the Slot numbers for all preceding parades have been calculated). The SGN and NoG shall be used according to Equation 1 to obtain the slot numbers to be allocated to a parade within the sub-frame.

The number_of_Groups (NoG) field shall be the number of groups in a sub-frame assigned to the parade to which this group belongs, minus 1, e.g., NoG=0 implies that one group is allocated (or assigned) to this parade in a sub-frame. The value of NoG may range from 0 to 7. This limits the amount of data that a parade may take from the main (legacy) service data, and consequently the maximum data that can be carried by one parade. The slot numbers assigned to the corresponding Parade can be calculated from SGN and NoG, using Equation 1. By taking each parade in sequence, the specific slots for each parade will be determined, and consequently the SGN for each succeeding parade. For example, if for a specific parade SGN=3 and NoG=3 (010b for 3-bit field of NoG), substituting i=3, 4, and 5 in Equation 1 provides slot numbers 12, 2, and 6. The Parade_repetition_cycle (PRC) field corresponds to the cycle time over which the parade is transmitted, minus 1, specified in units of MPH frames, as described in Table 12.

TABLE 12

| PRC | Description |
|---|---|
| 000 | This parade shall be transmitted once every MPH frame. |
| 001 | This parade shall be transmitted once every 2 MPH frames. |

TABLE 12-continued

| PRC | Description |
|---|---|
| 010 | This parade shall be transmitted once every 3 MPH frames. |
| 011 | This parade shall be transmitted once every 4 MPH frames. |
| 100 | This parade shall be transmitted once every 5 MPH frames. |
| 101 | This parade shall be transmitted once every 6 MPH frames. |
| 110 | This parade shall be transmitted once every 7 MPH frames. |
| 111 | Reserved |

The RS_Frame_mode field shall be as defined in Table 1. The RS_code_mode_primary field shall be the RS code mode for the primary RS frame. Herein, the RS code mode is defined in Table 6. The RS_code_mode_secondary field shall be the RS code mode for the secondary RS frame. Herein, the RS code mode is defined in Table 6. The SCCC_Block_mode field shall be as defined in Table 7. The SCCC_outer_code_mode_A field corresponds to the SCCC outer code mode for Region A. The SCCC outer code mode is defined in Table 8. The SCCC_outer_code_mode_B field corresponds to the SCCC outer code mode for Region B. The SCCC_outer_code_mode_C field corresponds be the SCCC outer code mode for Region C. And, the SCCC_outer_code_mode_D field corresponds to the SCCC outer code mode for Region D.

The FIC_version field may be supplied by the management layer (which also supplies the FIC data). The Parade_continuity_counter field counter may increase from 0 to 15 and then repeat its cycle. This counter shall increment by 1 every (PRC+1) MPH frames. For example, as shown in Table 12, PRC=011 (decimal 3) implies that Parade_continuity_counter increases every fourth MPH frame. The TNOG field may be identical for all sub-frames in an MPH Frame. However, the information included in the TPC data presented herein is merely exemplary. And, since the adding or deleting of information included in the TPC may be easily adjusted and modified by one skilled in the art, the present invention will, therefore, not be limited to the examples set forth herein.

Since the TPC parameters (excluding the Sub-Frame_number field and the Slot_number field) for each parade do not change their values during an MPH frame, the same information is repeatedly transmitted through all MPH groups belonging to the corresponding parade during an MPH frame. This allows very robust and reliable reception of the TPC data. Because the Sub-Frame_number and the Slot_number are increasing counter values, they also are robust due to the transmission of regularly expected values.

Furthermore, the FIC information is provided to enable a fast service acquisition of data receivers, and the FIC information includes cross layer information between the physical layer and the upper layer(s).

Figure 44:
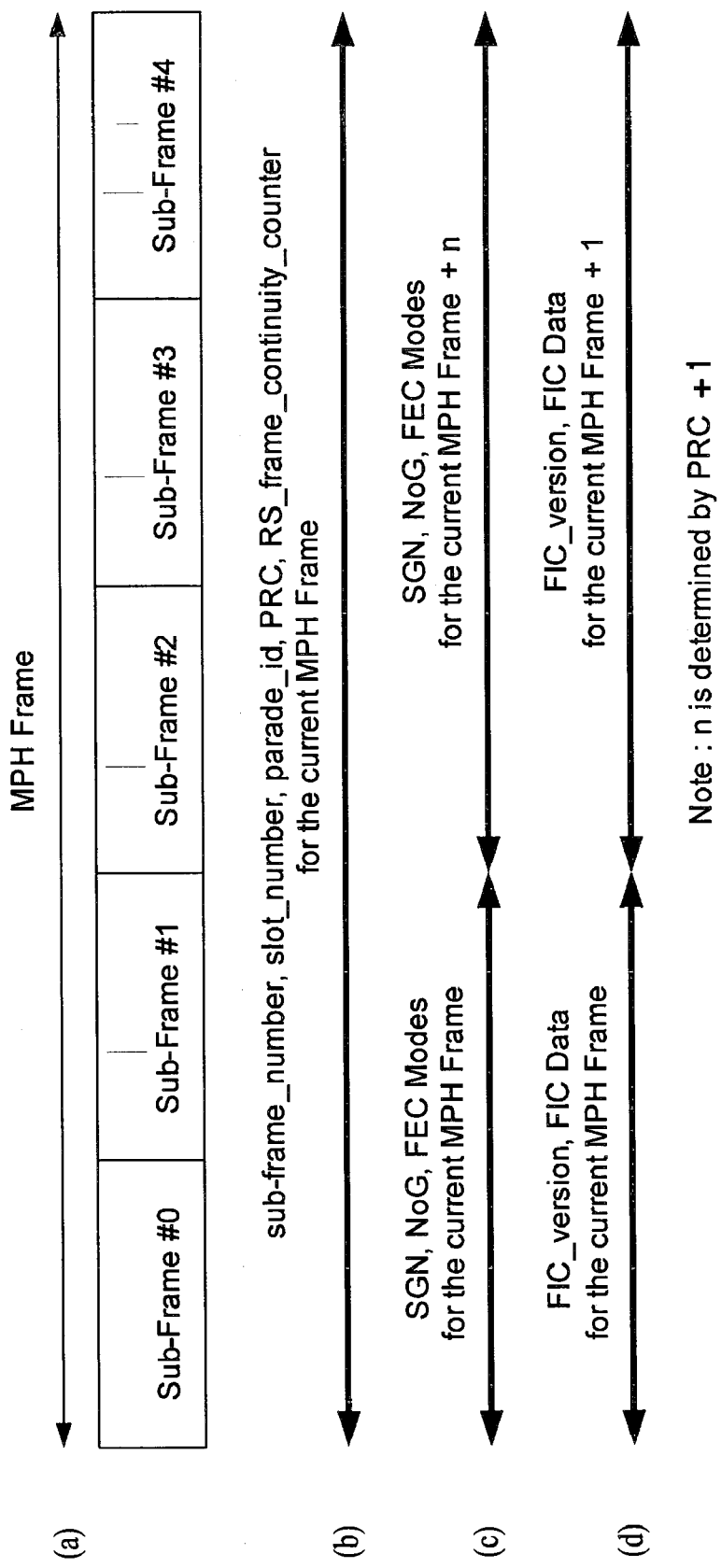
FIG. 44 illustrates an example of power saving of in a receiver when transmitting 3 parades to an MPH frame level according to the present invention.

FIG. 44 illustrates an example of a transmission scenario of the TPC data and the FIC data. The values of the Sub-Frame_number field, Slot_number field, Parade_id field, Parade_repetition_cycle field, and Parade_continuity_counter field may corresponds to the current MPH frame throughout the 5 sub-frames within a specific MPH frame. Some of TPC parameters and FIC data are signaled in advance. The SGN, NoG and all FEC modes may have values corresponding to the current MPH frame in the first two sub-frames. The SGN, NoG and all FEC modes may have values corresponding to the frame in which the parade next appears throughout the $3^{rd}$, $4^{th}$ and $5^{th}$ sub-frames of the current MPH frame. This enables the MPH receivers to receive (or acquire) the transmission parameters in advance very reliably.

For example, when Parade_repetition_cycle='000', the values of the $3^{rd}$, $4^{th}$, and $5^{th}$ sub-frames of the current MPH frame correspond to the next MPH frame. Also, when Parade_repetition_cycle='011', the values of the $3^{rd}$, $4^{th}$, and $5^{th}$ sub-frames of the current MPH frame correspond to the $4^{th}$ MPH frame and beyond. The FIC_version field and the FIC_data field may have values that apply to the current MPH Frame during the $1^{st}$ sub-frame and the $2^{nd}$ sub-frame, and they shall have values corresponding to the MPH frame immediately following the current MPH frame during the $3^{rd}$, $4^{th}$, and $5^{th}$ sub-frames of the current MPH frame.

Figure 45:
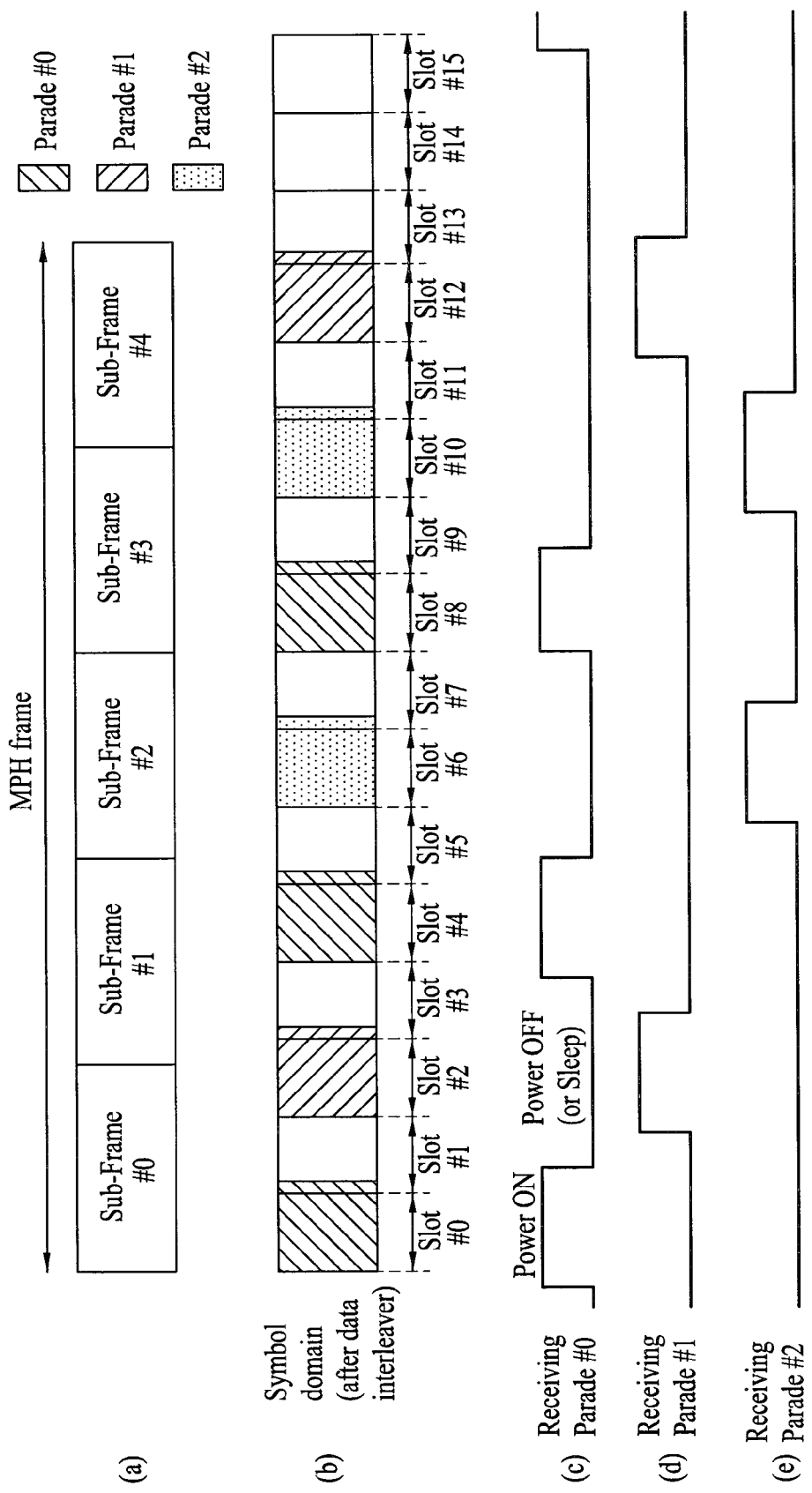
FIG. 45 illustrates an example of a transmission scenario of the TPC data and the FIC data level according to the present invention.

Meanwhile, the receiving system may turn the power on only during a slot to which the data group of the designated (or desired) parade is assigned, and the receiving system may turn the power off during the remaining slots, thereby reducing power consumption of the receiving system. Such characteristic is particularly useful in portable or mobile receivers, which require low power consumption. For example, it is assumed that data groups of a $1^{st}$ parade with NOG=3, a $2^{nd}$ parade with NOG=2, and a $3^{rd}$ parade with NOG=3 are assigned to one MPH frame, as shown in FIG. 45. It is also assumed that the user has selected a mobile broadcast service included in the $1^{st}$ parade using the keypad provided on the remote controller or terminal. In this case, the receiving system turns the power on only during a slot that data groups of the $1^{st}$ parade is assigned, as shown in FIG. 45, and turns the power off during the remaining slots, thereby reducing power consumption, as described above. At this point, the power is required to be turned on briefly earlier than the slot to which the actual designated data group is assigned (or allocated). This is to enable the tuner or demodulator to converge in advance.

Assignment of Known Data (or Training Signal)

Figure 46:
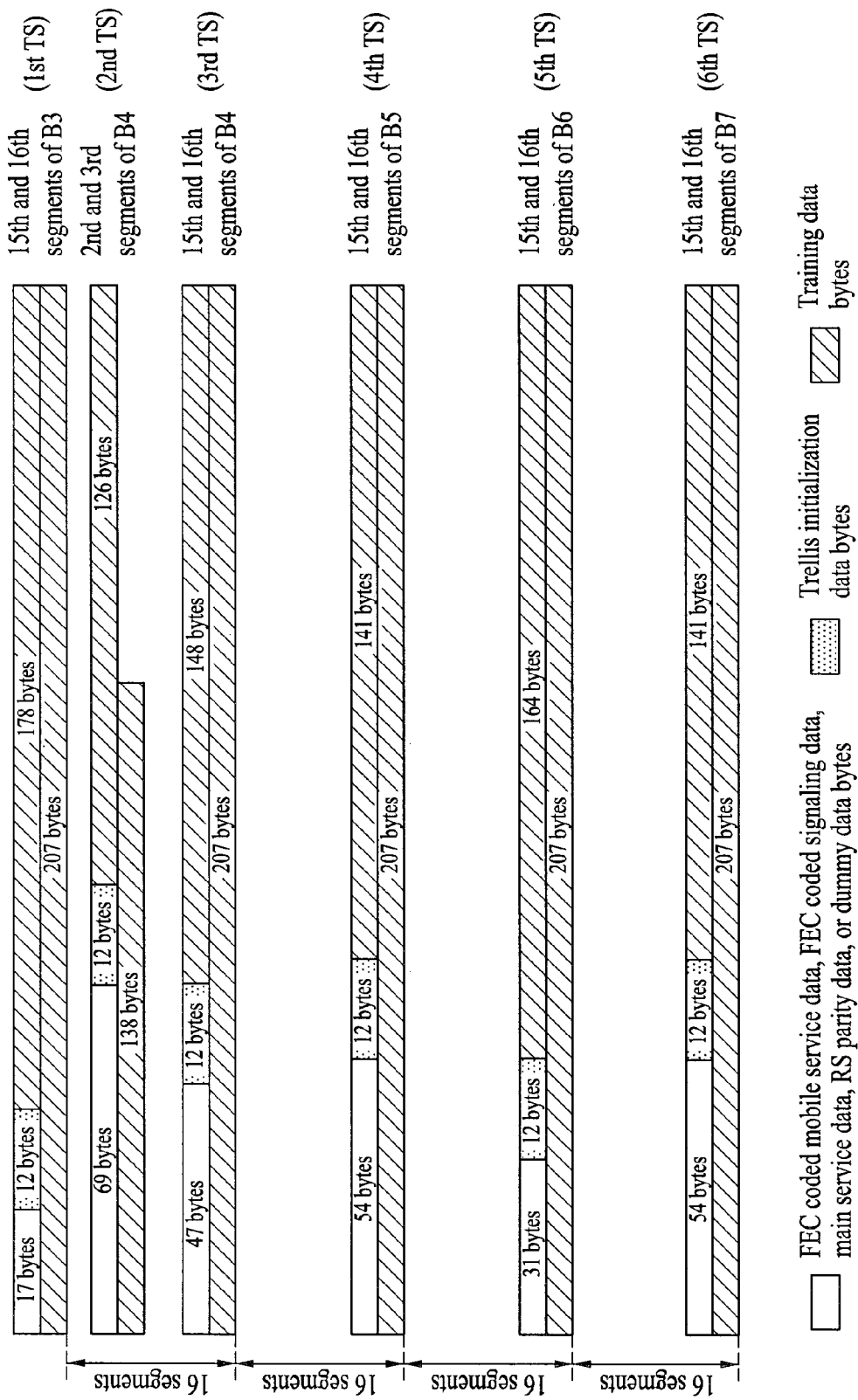
FIG. 46 illustrates an example of a training sequence at the byte level according to the present invention.

In addition to the payload data, the MPH transmission system inserts long and regularly spaced training sequences into each group. The regularity is an especially useful feature since it provides the greatest possible benefit for a given number of training symbols in high-Doppler rate conditions. The length of the training sequences is also chosen to allow fast acquisition of the channel during bursted power-saving operation of the demodulator. Each group contains 6 training sequences. The training sequences are specified before trellis-encoding. The training sequences are then trellis-encoded and these trellis-encoded sequences also are known sequences. This is because the trellis encoder memories are initialized to pre-determined values at the beginning of each sequence. The form of the 6 training sequences at the byte level (before trellis-encoding) is shown in FIG. 46. This is the arrangement of the training sequence at the group formatter 1303.

The $1^{st}$ training sequence is located at the last 2 segments of the $3^{rd}$ MPH block (B3). The $2^{nd}$ training sequence may be inserted at the $2^{nd}$ and $3^{rd}$ segments of the $4^{th}$ MPH block (B4). The $2^{nd}$ training sequence is next to the signaling area, as shown in FIG. 17. Then, the $3^{rd}$ training sequence, the $4^{th}$ training sequence, the $5^{th}$ training sequence, and the $6^{th}$ training sequence may be placed at the last 2 segments of the $4^{th}$, $5^{th}$, $6^{th}$, and $7^{th}$ MPH blocks (B4, B5, B6, and B7), respectively. As shown in FIG. 46, the $1^{st}$ training sequence, the $3^{rd}$ training sequence, the $4^{th}$ training sequence, the $5^{th}$ training sequence, and the $6^{th}$ training sequence are spaced 16 segments apart from one another. Referring to FIG. 46, the dotted area indicates trellis initialization data bytes, the lined area indicates training data bytes, and the white area includes other bytes such as the FEC-coded MPH service data bytes, FEC-coded signaling data, main broadcast service data bytes, RS parity data bytes (for backwards compatibility with legacy ATSC receivers) and/or dummy data bytes.

Figure 47:
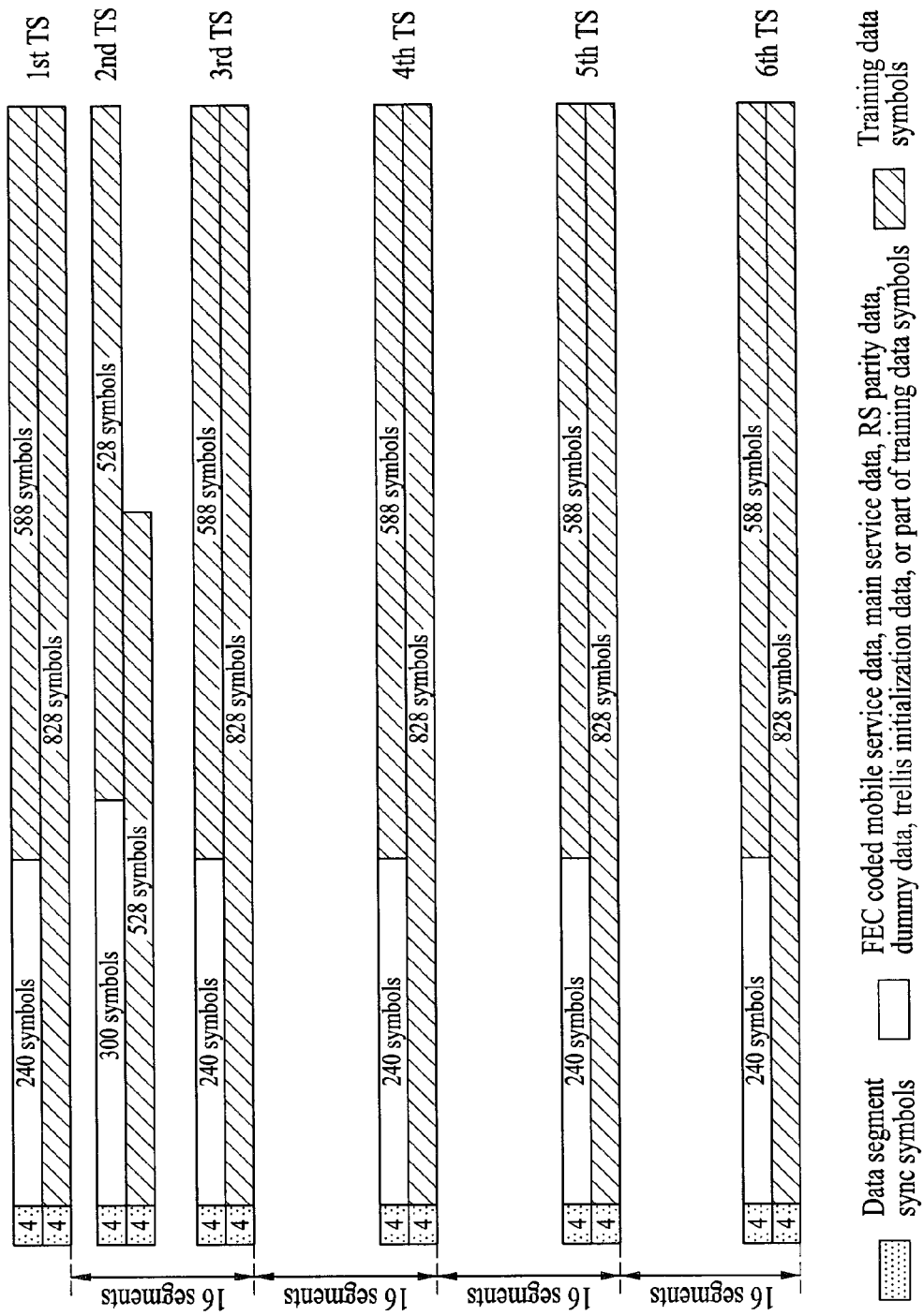
FIG. 47 illustrates an example of a training sequence at the symbol according to the present invention.

FIG. 47 illustrates the training sequences (at the symbol level) after trellis-encoding by the trellis encoder. Referring to FIG. 47, the dotted area indicates data segment sync symbols, the lined area indicates training data symbols, and the white area includes other symbols, such as FEC-coded mobile broadcast service data symbols, FEC-coded signaling data, main broadcast service data symbols, RS parity data symbols (for backwards compatibility with legacy ATSC receivers), dummy data symbols, trellis initialization data symbols, and/or the first part of the training sequence data symbols. Due to the intra-segment interleaving of the trellis encoder, various types of data symbols will be mixed in the white area.

After the trellis-encoding process, the last 1416 (=588+ 828) symbols of the $1^{st}$ training sequence, the $3^{rd}$ training sequence, the $4^{th}$ training sequence, the $5^{th}$ training sequence, and the $6^{th}$ training sequence commonly share the same data pattern. Including the data segment synchronization symbols in the middle of and after each sequence, the total length of each common training pattern is 1424 symbols. The $2^{nd}$ training sequence has a first 528-symbol sequence and a second 528-symbol sequence that have the same data pattern. More specifically, the 528-symbol sequence is repeated after the 4-symbol data segment synchronization signal. At the end of each training sequence, the memory contents of the twelve modified trellis encoders shall be set to zero(0).

As described above, the telematics terminal capable of receiving broadcast data and a method for processing broadcast signals according to the present invention have the following advantages. More specifically, the telematics terminal capable of receiving broadcast data and the method for processing broadcast signals are robust (or strong) against any error that may occur when transmitting mobile broadcast service data through a channel. And, the present invention is also highly compatible to the conventional system. Moreover, the present invention may also receive the mobile broadcast service data without any error occurring, even in channels having severe ghost effect and noise. Additionally, by receiving a plurality of mobile broadcast services using diversity reception and processing the received mobile broadcast services, the signal reception strength may be enhanced in the mobile broadcast service receiving environment (or condition).

Furthermore, by inserting known data in a specific position within a data region and by transmitting the processed data, the receiving performance of a receiving system may be enhanced even in channel environments (or conditions) undergoing frequent channel changes. The present invention is even more effective when applied to mobile and portable receivers, which are also liable to frequent change in channels, and which require strength (or robustness) against intense noise.

Also, by receiving the map information or traffic information as mobile broadcast service data, and by downloading and updating the received map information or traffic information, the present invention may provide faster and more accurate road (or travel) guidance services to the users. Finally, the present invention is capable of automatically receiving the latest information, without having to perform any manual operations, such as upgrading the map information or traffic information through an external memory device.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A broadcast receiving system comprising:
a receiving unit for receiving a broadcast signal including mobile broadcast service data and main broadcast service data, wherein a Reed-Solomon (RS) frame includes at least one data packet corresponding to the mobile broadcast service data, an RS parity generated based upon the mobile broadcast service data, and a cyclic redundancy check (CRC) checksum generated based upon the mobile broadcast service data and the RS parity;
a known sequence detector for detecting at least one of a plurality of known data sequences;
a channel equalizer for channel-equalizing the mobile broadcast service data using at least one of the plurality of known data sequences;
a transmission parameter detector for detecting transmission parameters inserted in a predetermined position within at least one data group that configures the RS frame;
a power controller for controlling power based upon the detected transmission parameters in order to receive a data group including requested mobile broadcast service data;
a block decoder for symbol-decoding the mobile broadcast service data in block units, based upon the detected transmission parameters;
an RS frame decoder for performing CRC-decoding and RS-decoding on the RS frame in order to correct errors in the corresponding mobile broadcast service data; and
a memory for storing at least traffic information, a POI (point of interest), or map information included in the error-corrected mobile broadcast service data.

2. A method for processing broadcast signals, the method comprising:
receiving a broadcast signal including mobile broadcast service data and main broadcast service data, wherein a Reed-Solomon (RS) frame includes at least one data packet corresponding to the mobile broadcast service data, an RS parity generated based upon the mobile broadcast service data, and a cyclic redundancy check (CRC) checksum generated based upon the mobile broadcast service data and the RS parity;
detecting at least one of a plurality of known data sequences;
channel-equalizing the mobile broadcast service data using at least one of the plurality of known data sequences;
detecting transmission parameters inserted in a predetermined position within at least one data group that configures the RS frame;
controlling power based upon the detected transmission parameters in order to receive a data group including requested mobile broadcast service data;
symbol-decoding the mobile broadcast service data in block units, based upon the detected transmission parameters;
performing CRC-decoding and RS-decoding on the RS frame in order to correct errors in the corresponding mobile broadcast service data; and
storing at least traffic information, a POI (point of interest), or map information included in the error-corrected mobile broadcast service data.

* * * * *